(12) United States Patent
Ohmaru

(10) Patent No.: US 8,787,084 B2
(45) Date of Patent: Jul. 22, 2014

(54) SEMICONDUCTOR DEVICE AND DRIVING METHOD THEREOF

(75) Inventor: Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 130 days.

(21) Appl. No.: 13/429,668

(22) Filed: Mar. 26, 2012

(65) Prior Publication Data

US 2012/0250397 A1 Oct. 4, 2012

(30) Foreign Application Priority Data

Mar. 30, 2011 (JP) ................................. 2011-075664
May 14, 2011 (JP) ................................. 2011-108888

(51) Int. Cl.
| | | |
|---|---|---|
| *G11C 14/00* | (2006.01) | |
| *H01L 21/84* | (2006.01) | |
| *H01L 27/105* | (2006.01) | |
| *H01L 27/108* | (2006.01) | |
| *H01L 27/12* | (2006.01) | |
| *G11C 11/404* | (2006.01) | |
| *H01L 27/06* | (2006.01) | |
| *H01L 27/115* | (2006.01) | |

(52) U.S. Cl.
CPC .............. *G11C 11/404* (2013.01); *H01L 21/84* (2013.01); *H01L 27/1052* (2013.01); *H01L 27/1156* (2013.01); *H01L 27/10897* (2013.01); *H01L 27/1203* (2013.01); *H01L 27/10873* (2013.01); *H01L 27/0688* (2013.01); *H01L 27/115* (2013.01); *H01L 27/10894* (2013.01)
USPC ............. 365/185.08; 365/189.05; 365/185.05

(58) Field of Classification Search
USPC .................. 365/149, 185.05, 185.08, 189.05, 365/189.09, 189.2, 230.06
See application file for complete search history.

(56) References Cited

U.S. PATENT DOCUMENTS

| | | | |
|---|---|---|---|
| 3,775,693 | A | 11/1973 | Proebsting |
| 4,797,576 | A | 1/1989 | Asazawa |
| 4,800,303 | A | 1/1989 | Graham et al. |
| 5,039,883 | A | 8/1991 | On |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Sanghun Jeon et al.; "180 nm Gate Length Amorphous InGaZnO Thin Film Transistor for High Density Image Sensor Applications"; IEDM 10 : Technical Digest of International Electron Devices Meeting; Dec. 6, 2010; pp. 504-507.

(Continued)

*Primary Examiner* — Gene Auduong
(74) *Attorney, Agent, or Firm* — Fish & Richardson P.C.

(57) ABSTRACT

The storage device includes a volatile first memory circuit and a nonvolatile second memory circuit which includes a transistor whose channel is formed in an oxide semiconductor layer. In the case of high-frequency driving, during a period when source voltage is applied, a data signal is input to and output from the first memory circuit, and during a part of a period when source voltage is supplied, which is before the supply of the source voltage is stopped, a data signal is input to the second memory circuit. In the case of low-frequency driving, during a period when source voltage is applied, a data signal is input to the second memory circuit, the data signal input to the second memory circuit is input to the first memory circuit, and the data signal input to the first memory circuit is output.

25 Claims, 32 Drawing Sheets

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,980,092 A | 11/1999 | Merryman et al. | |
| 6,049,883 A | 4/2000 | Tjandrasuwita | |
| 6,078,194 A | 6/2000 | Lee | |
| 6,204,695 B1 | 3/2001 | Alfke et al. | |
| 6,281,710 B1 | 8/2001 | Poirier et al. | |
| 6,294,274 B1 | 9/2001 | Kawazoe et al. | |
| 6,563,174 B2 | 5/2003 | Kawasaki et al. | |
| 6,573,754 B2 | 6/2003 | Menczigar et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,076,748 B2 | 7/2006 | Kapoor et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,582 B2 | 8/2009 | Lee et al. | |
| 7,674,650 B2 | 3/2010 | Akimoto et al. | |
| 7,732,819 B2 | 6/2010 | Akimoto et al. | |
| 8,410,838 B2* | 4/2013 | Kato et al. | 327/215 |
| 8,432,187 B2* | 4/2013 | Kato et al. | 326/46 |
| 2001/0046027 A1 | 11/2001 | Tai et al. | |
| 2002/0036529 A1 | 3/2002 | Furusawa et al. | |
| 2002/0056838 A1 | 5/2002 | Ogawa | |
| 2002/0074568 A1 | 6/2002 | Yoshida et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038582 A1 | 2/2006 | Peeters | |
| 2006/0043377 A1 | 3/2006 | Hoffman et al. | |
| 2006/0091793 A1 | 5/2006 | Baude et al. | |
| 2006/0095975 A1 | 5/2006 | Yamada et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1 | 6/2006 | Dronavalli | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0024318 A1 | 2/2007 | Mamidipaka | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048744 A1 | 2/2008 | Fukuoka | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0210731 A1* | 8/2009 | Lakkapragada et al. | 713/320 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092809 A1 | 4/2010 | Itagaki et al. | |
| 2010/0109002 A1 | 5/2010 | Itagaki et al. | |
| 2011/0102018 A1 | 5/2011 | Shionoiri et al. | |
| 2011/0121878 A1 | 5/2011 | Kato et al. | |
| 2011/0187410 A1 | 8/2011 | Kato et al. | |
| 2012/0243340 A1* | 9/2012 | Kobayashi et al. | 365/189.2 |
| 2012/0268164 A1* | 10/2012 | Kobayashi et al. | 326/40 |
| 2012/0269013 A1* | 10/2012 | Matsuzaki | 365/191 |
| 2013/0191673 A1* | 7/2013 | Koyama et al. | 713/324 |
| 2013/0223135 A1* | 8/2013 | Koyama | 365/149 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-78836 A | 3/1998 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

(56) References Cited

OTHER PUBLICATIONS

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.
Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.
Miyasaka, M, "SUFTLA Flexible Microelectronics on Thier Way to Business," SID Digest '07 : SID International Symposium Digest of Technical Papers, 2007, vol. 38, pp. 1673-1676.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.
Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.
Park, J et al., "Amorphous Indium-Gallium-Zinc Oxide TFTs and Their Application for Large Size AMOLED," AM-FPD '08 Digest of Technical Papers, Jul. 2, 2008, pp. 275-278.
Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," Am-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous IN-GA-OXIDE TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Hayashi, R et al., "42.1: Invited Paper: Improved Amorphous In-Ga-Zn-O TFTS", SID Digest '08 : SID International Symposium Digest of Technical Papers, May 20, 2008, vol. 39, pp. 621-624.
Hirao, T et al.. "Novel Top-Gate Zinc Oxide Thin-Film Transistors (ZNO TFTS) for AMLCDS," Journal of the SID , 2007, vol. 15, No. 1, pp. 17-22.

(56) References Cited

OTHER PUBLICATIONS

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al.. "Full-Functional System Liquid Crystal Display Using CG-Silicon Technology," SID Digest '04 : SID International Symposium Digest of Technical Papers, 2004, vol. 35, pp. 860-863.

Janotti, a et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch Wxga Amoled Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties,38 SID Digest '09 : SID International Symposium Digest of Technical Papers, May 31, 2009, pp. 983-985.

Kanno, H et al., "White Stacked Electrophosphorecent Organic Light-Emitting Devices Employing M003 As a Charge-Generation Layer," ADV. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N. et al., "Spinel,YBFE2O4, and YB2FE3O7 Types of Structures for Compounds in the 1N2O3 and SC2O3-A2O3-BO Systems [A; FE, GA, OR AL; B: MG, MN, FE, NI, CU,or ZN] At Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF Rfcpus on Flexible and Glass Substrates for Secure Rfid Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of Am-Oled," IDW '06 : Proceedings of the 13TH International Display Workshops, Dec. 7, 2006, pp. 663-666.

Lee, J et al., "World'S Largest (15-Inch) XGA Amlcd Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectrinics on Their Way to Business", SID Digest '07 : SID International Symposium Digest of Technical Papers, 2007, vol. 38, pp. 1673-'1676.

Mo, Y et al., "Amorphous Oxide TFT Backplanes for Large Size Amoled Displays," IDW '08 : Proceedings of the 6TH International Display Workshops, Dec. 3, 2008, pp. 581-584.

Nakamura, "Synthesis of Homologous Compound with New Long-Period Structure", Nirm Newsletter, Mar. 1995, vol. 150, pp. 1-4 with English translation.

Nakamura, M et al., "The phase relations in the In2O3-Ga2ZnO4-ZnO system at 1350°C", Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film.Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White.Tandem Oleds," SID Digest '09 : SID International Symposium Digest of Technical Papers, May 31, 2009, vol. 40, pp. 899-902.

OBA, F et al., "Defect energetics in ZnO: a hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA Amoled Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

(56) References Cited

OTHER PUBLICATIONS

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park. J et al., "Improvements In the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J. et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission Am-Oled Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size Amoled." AM-FPD '08 Digest of Technical Papers, Jul. 2, 2008, pp. 275-278.

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTS," IDW '09 : Proceedings of the 16TH International Display Workshops, 2009, pp. 689-692.

Son, K et al., "42.4L: Late-News Paper: 4 Inch QVGA Amoled Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15TH International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

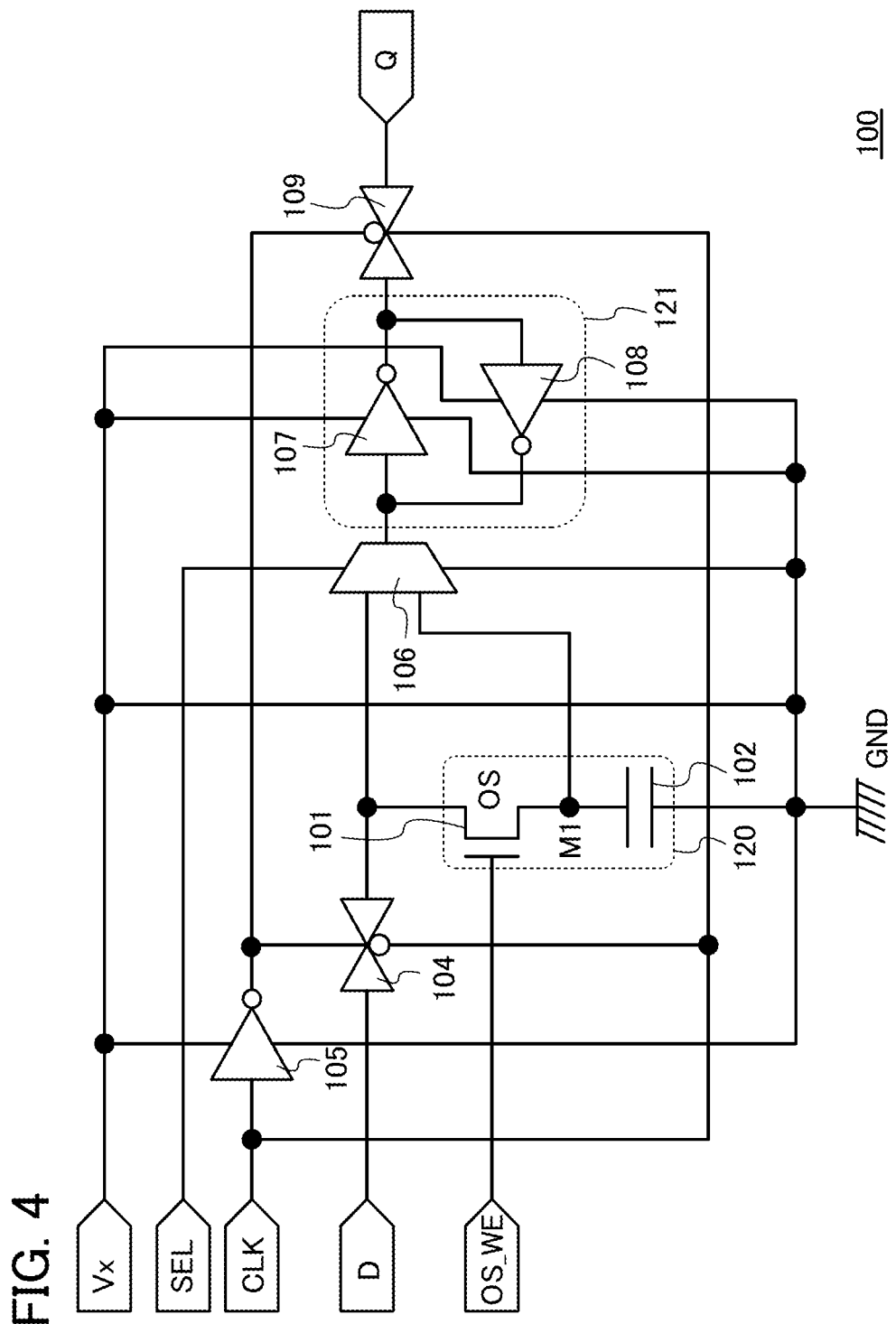

FIG. 16A   FIG. 16B
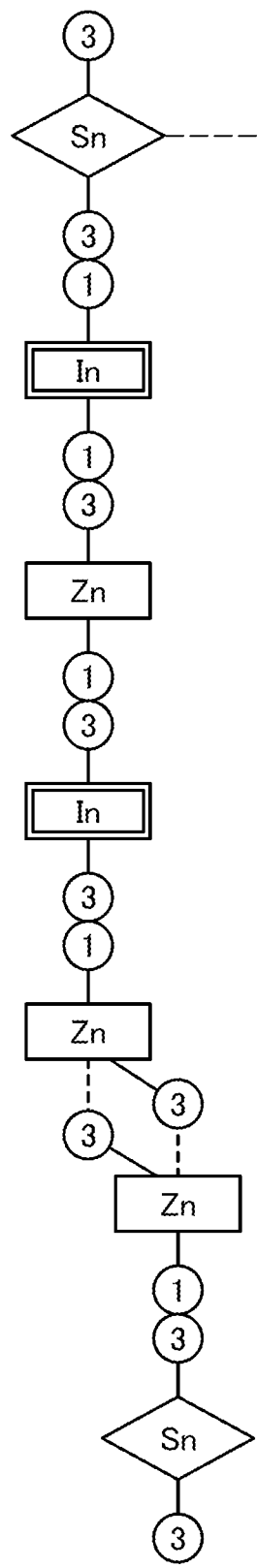
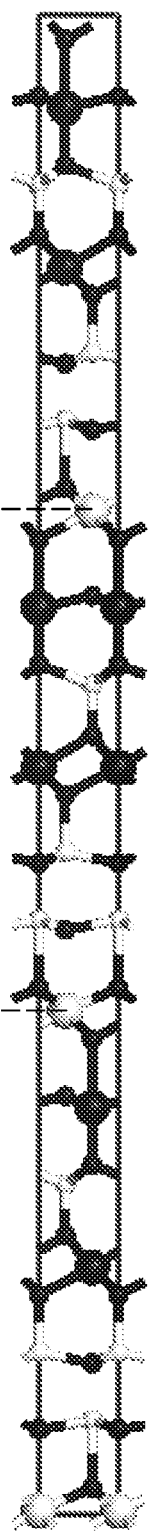
FIG. 16C
● In
○ Sn
○ Zn
● O

- In
- Ga
- Zn
- O

SEMICONDUCTOR DEVICE AND DRIVING METHOD THEREOF

BACKGROUND OF THE INVENTION

1. Field of the Invention

The disclosed invention relates to a storage device.

2. Description of the Related Art

Signal processing units such as central processing units (CPUs) vary in structure depending on the intended use. A signal processing unit generally has a main memory for storing data or program and other memory circuits such as a register and a cache memory. A register has a function of temporarily holding a data signal when arithmetic processing is carried out, when a program execution state is held, or the like. Meanwhile, a cache memory, which is located between an arithmetic unit and a main memory, is provided to reduce low-speed access to the main memory and speed up arithmetic processing.

In a memory circuit in a signal processing unit, such as a register or a cache memory, input of a data signal needs to be performed at higher speed than in a main memory. Thus, in general, a flip-flop or the like is used as a register, and a static random access memory (SRAM) or the like is used as a cache memory. In other words, such a register, a cache memory, or the like is a volatile memory circuit which loses a data signal after the supply of power supply potential is stopped.

In order to reduce power consumption, a method has been suggested in which the application of source voltage to a signal processing unit is temporarily stopped while input/output of data signals is not conducted (see Patent Document 1, for example). In the method in Patent Document 1, a nonvolatile memory circuit is located on the periphery of a volatile memory circuit such as a register or a cache memory, and the data signal is temporarily stored in the nonvolatile memory circuit. Thus, in the signal processing unit, the data signal stored in the register, the cache memory, or the like can be held even while the supply of source voltage is stopped.

In the case where the application of source voltage to a signal processing unit is stopped for a long time, a data signal in a volatile memory circuit is transferred to an external memory circuit such as a hard disk or a flash memory before the application of source voltage is stopped, so that the data signal can be prevented from being lost.

REFERENCE

[Patent Document 1] Japanese Published Patent Application No. H10-078836

SUMMARY OF THE INVENTION

The method in which a data signal that has been held in a volatile memory circuit is stored in a nonvolatile memory circuit located on the periphery of the volatile memory circuit, while the application of source voltage to the signal processing unit is stopped, involves a complicated process of manufacturing the signal processing unit. This is because a magnetic element or a ferroelectric is mainly used for the nonvolatile memory circuit.

In the case of employing the method in which a data signal that has been held in a volatile memory circuit is stored in an external memory circuit while the application of source voltage to a signal processing unit is stopped, it takes a long time to send back the data signal from the external memory circuit to the volatile memory circuit. Therefore, backing up a data signal to an external memory circuit is not suitable for the case where the application of source voltage to a signal processing unit is stopped for a short time for reduction in power consumption.

In view of the above problems, an object of one embodiment of the disclosed invention is to provide a storage device which does not need a complicated manufacturing process and has lower power consumption. In particular, an object is to provide a storage device in which power consumption is reduced by stopping the application of source voltage even for a short time.

According to one embodiment of the disclosed invention, a memory circuit including a first transistor and a storage capacitor is used as a nonvolatile memory circuit. As the first transistor, for example, a transistor whose channel is formed in an oxide semiconductor layer (hereinafter referred to as an oxide semiconductor transistor) is used. Having an extremely low off-state current, the oxide semiconductor transistor can be included in a nonvolatile memory circuit. Such a nonvolatile memory circuit including an oxide semiconductor transistor as the first transistor has an advantage that properties thereof are not deteriorated due to rewriting.

Note that the operation frequency of an oxide semiconductor transistor is lower than that of a transistor whose channel is formed in a silicon layer (hereinafter referred to as a silicon transistor). Thus, when a memory circuit including an oxide semiconductor transistor is driven at a high frequency, a malfunction might occur.

A memory circuit including a silicon transistor is a volatile memory circuit which can store a data signal only while source voltage is supplied. Such a volatile memory circuit including a silicon transistor can also be driven at a high frequency.

According to one embodiment of the disclosed invention, when a storage device is driven at a high frequency, a data signal is read and written from/to a memory circuit including a silicon transistor. Only in a period before the application of source voltage is stopped, a data signal is written to a nonvolatile memory circuit including an oxide semiconductor transistor. After the application of source voltage is resumed, the data signal held in the nonvolatile storage circuit including the oxide semiconductor transistor is read and the data signal is written to the memory circuit including the silicon transistor.

According to one embodiment of the disclosed invention, when a storage device is driven at a low frequency, a data signal is read and written from/to a nonvolatile memory circuit including an oxide semiconductor transistor, and the data signal written to the nonvolatile memory circuit is written to a memory circuit including a silicon transistor.

Note that, in one embodiment of the disclosed invention, a high frequency means a frequency at which a data signal cannot be read and written from/to a nonvolatile memory circuit, whereas a low frequency means a frequency at which a data signal can be read and written from/to the nonvolatile memory circuit through an oxide semiconductor transistor. Whether writing and reading of a data signal can be performed depends on the operation frequency of the oxide semiconductor transistor included in the nonvolatile memory circuit.

Switching of these two operation methods with an external or internal control signal makes it possible to obtain a storage device which can be driven at a wide range of frequencies and has lower power consumption.

One embodiment of the disclosed invention is a storage device including a volatile first memory circuit which holds a data signal only in a period when source voltage is supplied; a nonvolatile second memory circuit which includes a transistor whose channel is formed in an oxide semiconductor layer and a storage capacitor electrically connected to one of a source and a drain of the transistor; a selection circuit which performs switching from input of a signal to a first input terminal or a second input terminal to output of the signal input to the first input terminal or the second input terminal to the first memory circuit, in response to a selection signal which is input to the selection circuit; a first switch which is turned on or off in response to a signal whose phase is an inverse of that of a clock signal and which is connected to the selection circuit and the other of the source and the drain of the transistor; and a second switch which is turned on or off in response to the clock signal and which is connected to the first memory circuit and the selection circuit. The selection circuit includes the first input terminal connected to the first switch and the other of the source and the drain of the transistor, the second input terminal connected to the storage capacitor and the one of the source and the drain of the transistor, and an output terminal connected to the first memory circuit.

According to one embodiment of the disclosed invention, the first memory circuit is a latch circuit.

According to one embodiment of the disclosed invention, the latch circuit includes a first inverter and a second inverter. An input terminal of the first inverter is electrically connected to an output terminal of the second inverter. An output terminal of the first inverter is electrically connected to an input terminal of the second inverter.

According to one embodiment of the disclosed invention, the first memory circuit includes a transistor whose channel is formed in a silicon layer.

According to one embodiment of the disclosed invention, the storage device includes the first switch, the second switch, the selection circuit, and a phase inversion element.

According to one embodiment of the disclosed invention, the first switch and the second switch are analog switches.

According to one embodiment of the disclosed invention, the phase inversion element is an inverter.

According to one embodiment of the disclosed invention, it is possible to provide a storage device which does not need a complicated manufacturing process and has lower power consumption. In particular, it is possible to provide a storage device in which power consumption is reduced by stopping the application of source voltage even for a short time.

BRIEF DESCRIPTION OF THE DRAWINGS

In the accompanying drawings:

FIG. 4 is a circuit diagram of a storage device;

FIGS. 16A to 16C are diagrams illustrating a structure of an oxide material;

DETAILED DESCRIPTION OF THE INVENTION

Figure 1:
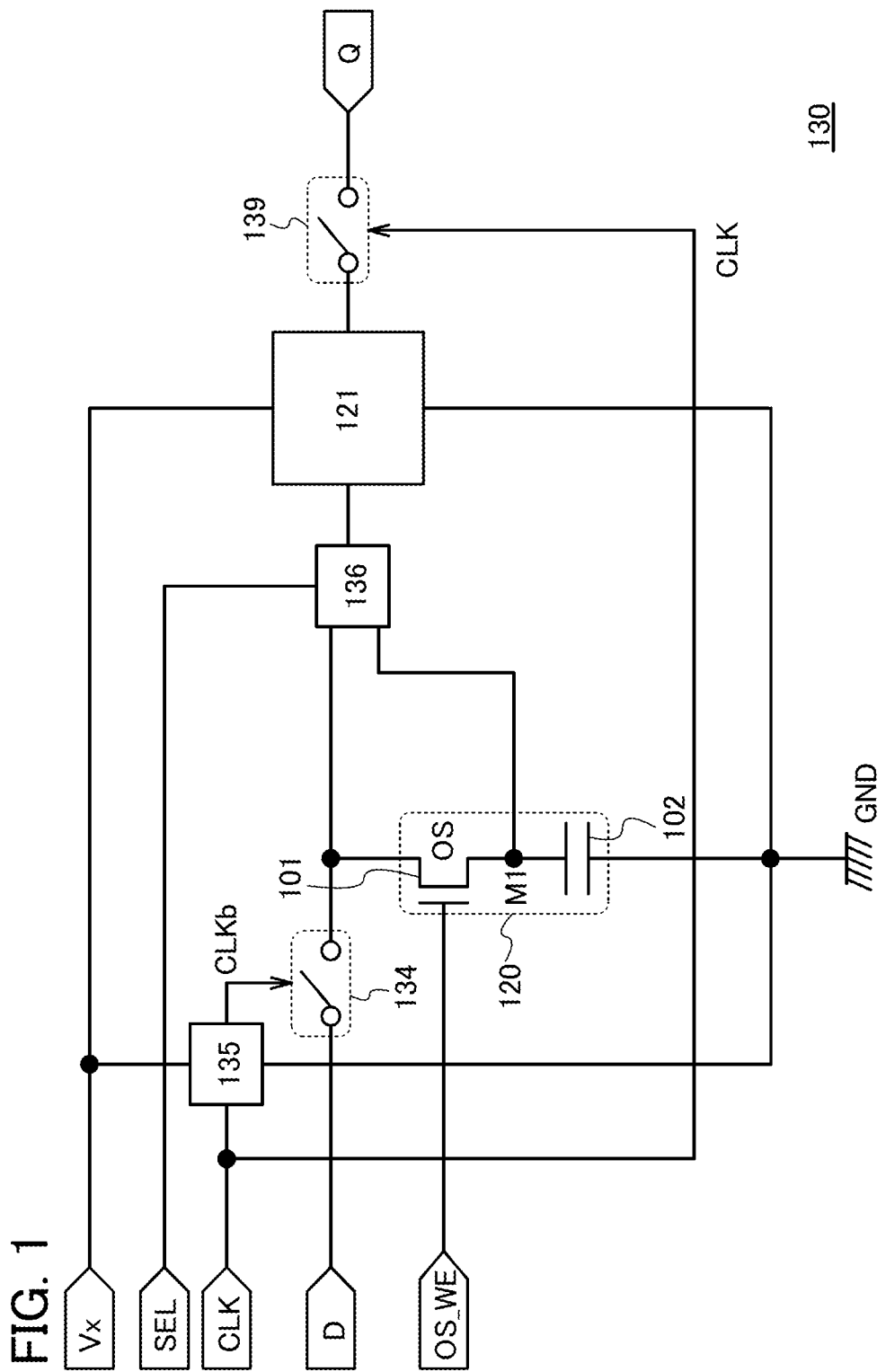
FIG. 1 is a circuit diagram of a storage device.

Embodiments of the invention disclosed in this specification will be described below with reference to the accompanying drawings. Note that the invention disclosed in this specification can be implemented in a variety of different modes, and it is easily understood by those skilled in the art that the modes and details of the invention disclosed in this specification can be modified in various ways without departing from the spirit and scope thereof. Therefore, the disclosed invention is not construed as being limited to description of the embodiments. Note that, in the drawings hereinafter shown, the same portions or portions having similar functions are denoted by common reference numerals, and repeated description thereof will be omitted.

Note that the position, the size, the range, or the like of each structure shown in the drawings and the like is not accurately represented in some cases for the sake of simplicity. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components. Note that a voltage often refers to a potential difference between a given potential and a reference potential (e.g., a ground potential). Accordingly, voltage, potential and a potential difference can be referred to as potential, voltage, and a voltage difference, respectively.

Note that when it is explicitly described that "A and B are connected," the case where A and B are electrically connected, the case where A and B are functionally connected, and the case where A and B are directly connected are included therein.

In this specification, an "on" state of a transistor means that a source and a drain thereof are electrically connected, whereas an "off" state of a transistor means that a source and a drain thereof are not electrically connected.

Embodiment 1

Configuration of Storage Device in FIG. 1

FIG. 1 is a circuit diagram of a storage device according to this embodiment.

A storage device 130 in FIG. 1 includes a memory circuit 120 including a first transistor 101 and a storage capacitor 102 and a memory circuit 121 including a second transistor. The storage device 130 in FIG. 1 further includes a phase inversion element 135, a switch 134, a selection circuit 136, and a switch 139.

As the first transistor 101, for example, a transistor whose channel is formed in an oxide semiconductor layer (oxide semiconductor transistor) is used. Having an extremely low off-state current, the oxide semiconductor transistor can be included in a nonvolatile memory circuit. The nonvolatile memory circuit 120 including such an oxide semiconductor transistor as the first transistor has an advantage that the properties thereof are not deteriorated due to rewriting. The oxide semiconductor layer will be described later.

As the second transistor, for example, a transistor whose channel is formed in a silicon layer is used. The silicon layer may be a single crystal silicon layer or a polycrystalline silicon layer; in particular, a transistor whose channel is formed in a single crystal silicon layer is preferable because it is driven at a high frequency.

The phase inversion element 135 is a logic element which inverts the phase of a signal input and outputs the signal. As the phase inversion element 135, for example, an inverter or the like can be used.

The switches 134 and 139 are turned on or off in response to a clock signal CLK. For the switches 134 and 139, for example, transistors such as an n-channel transistor and a p-channel transistor, and an analog switch can be used. In this embodiment, as the switches 134 and 139, switches which are turned on when a high-level potential (VDD) is supplied and which are turned off when a low-level potential (VSS) is supplied are used.

The clock signal CLK is input to the phase inversion element 135. From the phase inversion element 135, a signal CLKb whose phase is the inverse of that of the clock signal CLK is output, and the output signal CLKb is input to the switch 134.

The phase inversion element 135 is driven when a source voltage Vx which is a high power supply potential and a low power supply potential (e.g., a ground potential GND) are applied to the phase inversion element 135.

A data signal D is input to the switch 134. The switch 134 is electrically connected to the selection circuit 136 and one of a source and a drain of the first transistor 101. As described above, the switch 134 is turned on or off in response to the clock signal CLK.

A control signal OS_WE is input to a gate of the first transistor 101. One of the source and the drain of the first transistor 101 is electrically connected to the switch 134 and the selection circuit 136. The other of the source and the drain of the first transistor 101 is electrically connected to the storage capacitor 102 and the selection circuit 136. Note that the connection portion between the storage capacitor 102 and the other of the source and the drain of the first transistor 101 is a node M1.

One terminal of the storage capacitor 102 is electrically connected to the selection circuit 136 and the other of the source and the drain of the first transistor 101. The other terminal of the storage capacitor 102 is given a low power supply potential (e.g., the ground potential GND).

The selection circuit 136 is electrically connected to the switch 134 and one of the source and the drain of the first transistor 101. The selection circuit 136 is also electrically connected to the storage capacitor 102 and the other of the source and the drain of the first transistor 101. The selection circuit 136 is also electrically connected to the memory circuit 121.

The selection circuit 136 selects one of two input signals on the basis of a selection signal SEL and outputs the selected signal.

The selection circuit 136 is driven when the source voltage Vx which is a high power supply potential and a low power supply potential (e.g., the ground potential GND) are applied to the selection circuit 136.

The memory circuit 121 is electrically connected to the selection circuit 136 and the switch 139.

The memory circuit 121 includes the second transistor. Specifically, a latch circuit including the second transistor is used as the memory circuit 121.

The memory circuit 121 is driven when the source voltage Vx which is a high power supply potential and a low power supply potential (e.g., the ground potential GND) are applied to the memory circuit 121.

The switch 139 is electrically connected to the memory circuit 121. Further, the switch 139 outputs an output signal Q. As described above, the switch 139 is turned on or off in response to the clock signal CLK.

If necessary, a buffer circuit may be provided between the selection circuit 136 and the other of the source and the drain of the first transistor 101/the storage capacitor 102. The provision of the buffer circuits makes it possible to widen the range of the storage device 130, in which operation can be performed.

<Driving Method of Storage Device>

Figure 2:
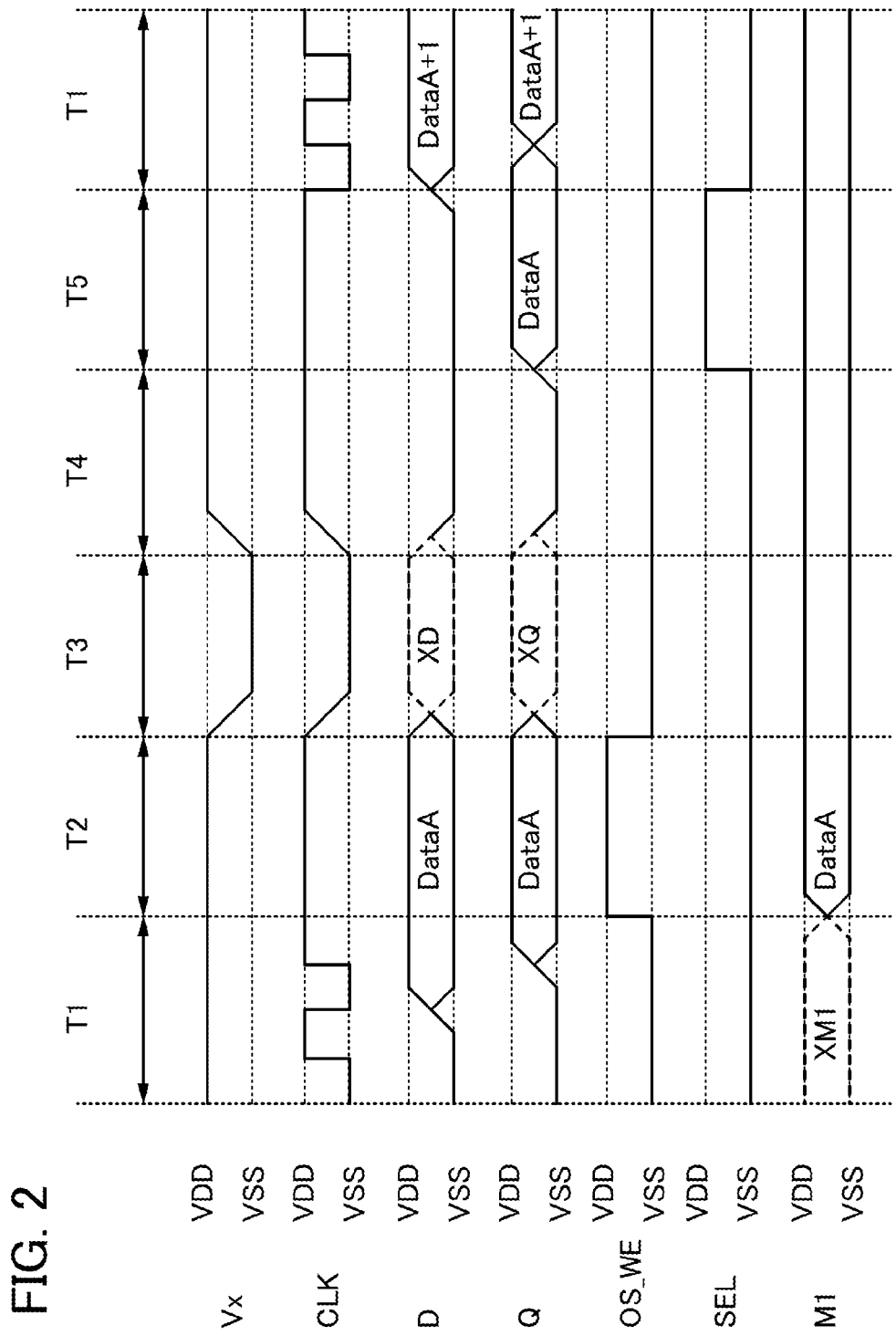
FIG. 2 is a timing diagram showing the operation of a storage device.
Figure 3:
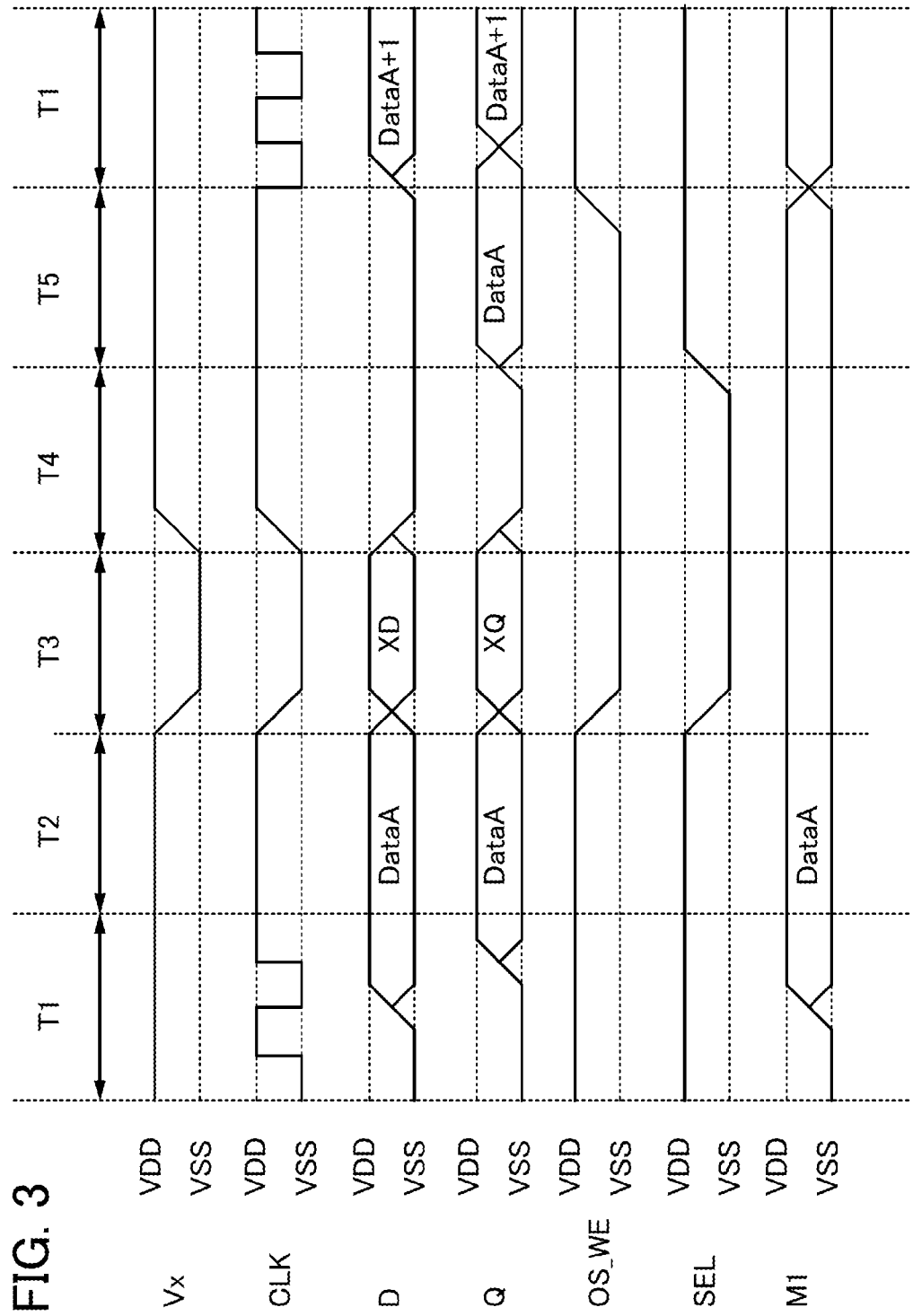
FIG. 3 is a timing diagram showing the operation of a storage device.

FIG. 2 is a timing diagram in the case where the storage device 130 in FIG. 1 is driven at a high frequency, and FIG. 3 is a timing diagram in the case where the storage device 130 in FIG. 1 is driven at a low frequency.

Note that a high frequency in this embodiment is a frequency at which the data signal D cannot be read and written from/to the storage capacitor 102 through the first transistor 101. The high frequency is, for example, 1 MHz or higher. Meanwhile, a low frequency in this embodiment is a frequency at which the data signal D can be read and written from/to the storage capacitor 102 through the first transistor 101. The low frequency is, for example, lower than 1 MHz.

<High Frequency Operation (FIG. 2)>

First, the operation of the storage device 130 at a high frequency will be described with reference to FIG. 2.

<Normal Operation Period (Period T1)>

A period in which the storage device 130 operates normally is a period T1. In the period T1, the clock signal CLK is input to the switch 139. In addition, the signal CLKb whose phase is the inverse of that of the clock signal CLK is input to the switch 134 through the phase inversion element 135.

When the clock signal CLK is changed from the high-level potential (VDD) to the low-level potential (VSS), the switch 134 is turned on and the switch 139 is turned off. When the switch 134 is turned on, the data signal D is input to the storage device 130 in FIG. 1.

In the period T1, the data signal D (Data A) is input to the memory circuit 121 through the switch 134 and the selection circuit 136, and is stored in the memory circuit 121.

After that, when the clock signal CLK is changed from the low-level potential (VSS) to the high-level potential (VDD), the switch 134 is turned off and the switch 139 is turned on. Consequently, the data signal D (Data A) stored in the memory circuit 121 is output as an output signal Q (Data A).

In the period T1, the potential of the node M1 may be either the high-level potential (VDD) or the low-level potential (VSS) (the potential of the node M1 is denoted as "XM1" in FIG. 2).

<Writing Operation Period (Period T2)>

A period in which the data signal D is written to the memory circuit 120 including the first transistor 101 and the storage capacitor 102 is a period T2. The period T2 is a period prior to a period T3 (a period in which the application of source voltage is stopped) to be described later. That is to say, the data signal D is written to the memory circuit 120 before the application of the source voltage Vx is stopped.

At the beginning of the period T2, the control signal OS_WE for controlling the first transistor 101 has a voltage at which the data signal D can be written sufficiently and the voltage is applied to the gate of the first transistor 101, so that the source and the drain of the first transistor 101 are electrically connected to each other (brought into an on state). Thus, the data signal D (Data A) is input to the storage capacitor 102 through the first transistor 101, and is held by the storage capacitor. The voltage at which the data signal can be sufficiently written to the storage capacitor 102 may be either a potential other than the high-level potential (VDD) or the high-level potential (VDD).

<Source Voltage Supply Stop Period (Period T3)>

A period in which the application of the source voltage Vx is stopped is a period T3. At the beginning of the period T3, the application of the source voltage Vx to the storage device 130 is stopped. Further, the control signal OS_WE for controlling the first transistor 101 is changed to the low-level potential (VSS). Consequently, the first transistor 101 is turned off. When the application of the source voltage Vx is stopped, the data (Data A) stored in the memory circuit 121 is erased. However, the data signal D (Data A) stored in the storage capacitor 102 is held even after the application of the source voltage Vx to the memory circuit 121 is stopped. The data signal D (Data A) stored in the storage capacitor 102 can be held for a long time because the leakage current of the first transistor 101 connected to the storage capacitor 102 is significantly small. Thus, the storage device 130 holds the data signal D (Data A) even after the cessation of the application of the source voltage Vx. In the period T3, the source voltage Vx is not applied to the storage device 130.

Further, since the application of the source voltage Vx to the storage device 130 is stopped, the input of the clock signal CLK is also stopped.

The data signal D (Data A) stored in the storage capacitor 102 can be held for a long time because the leakage current of the first transistor 101 is significantly low as described above. However, a buffer circuit may be provided between the selection circuit 136 and the other of the source and the drain of the first transistor 101/the storage capacitor 102 as needed. The buffer circuit can compensate the drop of the voltage of the data signal D held in the storage capacitor 102 when the voltage drops in the source voltage supply stop period. When the buffer circuit is provided so that the drop of the voltage can be compensated, it is possible to expand the range of the storage device 130, in which the operation can be performed.

In the period T3, the data signal D may be either the high-level potential (VDD) or the low-level potential (VSS) (the data signal D is denoted as "XD" in FIG. 2). In addition, the output signal Q is not also determined (the output signal Q is denoted as "XQ" in FIG. 2).

<Source Voltage Supply Resumption Period (Period T4)>

A period in which the application of the source voltage Vx is resumed is a period T4. At the beginning of the period T4, the application of the source voltage Vx to the storage device 130 is resumed. At this time, the control signal OS_WE for controlling the first transistor 101 is the low-level potential (VSS), so that the first transistor 101 remains off. Thus, the data signal D (Data A) remains stored in the storage capacitor 102.

The application of the source voltage Vx to the storage device 130 is resumed and the clock signal CLK is set to a high-level potential (VDD). Accordingly, the switch 134 is turned off and the switch 139 is turned on.

<Reading Operation Period (Period T5)>

A period in which the data signal D written to the memory circuit 120 is read is a period T5. At the beginning of the period T5, the selection signal SEL is changed from the low-level potential (VSS) to the high-level potential (VDD). The selection signal SEL set to the high-level potential (VDD) is input to the selection circuit 136, and the data signal D (Data A) stored in the storage capacitor 102 is input to the memory circuit 121. The switch 139 is turned on at the end of the period T4, so that the data signal D (Data A) input to the memory circuit 121 is output as the output signal Q (Data A).

After the end of the period T5 which is the reading operation period, another period T1 (normal operation period) starts, and another data signal D (Data A+1) is input to the storage device 130.

As described above, in the driving of the storage device at a high frequency, the high-level potential (VDD) is supplied to the gate of the first transistor 101 in the period T2 (writing operation period), so that the data signal D is stored in the storage capacitor 102 through the first transistor 101.

In the period T3 in which the application of the source voltage Vx is stopped and the period T4 in which the application of the source voltage Vx is resumed, the data signal D stored in the storage capacitor 102 through the first transistor 101 is output as the output signal Q.

In the period T1 (normal operation period), the period T2 (writing operation period), and the period T5 (reading operation period), the data signal D stored in the memory circuit 121 is output as the output signal Q.

<Low Frequency Operation (FIG. 3)>

Next, the operation of the storage device at a low frequency will be described with reference to FIG. 3.

<Normal Operation Period (Period T1)>

In a manner similar to that of the operation at a high frequency, in the period T1, the clock signal CLK is input to the switch 139. In addition, the signal CLKb whose phase is the inverse of that of the clock signal CLK is input to the switch 134 through the phase inversion element 135.

When the clock signal CLK is changed from the high-level potential (VDD) to the low-level potential (VSS), the switch 134 is turned on and the switch 139 is turned off. When the switch 134 is turned on, the data signal D is input to the memory circuit 120.

At the beginning of the period T1, the control signal OS_WE for controlling the first transistor 101 is input to the gate of the first transistor 101. At this time, the control signal OS_WE is the high-level potential (VDD). Accordingly, the first transistor 101 is turned on. Since the first transistor 101 is on, the data signal D (Data A) is stored in the storage capacitor 102 through the switch 134 and the first transistor 101. At this time, a first input terminal and a second input terminal of the selection circuit 136 are in a non-conduction state and in a conduction state, respectively. Thus, the data signal D (Data A) is not input to the memory circuit 121.

In the case where the storage device 130 is driven at a low frequency, the data signal D (Data A) can be written to the memory circuit 120 including the storage capacitor 102 through the first transistor 101 in the period T1. Thus, even when the drive frequency of the first transistor 101 is low, it is possible to secure sufficient time for writing the data signal D (Data A) to the memory circuit 120. Accordingly, since a writing operation period (Period T2) to be described later can be substantially omitted, power consumption can be reduced.

After that, when the clock signal CLK is changed from the low-level potential (VSS) to the high-level potential (VDD), the switch 134 is turned off and the switch 139 is turned on. Consequently, the data signal D (Data A) stored in the storage capacitor 102 is written to the memory circuit 121 through the selection circuit 136. The data signal D (Data A) written to the memory circuit 121 is output as the output signal Q (Data A).

<Writing Operation Period (Period T2)>

In the case where the storage device 100 is driven at a low frequency, the state at the end of the period T1 is maintained in the period T2.

<Source Voltage Supply Stop Period (Period T3)>

Next, the operation in the period T3 will be described. At the beginning of the period T3, the application of the source voltage Vx to the storage device 130 is stopped. Further, the control signal OS_WE for controlling the first transistor 101 is set to the low-level potential (VSS). Consequently, the first transistor 101 is turned off. When the application of the source voltage Vx is stopped, the data (Data A) stored in the memory circuit 121 is erased. However, the data signal D (Data A) stored in the storage capacitor 102 is held even after the application of the source voltage Vx to the memory circuit 121 is stopped. The data signal D (Data A) stored in the storage capacitor 102 can be held for a long time because the leakage current of the first transistor 101 connected to the storage capacitor 102 is significantly small. Thus, the storage device 130 holds the data signal D (Data A) even after the cessation of the application of the source voltage Vx. During the period T3, the source voltage Vx is not applied to the storage device 130.

Further, since the application of the source voltage Vx to the storage device 130 is stopped, the input of the clock signal CLK is also stopped.

In the period T3, the data signal D may be either the high-level potential (VDD) or the low-level potential (VSS) (the data signal D is denoted as "XD" in FIG. 2). In addition, the output signal Q is not determined (the output signal Q is denoted as "XQ" in FIG. 2).

<Source Voltage Supply Resumption Period (Period T4)>

Next, the operation in the period T4 will be described. At the beginning of the period T4, the application of the source voltage Vx to the storage device 130 is resumed. At this time, the control signal OS_WE for controlling the first transistor 101 is the low-level potential (VSS), so that the first transistor 101 remains off. Thus, the data signal D (Data A) remains stored in the storage capacitor 102.

The application of the source voltage Vx to the storage device 130 is resumed and the clock signal CLK is set to a high-level potential (VDD). Accordingly, the switch 134 is turned off and the switch 139 is turned on.

<Reading Operation Period (Period T5)>

Next, the operation in the period T5 will be described. At the end of the period T4, the selection signal SEL is changed to the high-level potential (VDD). The selection signal SEL set to the high-level potential (VDD) is input to the selection circuit 136, and the data signal D (Data A) stored in the storage capacitor 102 is input to the memory circuit 121. The switch 139 is turned on at the end of the period T4, so that the data signal D (Data A) input to the memory circuit 121 is output as the output signal Q (Data A).

After the end of the period T5 which is the reading operation period, another period T1 (normal operation period) starts, and another data signal D (Data A+1) is input to the storage device 130.

As described above, when the storage device is driven at a low frequency, in the period T1 (normal operation period), the data signal D is stored in the memory circuit 121 and the input data signal D is output as the output signal Q. At the same time, in the period T1, the data signal D is held in the storage capacitor 102 through the first transistor 101.

In the period T3 in which the application of the source voltage Vx is stopped and the period T4 in which the application of the source voltage Vx is resumed, the data signal D is stored in the storage capacitor 102.

In the period T1 (normal operation period), the period T2 (writing operation period), and the period T5 (reading operation period), the data signal D stored in the memory circuit 121 is output as the output signal Q.

Thus, it is possible to provide a storage device in which power consumption is reduced by stopping the application of source voltage even for a short time.

<Configuration of Storage Device in FIG. 4>

FIG. 4 is a more specific circuit diagram of a storage device according to this embodiment.

The storage device 100 in FIG. 4 includes the memory circuit 120 including the first transistor 101 and the storage capacitor 102 and the memory circuit 121 including an inverter 107 and an inverter 108 each of which includes a second transistor. The memory circuit 121 is a latch circuit in which the input terminal and the output terminal of the inverter 107 are connected to the output terminal and the input terminal of the inverter 108, respectively.

Note that, for example, an oxide semiconductor transistor is used as the first transistor 101 as described above. Having an extremely low off-state current, the oxide semiconductor transistor can be included in a nonvolatile memory circuit. The nonvolatile memory circuit 120 including such an oxide semiconductor transistor as the first transistor has an advantage that the properties thereof are not deteriorated due to rewriting.

The storage device 100 in FIG. 4 further includes an inverter 105, an analog switch 104, a selector 106, and an analog switch 109.

An input terminal of the inverter 105 is given a clock signal CLK and is electrically connected to a first terminal of the analog switch 109. An output terminal of the inverter 105 is electrically connected to a first terminal of the analog switch 104 and a second terminal of the analog switch 109. Further, the source voltage Vx which is a high power supply potential and a low power supply potential (e.g., the ground potential GND) are applied to the inverter 105.

Note that the inverter 105 may be formed using a second transistor. Specifically, the inverter 105 may include a p-channel transistor, an n-channel transistor, or both of them. More specifically, the inverter 105 may be a CMOS circuit in which a p-channel transistor and an n-channel transistor are complementarily connected to each other.

The first terminal of the analog switch 104 is electrically connected to the output terminal of the inverter 105 and the second terminal of the analog switch 109. A second terminal of the analog switch 104 is electrically connected to the first terminal of the analog switch 109. The data signal D is input to a third terminal of the analog switch 104. A fourth terminal of the analog switch 104 is electrically connected to one of the source and the drain of the first transistor 101 and a first input terminal of the selector 106.

Note that the analog switch 104 may be formed using a second transistor. Specifically, the analog switch 104 may include a p-channel transistor, an n-channel transistor, or both of them. More specifically, the analog switch 104 may be an analog switch in which one of a source and a drain of a p-channel transistor is electrically connected to one of a source and a drain of an n-channel transistor, and the other of the source and the drain of the p-channel transistor is electrically connected to the other of the source and the drain of the n-channel transistor.

The control signal OS_WE is input to the gate of the first transistor 101. The one of the source and the drain of the first transistor 101 is electrically connected to the fourth terminal of the analog switch 104 and the first input terminal of the selector 106. The other of the source and the drain of the first transistor 101 is electrically connected to one terminal of the storage capacitor 102 and a second input terminal of the selector 106. Note that the connection portion between the other of the source and the drain of the first transistor 101 and the one terminal of the storage capacitor 102 is the node M1.

The one terminal of the storage capacitor 102 is electrically connected to the other of the source and the drain of the first transistor 101 and the second input terminal of the selector 106. The other terminal of the storage capacitor 102 is given a low power supply potential (e.g., the ground potential GND).

The first input terminal of the selector 106 is electrically connected to the fourth terminal of the analog switch 104 and the one of the source and the drain of the first transistor 101. The second input terminal of the selector 106 is electrically connected to the other of the source and the drain of the first transistor 101 and the one terminal of the storage capacitor 102. An output terminal of the selector 106 is electrically connected to the input terminal of the inverter 107 and the output terminal of the inverter 108. Further, the source voltage Vx which is a high power supply potential and a low power supply potential (e.g., the ground potential GND) are applied to the selector 106.

The selector 106 selects a signal input to the first input terminal or a signal input to the second input terminal in accordance with the selection signal SEL and outputs the selected signal.

The selector 106 may be formed using a second transistor. Specifically, the selector 106 may include a p-channel transistor, an n-channel transistor, or both of them.

More specifically, the selector 106 may include two analog switches in each of which one of a source and a drain of a p-channel transistor is electrically connected to one of a source and a drain of an n-channel transistor, and the other of the source and the drain of the p-channel transistor is electrically connected to the other of the source and the drain of the n-channel transistor. In the selector, a gate of a p-channel transistor in a first analog switch may be electrically connected to a gate of an n-channel transistor in a second analog switch, and a gate of an n-channel transistor in the first analog switch may be electrically connected to a gate of a p-channel transistor in the second analog switch.

The input terminal of the inverter 107 is electrically connected to the output terminal of the selector 106 and the output terminal of the inverter 108. The output terminal of the inverter 107 is electrically connected to the input terminal of the inverter 108 and a fourth terminal of the analog switch 109. Further, the source voltage Vx which is a high power supply potential and a low power supply potential (e.g., the ground potential GND) are applied to the inverter 107.

The inverter 107 may be formed using a second transistor. Specifically, the inverter 107 may include a p-channel transistor, an n-channel transistor, or both of them. More specifically, the inverter 107 may be a CMOS circuit in which a p-channel transistor and an n-channel transistor are complementarily connected to each other.

The input terminal of the inverter 108 is electrically connected to the output terminal of the inverter 107 and the fourth terminal of the analog switch 109. The output terminal of the inverter 108 is electrically connected to the input terminal of the inverter 107 and the output terminal of the selector 106. Further, the source voltage Vx which is a high power supply potential and a low power supply potential (e.g., the ground potential GND) are applied to the inverter 108.

The inverter 108 may be formed using a second transistor. Specifically, the inverter 108 may include a p-channel transistor, an n-channel transistor, or both of them. More specifically, the inverter 108 may be a CMOS circuit in which a p-channel transistor and an n-channel transistor are complementarily connected to each other.

The first terminal of the analog switch 109 is given the clock signal CLK and is electrically connected to the input terminal of the inverter 105 and the second terminal of the analog switch 104. The second terminal of the analog switch 109 is electrically connected to the first terminal of the analog switch 104 and the output terminal of the inverter 105. The output signal Q is output from a third terminal of the analog switch 109. The fourth terminal of the analog switch 104 is electrically connected to the output terminal of the inverter 107 and the input terminal of the inverter 108.

Note that the analog switch 109 may be formed using a second transistor. Specifically, the analog switch 109 may include a p-channel transistor, an n-channel transistor, or both of them. More specifically, the analog switch 109 may be an analog switch in which one of a source and a drain of a p-channel transistor is electrically connected to one of a source and a drain of an n-channel transistor, and the other of the source and the drain of the p-channel transistor is electrically connected to the other of the source and the drain of the n-channel transistor.

If necessary, a buffer circuit may be provided between the second input terminal of the selector 106 and the other of the source and the drain of the first transistor 101/the one terminal of the storage capacitor 102. The provision of the buffer circuits makes it possible to expand the range of the storage device 100, in which operation can be performed.

<Driving Method of Storage Device>

FIG. 2 is a timing diagram in the case where the storage device 100 in FIG. 4 is driven at a high frequency, and FIG. 3 is a timing diagram in the case where the storage device 100 in FIG. 4 is driven at a low frequency.

Note that a high frequency in this embodiment is a frequency at which the data signal D cannot be read and written from/to the storage capacitor 102 through the first transistor 101. The high frequency is, for example, 1 MHz or higher. Meanwhile, a low frequency in this embodiment is a frequency at which the data signal D can be read and written from/to the storage capacitor 102 through the first transistor 101. The low frequency is, for example, lower than 1 MHz.

<High Frequency Operation (FIG. 2)>

First, the operation of the storage device 100 at a high frequency will be described with reference to FIG. 2.

<Normal Operation Period (Period T1)>

A period in which the storage device 100 operates normally is the period T1. In the period T1, the clock signal CLK is input to the input terminal of the inverter 105 and the first terminal of the analog switch 109. In response, the signal CLKb whose phase is the inverse of that of the clock signal CLK is input to the first terminal of the analog switch 104 from the output terminal of the inverter 105.

When the clock signal CLK is changed from the high-level potential (VDD) to the low-level potential (VSS), the analog switch 104 is turned on and the analog switch 109 is turned off. When the analog switch 104 is turned on, the data signal D is input to the storage device 100 in FIG. 4.

In the period T1, the data signal D (Data A) is input to the memory circuit 121 through the analog switch 104 and the selector 106, and is stored in the memory circuit 121.

After that, when the clock signal CLK is changed from the low-level potential (VSS) to the high-level potential (VDD), the analog switch 104 is turned off and the analog switch 109 is turned on. Consequently, the data signal D (Data A) stored in the memory circuit 121 is output as the output signal Q (Data A).

In the period T1, the potential of the node M1 may be either the high-level potential (VDD) or the low-level potential (VSS) (the potential of the node M1 is denoted as "XM1" in FIG. 2).

<Writing Operation Period (Period T2)>

A period in which the data signal D is written to the memory circuit 120 including the first transistor 101 and the storage capacitor 102 is the period T2. The period T2 is a period before the period T3 (a period in which the application of source voltage is stopped) to be described later. That is to say, the data signal D is written to the memory circuit 120 before the application of the source voltage Vx is stopped.

At the beginning of the period T2, the control signal OS_WE for controlling the first transistor 101 has a voltage at which the data signal D can be written sufficiently and the voltage is applied to the gate of the first transistor 101, so that the source and the drain of the first transistor 101 are electrically connected to each other (brought into an on state). Thus, the data signal D (Data A) is input to the storage capacitor 102 through the first transistor 101, and is held by the storage capacitor. The voltage at which the data signal can be sufficiently written to the storage capacitor 102 may be either a potential other than the high-level potential (VDD) or the high-level potential (VDD).

<Source Voltage Supply Stop Period (Period T3)>

A period in which the application of the source voltage Vx is stopped is the period T3. At the beginning of the period T3, the application of the source voltage Vx to the storage device 100 is stopped. Further, the control signal OS_WE for controlling the first transistor 101 is changed to the low-level potential (VSS). Consequently, the first transistor 101 is turned off. When the application of the source voltage Vx is stopped, the data (Data A) stored in the memory circuit 121 is erased. However, the data signal D (Data A) stored in the storage capacitor 102 is held even after the application of the source voltage Vx to the memory circuit 121 is stopped. The data signal D (Data A) stored in the storage capacitor 102 can be held for a long time because the leakage current of the first transistor 101 connected to the storage capacitor 102 is significantly small. Thus, the storage device 100 holds the data signal D (Data A) even after the cessation of the application of the source voltage Vx. In the period T3, the source voltage Vx is not applied to the storage device 100.

Further, since the application of the source voltage Vx to the storage device 100 is stopped, the input of the clock signal CLK is also stopped.

The data signal D (Data A) stored in the storage capacitor 102 can be held for a long time because the leakage current of the first transistor 101 is significantly low as described above. However, a buffer circuit may be provided between the second input terminal of the selector 106 and the other of the source and the drain of the first transistor 101/the one terminal of the storage capacitor 102 as needed. The buffer circuit can compensate the drop of the voltage of the data signal D held in the storage capacitor 102 when the voltage drops in the source voltage supply stop period. When the buffer circuit is provided so that the drop of the voltage can be compensated, it is possible to expand the range of the storage device 100, in which the operation can be performed.

In the period T3, the data signal D may be either the high-level potential (VDD) or the low-level potential (VSS) (the data signal D is denoted as "XD" in FIG. 2). In addition, the output signal Q is not also determined (the output signal Q is denoted as "XQ" in FIG. 2).

<Source Voltage Supply Resumption Period (Period T4)>

A period in which the application of the source voltage Vx is resumed is the period T4. At the beginning of the period T4, the application of the source voltage Vx to the storage device 100 is resumed. At this time, the control signal OS_WE for controlling the first transistor 101 is the low-level potential (VSS), so that the first transistor 101 remains off. Thus, the data signal D (Data A) remains stored in the storage capacitor 102.

The application of the source voltage Vx to the storage device 100 is resumed and the clock signal CLK is set to a high-level potential (VDD). Accordingly, the analog switch 104 is turned off and the analog switch 109 is turned on.

<Reading Operation Period (Period T5)>

A period in which the data signal D written to the memory circuit 120 is read is the period T5. At the beginning of the period T5, the selection signal SEL is changed from the low-level potential (VSS) to the high-level potential (VDD). The selection signal SEL set to the high-level potential (VDD) is input to the selector 106, and the data signal D (Data A) stored in the storage capacitor 102 is input to the memory circuit 121. The analog switch 109 is turned on at the end of the period T4, so that the data signal D (Data A) input to the memory circuit 121 is output as the output signal Q (Data A).

After the end of the period T5 which is the reading operation period, another period T1 (normal operation period) starts, and another data signal D (Data A+1) is input to the storage device 100.

As described above, in the driving of the storage device at a high frequency, the high-level potential (VDD) is supplied to the gate of the first transistor 101 in the period T2 (writing operation period), so that the data signal D is stored in the storage capacitor 102 through the first transistor 101.

In the period T3 in which the application of the source voltage Vx is stopped and the period T4 in which the application of the source voltage Vx is resumed, the data signal D stored in the storage capacitor 102 through the first transistor 101 is output as the output signal Q.

In the period T1 (normal operation period), the period T2 (writing operation period), and the period T5 (reading operation period), the data signal D stored in the memory circuit 121 is output as the output signal Q.

<Low Frequency Operation (FIG. 3)>

Next, the operation of the storage device at a low frequency will be described with reference to FIG. 3.

<Normal Operation Period (Period T1)>

First, as in the case of the operation at a high frequency, in the period T1, the clock signal CLK is input to the input terminal of the inverter 105 and the first terminal of the analog switch 109. In response, the signal CLKb whose phase is the inverse of that of the clock signal CLK is input to the first terminal of the analog switch 104 from the output terminal of the inverter 105.

When the clock signal CLK is changed from the high-level potential (VDD) to the low-level potential (VSS), the analog switch 104 is turned on and the analog switch 109 is turned off. When the analog switch 104 is turned on, the data signal D is input to the memory circuit 120.

At the beginning of the period T1, the control signal OS_WE for controlling the first transistor 101 is input to the gate of the first transistor 101. At this time, the control signal OS_WE is the high-level potential (VDD). Accordingly, the first transistor 101 is turned on. Since the first transistor 101 is on, the data signal D (Data A) is stored in the storage capacitor 102 through the analog switch 104 and the first transistor 101. At this time, the first input terminal and the second input terminal of the selector 106 are in a non-conduction state and in a conduction state, respectively. Thus, the data signal D (Data A) is not input to the memory circuit 121.

In the case where the storage device 100 is driven at a low frequency, the data signal D (Data A) can be written to the memory circuit 120 including the first transistor 101 and the storage capacitor 102 in the period T1. Thus, even when the drive frequency of the first transistor 101 is low, it is possible to secure sufficient time for writing the data signal D (Data A) to the memory circuit 120. Accordingly, since a writing operation period (Period T2) to be described later can be substantially omitted, power consumption can be reduced.

After that, when the clock signal CLK is changed from the low-level potential (VSS) to the high-level potential (VDD), the analog switch 104 is turned off and the analog switch 109 is turned on. Consequently, the data signal D (Data A) stored in the storage capacitor 102 is written to the memory circuit 121 through the selector 106. The data signal D (Data A) input to the memory circuit 121 is output as the output signal Q (Data A).

<Writing Operation Period (Period T2)>

In the case where the storage device 100 is driven at a low frequency, the state at the end of the period T1 is maintained in the period T2.

<Source Voltage Supply Stop Period (Period T3)>

Next, the operation in the period T3 will be described. At the beginning of the period T3, the application of the source voltage Vx to the storage device 100 is stopped. Further, the control signal OS_WE for controlling the first transistor 101 is changed to the low-level potential (VSS). Consequently, the first transistor 101 is turned off. When the application of the source voltage Vx is stopped, the data (Data A) stored in the memory circuit 121 is erased. However, the data signal D (Data A) stored in the storage capacitor 102 is held even after the application of the source voltage Vx to the memory circuit 121 is stopped. The data signal D (Data A) stored in the storage capacitor 102 can be held for a long time because the leakage current of the first transistor 101 connected to the storage capacitor 102 is significantly small. Thus, the storage device 100 holds the data signal D (Data A) even after the cessation of the application of the source voltage Vx. In the period T3, the source voltage Vx is not applied to the storage device 100 in FIG. 4.

Further, since the application of the source voltage Vx to the storage device 100 is stopped, the clock signal CLK is also stopped.

In the period T3, the data signal D may be either the high-level potential (VDD) or the low-level potential (VSS) (the data signal D is denoted as "XD" in FIG. 2). In addition, the output signal Q is not also determined (the output signal Q is denoted as "XQ" in FIG. 2).

<Source Voltage Supply Resumption Period (Period T4)>

Next, the operation in the period T4 will be described. At the beginning of the period T4, the application of the source voltage Vx to the storage device 100 is resumed. At this time, the control signal OS_WE for controlling the first transistor 101 is the low-level potential (VSS), so that the first transistor 101 remains off. Thus, the data signal D (Data A) remains stored in the storage capacitor 102.

The application of the source voltage Vx to the storage device 100 is resumed, the clock signal CLK is set to a high-level potential (VDD). Accordingly, the analog switch 104 is turned off and the analog switch 109 is turned on.

<Reading Operation Period (Period T5)>

Next, the operation in the period T5 will be described. At the end of the period T4, the selection signal SEL is changed to the high-level potential (VDD). The selection signal SEL set to the high-level potential (VDD) is input to the selector 106, and the data signal D (Data A) stored in the storage capacitor 102 is input to the memory circuit 121. The analog switch 109 is turned on at the end of the period T4, so that the data signal D (Data A) input to the memory circuit 121 is output as the output signal Q (Data A).

After the end of the period T5 which is the reading operation period, another period T1 (normal operation period) starts, and another data signal D (Data A+1) is input to the storage device 100.

As described above, when the storage device is driven at a low frequency, in the period T1 (normal operation period), the data signal D is stored in the memory circuit 121 and the input data signal D is output as the output signal Q. At the same time, in the period T1, the data signal D is held in the storage capacitor 102 through the first transistor 101.

In the period T3 in which the application of the source voltage Vx is stopped and the period T4 in which the application of the source voltage Vx is resumed, the data signal D is stored in the storage capacitor 102.

In the period T1 (normal operation period), the period T2 (writing operation period), and the period T5 (reading operation period), the data signal D stored in the memory circuit 121 is output as the output signal Q.

Thus, it is possible to provide a storage device in which power consumption is reduced by stopping the application of source voltage even for a short time.

<Structures and Manufacturing Methods of Oxide Semiconductor Transistor and Second Transistor>

As described above, in the first transistor 101 included in the memory circuit 120, a channel is formed in an oxide semiconductor layer, and the memory circuit 121 includes a transistor whose channel is formed in a silicon layer (second transistor). Particularly in the case where the memory circuit 121 includes the inverter 107 and the inverter 108 as in FIG. 4, the inverter 107 and the inverter 108 can each be formed using a p-channel transistor and an n-channel transistor.

Further, the inverter 105, the analog switch 104, the selector 106, and the analog switch 109 which are illustrated in FIG. 4 can each be also formed using a second transistor.

The structures of the first transistor 101 and the second transistor 123 will be described below.

Figure 5A:
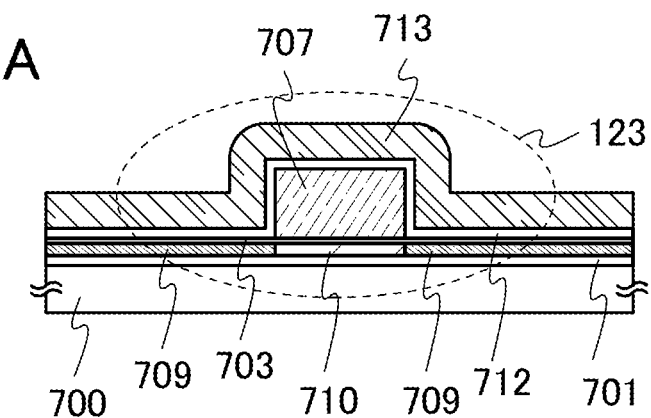
FIGS. 5A to 5C are cross-sectional views of a silicon transistor and oxide semiconductor transistors.

FIG. 5A illustrates a cross-sectional structure of the second transistor 123. The second transistor 123 in FIG. 5A includes, over a substrate 700, an insulating film 701 and a semiconductor film 702 separated from a single crystal semiconductor substrate. The semiconductor film 702 includes a channel formation region 710 overlapping with the gate electrode 707 and a pair of impurity regions 709 between which the channel formation region 710 is provided. A gate insulating film 703 is provided between the semiconductor film 702 and a gate electrode 707. Further, an insulating film 712 and an insulating film 713 are formed so as to cover the gate insulating film 703 and the gate electrode 707.

Although there is no particular limitation on a material which can be used for the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is preferably used.

Further, in this embodiment, description will be given of a method for manufacturing the second transistor 123, in which the semiconductor film 702 is single crystal silicon. Note that a specific example of a method for forming the single crystal semiconductor film 702 will be briefly described. First, an ion beam including ions which are accelerated by an electric field is delivered to a bond substrate which is the single crystal semiconductor substrate and a fragile layer which is weakened due to local disorder of the crystal structure is formed in a region at a certain depth from a surface of the bond substrate. The depth at which the fragile layer is formed can be adjusted by the acceleration energy and the incident angle of the ion beam. Then, the bond substrate and the substrate 700 over which an insulating film 701 is formed are attached to each other so that the insulating film 701 is provided therebetween. The attachment is performed as follows. After the bond substrate and the substrate 700 overlap with each other, a pressure of, approximately, greater than or equal to 1 N/cm$^2$ and less than or equal to 500 N/cm$^2$, preferably greater than or equal to 11 N/cm$^2$ and less than or equal to 20 N/cm$^2$ is applied to part of the bond substrate and part of the substrate 700. When the pressure is applied, bonding between the bond substrate and the insulating film 701 starts from the parts, resulting in the bonding in the entire surface where the bond substrate and the insulating film 701 are in close contact with each other. Subsequently, heat treatment is performed, whereby microvoids that exist in the fragile layer are combined and thus increase in volume. As a result, the single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film not etched to have a predetermined shape or may be added to the semiconductor film 702 etched to have a predetermined shape. Alternatively, the impurity element for controlling the threshold voltage may be added to the bond substrate. Still alternatively, the impurity element may be added to the bond substrate in order to roughly control the threshold voltage, and the impurity element may be further added to the semiconductor film not processed to have a predetermined shape (not patterned) or the semiconductor film 702 processed to have a predetermined shape, in order to finely control the threshold voltage.

The semiconductor film 702 includes the channel formation region 710 overlapping with the gate electrode 707 and the pair of impurity regions 709 between which the channel formation region 710 is provided.

The pair of impurity regions 709 includes an impurity element imparting one conductivity. As the impurity element imparting n-type conductivity, for example, phosphorus (P) and arsenic (As) are given; as the impurity element imparting p-type conductivity, for example, boron (B) is given.

Note that although an example in which a single crystal semiconductor film is used is described in this embodiment, one embodiment of the present invention is not limited thereto. For example, a polycrystalline, microcrystalline, or amorphous semiconductor film which is formed over the insulating film 701 by a vapor deposition method may be used. Alternatively, the above semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be used in combination. When a highly-heat-resistant substrate such as a quartz substrate is used, it is possible to combine any of the following crystallization methods: a thermal crystallization method using an electrically heated oven, a lamp annealing crystallization method using infrared light, a crystallization method using a catalytic element, and a high-temperature annealing method in which the temperature is approximately 950° C.

The gate insulating film 703 can be formed by oxidizing or nitriding a surface of the semiconductor film 702 by high-density plasma treatment, heat treatment, or the like. The high-density plasma treatment is performed using, for example, a mixed gas of a rare gas such as He, Ar, Kr, or Xe, and a gas such as oxygen, nitrogen oxide, ammonia, nitrogen, hydrogen, or the like. In this case, by exciting plasma by introduction of microwaves, high-density plasma with a low electron temperature can be generated. By oxidizing or nitriding the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed in contact with the semiconductor film. For example, a surface of the semiconductor film 702 is oxidized or nitrided using nitrous oxide ($N_2O$) diluted with one part to three parts (flow rate) of Ar, by application of a microwave (2.45 GHz) power of 3 kW to 5 kW at a pressure of 10 Pa to 30 Pa. Through this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) power of 3 kW to 5 kW is applied with a pressure of 10 Pa to 30 Pa so that a silicon oxynitride film is formed by a vapor deposition method, whereby the gate insulating film is formed. With a combination of a solid-phase reaction and a reaction by a vapor deposition method, the gate insulating film can have low interface state density and high breakdown voltage.

The oxidation or nitridation of the semiconductor film by the high-density plasma treatment proceeds by solid-phase reaction. Thus, interface state density between the gate insulating film 703 and the semiconductor film 702 can be extremely low. Further, by directly oxidizing or nitriding the semiconductor film 702 by high-density plasma treatment, variation in thickness of the insulating film to be formed can be suppressed. Moreover, in the case where the semiconductor film has crystallinity, oxidizing the surface of the semiconductor film with solid-phase reaction by high-density plasma treatment makes it possible to suppress fast oxidation only in a crystal grain boundary; therefore, the gate insulating film with uniformity and low interface state density can be formed. Variations in characteristics of transistors each including an insulating film formed by high-density plasma treatment as part or the whole of a gate insulating film can be suppressed.

The gate insulating film 703 may be formed to have a single-layer structure or a layered structure using a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

Note that, in this specification, an oxynitride refers to a material in which the oxygen content is higher than the nitrogen content, and a nitride oxide refers to a material in which the nitrogen content is higher than the oxygen content.

The range of the thickness of the gate insulating film 703 can be, for example, greater than or equal to 1 nm and less than or equal to 100 nm, preferably greater than or equal to 10 nm and less than or equal to 50 nm. In this embodiment, a single-layer insulating film including silicon oxide is formed as the gate insulating film 703 by a plasma CVD method.

As a material of the gate electrode 707, tantalum (Ta), tungsten (W), titanium (Ti), molybdenum (Mo), aluminum (Al), copper (Cu), chromium (Cr), niobium (Nb), or the like can be used. An alloy containing the above metal as a main component or a compound containing the above metal may be used. Alternatively, the gate electrode 707 may be formed using a semiconductor such as polycrystalline silicon doped with an impurity element imparting conductivity to the semiconductor film, such as phosphorus.

Note that although the gate electrode 707 is formed using a single-layer conductive film in this embodiment, one embodiment of the present invention is not limited to this structure. The gate electrode 707 may be formed of a plurality of conductive films stacked.

As for a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment aimed at thermal activation can be performed in subsequent steps after formation of the two conductive films. Alternatively, as a combination of the two conductive films, for example, nickel silicide and silicon doped with an impurity element which imparts n-type conductivity, tungsten silicide and silicon doped with an impurity element which imparts n-type conductivity, or the like may be used.

In the case of employing a three-layer structure in which three conductive films are stacked, a layered structure of a molybdenum film, an aluminum film, and a molybdenum film is preferable.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like may be used for the gate electrode 707.

Further, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be used as the insulating films 712 and 713. Since the porous insulating film has lower dielectric constant than a dense insulating film, parasitic capacitance due to electrodes or wirings can be further reduced.

In this embodiment, an example is described in which silicon oxynitride is used for the insulating film 712 and silicon nitride oxide is used for the insulating film 713. In addition, in this embodiment, although the insulating films 712 and 713 are formed over the gate electrode 707, according to one embodiment of the present invention, only one insulating film may be formed over the gate electrode 707, or three or more insulating films may be stacked.

The volatile memory circuit 121 is formed using the second transistor 123 described above.

Figure 5B:
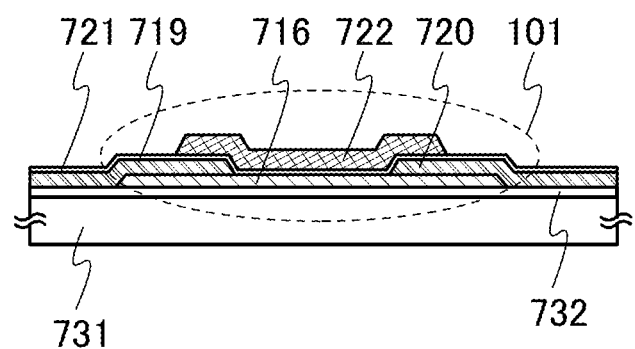

Next, a structure of the first transistor 101 will be described. FIG. 5B illustrates a cross-sectional structure of the first transistor 101. The first transistor 101 in FIG. 5B includes, over a substrate 731, an insulating film 732 and an oxide semiconductor layer 716. Over the oxide semiconductor layer 716, a conductive film 719, a conductive film 720, the gate insulating film 703, and a gate electrode 722 are sequentially provided.

In the first transistor 101 in FIG. 5B, the gate electrode 707 is provided over the oxide semiconductor layer 716, and the conductive film 719 and the conductive film 720 are formed over the oxide semiconductor layer 716. In this embodiment, such a transistor is referred to as a top-gate top-contact transistor.

In the first transistor 101 in FIG. 5B, a channel formation region is formed in a region where the oxide semiconductor layer 716 and the gate electrode 707 overlap with each other with the gate insulating film 703 laid therebetween. The conductive films 719 and 720 function as source and drain electrodes. Source and drain regions of the first transistor 101 in FIG. 5B are formed in a region where the oxide semiconductor layer 716 and the conductive film 719 overlap with each other and a region where the oxide semiconductor layer 716 and the conductive film 720 overlap with each other.

Materials similar to those of the substrate 700 and the insulating film 701 may be used for the substrate 731 and the insulating film 732, respectively. Alternatively, after being formed, the second transistor 123 may be covered with an insulating film having a flat surface, and the first transistor 101 may be formed above the second transistor 123 with the use of the flat insulating film instead of the insulating film 701.

The oxide semiconductor layer 716 can be formed by processing an oxide semiconductor film formed over the insulating film 701 into a desired shape. The range of the thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is formed by a sputtering method using an oxide semiconductor as a target. Moreover, the oxide semiconductor film can be formed by a sputtering method or the like in a rare gas (e.g., argon) atmosphere, an oxygen atmosphere, or a mixed atmosphere of a rare gas (e.g., argon) and oxygen.

A method for forming the oxide semiconductor film will be described below. The oxide semiconductor film is formed by a sputtering method, an evaporation method, a PCVD method, a PLD method, an ALD method, an MBE method, or the like.

The oxide semiconductor film is preferably formed by a sputtering method in an oxygen gas atmosphere at a substrate heating temperature in the range of 100° C. to 600° C., preferably 150° C. to 550° C., and more preferably 200° C. to 500° C. The thickness of the oxide semiconductor film is greater than or equal to 1 nm and less than or equal to 40 nm, and preferably greater than or equal to 3 nm and less than or equal to 20 nm. The higher the substrate heating temperature in deposition is, the lower the impurity concentration of the obtained oxide semiconductor film is. Further, the atomic arrangement in the oxide semiconductor film is ordered, the density thereof is increased, and thus a polycrystal or a c-axis aligned crystal (CAAC) is likely to be formed. Furthermore, deposition in an oxygen gas atmosphere also facilitates formation of a polycrystal or CAAC because an unnecessary atom is not contained in the oxide semiconductor film. Note that a mixed gas atmosphere containing an oxygen gas and a rare gas may be used. In that case, the percentage of the oxygen gas is higher than or equal to 30 vol. %, preferably higher than or equal to 50 vol. %, more preferably higher than or equal to 80 vol. %. As the oxide semiconductor film is thinner, the short channel effect of the transistor can be reduced. However, when the semiconductor film is too thin, it is significantly influenced by interface scattering; thus, the field-effect mobility might be decreased.

In the case of forming a film of an In—Ga—Zn—O-based material as the oxide semiconductor film by a sputtering method, it is preferable to use an In—Ga—Zn—O target having the following atomic ratio: the atomic ratio of In:Ga: Zn is 1:1:1, 4:2:3, 3:1:2, 1:1:2, 2:1:3, or 3:1:4. When the oxide semiconductor film is formed using an In—Ga—Zn—O target having the above atomic ratio, a polycrystal or CAAC is easily formed.

In the case of forming a film of an In—Sn—Zn—O-based material as the oxide semiconductor film by a sputtering method, it is preferable to use an In—Sn—Zn—O target having the following atomic ratio: the atomic ratio of In:Sn: Zn is 1:1:1, 2:1:3, 1:2:2, or 4:9:7. When the oxide semiconductor film is formed using an In—Sn—Zn—O target having the above atomic ratio, a polycrystal or CAAC is easily formed.

Next, heat treatment is performed. The heat treatment is performed in a reduced pressure atmosphere, an inert atmosphere, or an oxidation atmosphere. By the heat treatment, the impurity concentration in the oxide semiconductor film can be reduced.

The heat treatment is preferably performed in such a manner that after heat treatment in a reduced pressure atmosphere or an inert gas atmosphere is completed, the atmosphere is changed to an oxidation atmosphere while the temperature is kept, and heat treatment is further performed. When the heat treatment is performed in a reduced pressure atmosphere or an inert atmosphere, the impurity concentration in the oxide semiconductor film can be reduced; however, oxygen vacancies are caused at the same time. By the heat treatment in the oxidation atmosphere, the caused oxygen vacancies can be reduced.

By performing heat treatment on the oxide semiconductor film in addition to the substrate heating in deposition, the impurity level in the film can be significantly reduced. Accordingly, the field-effect mobility of the transistor can be increased so as to be close to ideal field-effect mobility to be described later.

Note that before the oxide semiconductor film is formed by a sputtering method, dust attached to surfaces of the insulating films 712 and 713 is preferably removed by reverse sputtering in which an argon gas is introduced and plasma is generated. The reverse sputtering refers to a method in which, without application of voltage to the target side, an RF power source is used for application of voltage to the substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Still alternatively, an argon atmosphere to which chlorine, carbon tetrafluoride, or the like is added may be used.

An oxide semiconductor used for the oxide semiconductor transistor preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, a three-component metal oxide such as an In—Ga—Zn-based oxide (also referred to as IGZO), an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a two-component metal oxide such as an In—Z- based oxide, a Sn—Zn-based oxide, an Al—Zn-based oxide, a Zn—Mg-based oxide, a Sn—Mg-based oxide, an In—Mg-based oxide, or an In—Ga-based oxide, or a single-component metal oxide such as an In-based oxide, a Sn-based oxide, or a Zn—O-based oxide. In addition, any of the above oxide semiconductors may contain an element other than In, Ga, Sn, and Zn, for example, $SiO_2$.

Note that here, for example, an "In—Ga—Zn-based oxide" means an oxide containing In, Ga, and Zn and there is no particular limitation on the ratio of In, Ga, and Zn. Further, the In—Ga—Z-based oxide may contain a metal element other than In, Ga, and Zn.

Alternatively, a material represented by 1 $nMO_3(ZnO)_m$, (m>0 is satisfied, and m is not an integer) may be used as an oxide semiconductor. Note that M represents one or more metal elements selected from Ga, Fe, Mn, and Co. For example, M can be Ga, Ga and Al, Ga and Mn, Ga and Co, or the like. Still alternatively, a material represented by $In_3SnO_5(ZnO)_n$ (n>0 is satisfied, and n is an integer) may be used as an oxide semiconductor.

For example, an In—Ga—Zn-based oxide with an atomic ratio of In:Ga:Zn=1:1:1 (=⅓:⅓:⅓) or In:Ga:Zn=2:2:1 (=⅖:⅖:⅕), or any of oxides whose composition is in the neighborhood of the above compositions can be used. Alternatively, an In—Sn—Zn-based oxide with an atomic ratio of In:Sn:Zn=1:1:1 (=⅓:⅓:⅓), In:Sn:Zn=2:1:3 (=⅓:⅙:½), or In:Sn:Zn=2:1:5 (=¼:⅛:⅝), or any of oxides whose composition is in the neighborhood of the above compositions may be used.

Note that one embodiment of the disclosed invention is not limited thereto, and a material having appropriate composition depending on semiconductor characteristics (mobility, threshold, variation, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics.

For example, with an In—Sn—Zn-based oxide, high mobility can be realized relatively easily. However, even with an In—Ga—Zn-based oxide, mobility can be increased by reducing the defect density in the bulk.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \le r^2$. A variable r may be 0.05, for example. The same can be applied to other oxides.

The oxide semiconductor may be either a single crystal oxide semiconductor or a non-single-crystal oxide semiconductor. In the latter case, the non-single-crystal oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be suppressed, and relatively high mobility can be obtained with relative ease.

In an oxide semiconductor having crystallinity, defects in the bulk can be further reduced, and when surface evenness is improved, mobility higher than that of an oxide semiconductor in an amorphous state can be realized. In order to improve the surface evenness, the oxide semiconductor is preferably deposited over a flat surface. Specifically, the oxide semiconductor is preferably deposited over a surface with an average surface roughness (Ra) of less than or equal to 1 nm, preferably less than or equal to 0.3 nm, more preferably less than or equal to 0.1 nm.

Note that Ra in this specification refers to a centerline average roughness obtained by three-dimensionally expanding a centerline average roughness defined by JIS B0601 so as to be applied to a plane to be measured. The Ra can be expressed as an "average value of absolute values of deviations from a reference plane to a designated plane", and is defined with the following equation.

$$Ra = \frac{1}{S_0}\int_{y_1}^{y_2}\int_{x_1}^{x_2}|f(x, y) - Z_0|dxdy \quad \text{[EQUATION 1]}$$

Note that in Equation 1, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents the average height of a measurement surface. Ra can be measured using an atomic force microscope (AFM).

Note that the oxide semiconductor may be amorphous or crystalline. As a crystalline oxide semiconductor, an oxide including crystals with c-axis orientation (also referred to as CAAC) is also preferable because the advantageous effect of improving the reliability of a transistor can be obtained.

A sputtering method may be performed to form an oxide semiconductor film including CAAC. In order to obtain CAAC by a sputtering method, it is important to form hexagonal crystals in an initial stage of formation of an oxide semiconductor film and to cause crystal growth from the hexagonal crystals as seed crystals. In order to achieve this, it is preferable that the distance between the target and the substrate be made to be longer (e.g., 150 mm to 200 mm) and the range of the substrate heating temperature be 100° C. to 500° C., more preferably 200° C. to 400° C., still more preferably 250° C. to 300° C. In addition to this, the formed oxide semiconductor film is subjected to heat treatment at a temperature exceeding the substrate heating temperature in the deposition. Consequently, micro-defects in the film and defects at the interface between films can be compensated.

Note that in this specification, a hexagonal crystal structure is included in a hexagonal system. The hexagonal system includes a trigonal system and a hexagonal system of seven crystal systems.

An oxide including CAAC, which has a triangular or hexagonal atomic arrangement when seen from the direction of an a-b plane, a surface, or an interface, will be specifically described below. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an "oxide including CAAC" means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., the direction perpendicular to a surface of a substrate over which the CAAC is formed or a surface of the CAAC). Alternatively, the normals of the a-b planes of the individual crystalline portions included in the CAAC may be aligned in one direction (e.g., the direction perpendicular to a surface of a substrate over which the CAAC is formed or a surface of the CAAC).

The CAAC can be a conductor, a semiconductor, or an insulator, depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a substrate over which the CAAC is formed, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, FIGS. 17A to 17C, and FIGS. 32A and 32B. In FIGS. 15A to 15E, FIGS. 16A to 16C, FIGS. 17A to 17C, and FIGS. 32A and 32B, the vertical direction corresponds to the c-axis direction and a plane perpendicular to the c-axis direction corresponds to the a-b plane, unless otherwise specified. When the expressions "upper half" and "lower half" are simply used, they refer to the upper half above the a-b plane and the lower half below the a-b plane (the upper half and the lower half with respect to the a-b plane). Further, in FIGS. 15A to 15E, O surrounded by a circle represents tetracoordinate O and O surrounded by a double circle represents tricoordinate O.

Figure 15A:
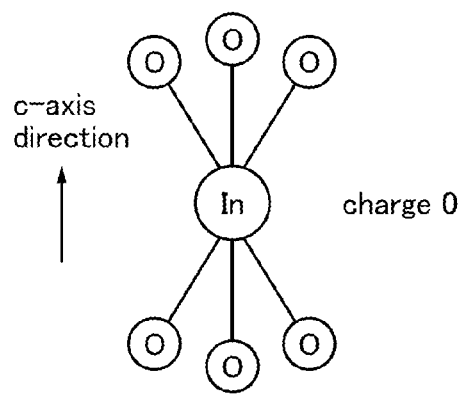
FIGS. 15A to 15E illustrate structures of oxide materials.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of the upper half and the lower half in FIG. 15A. In the small group illustrated in FIG. 15A, electric charge is 0.

Figure 15D:
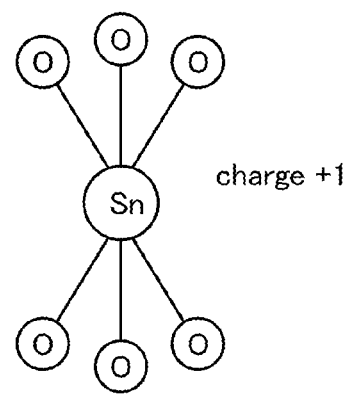
Figure 15B:
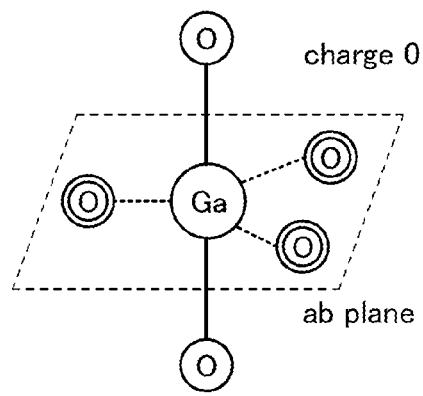

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 15B. An In atom can also have the structure illustrated in FIG. 15B because an In atom can have five ligands. In the small group illustrated in FIG. 15B, electric charge is 0.

Figure 15E:
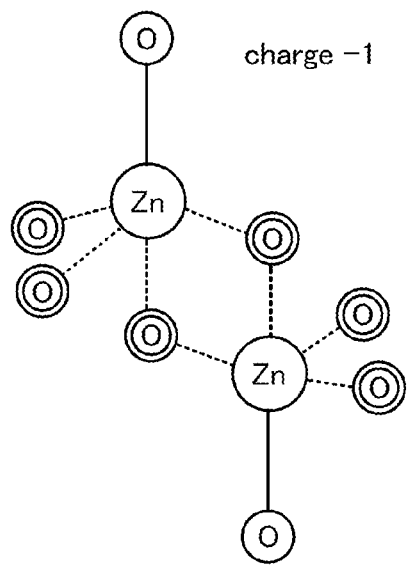
Figure 15C:
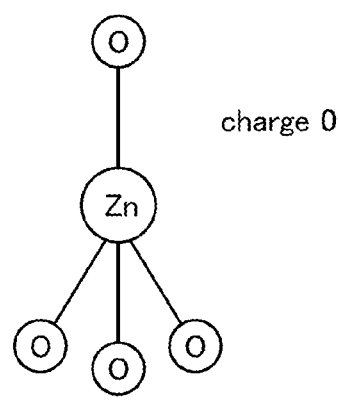

FIG. 15C illustrates a structure including one tetracoordinate Zn atom and four tetracoordinate O atoms proximate to the Zn atom. In FIG. 15C, one tetracoordinate O atom exists in the upper half and three tetracoordinate O atoms exist in the lower half Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of the upper half and the lower half In the small group illustrated in FIG. 15D, electric charge is +1.

FIG. 15E illustrates a small group including two Zn atoms. In FIG. 15E, one tetracoordinate O atom exists in each of the upper half and the lower half In the small group illustrated in FIG. 15E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 16A illustrates a model of a medium group included in a layered structure of an In—Sn—Zn—O-based material. FIG. 16B illustrates a large group including three medium groups. Note that FIG. 16C illustrates an atomic arrangement in the case where the layered structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom are denoted by circled 3. Similarly, in FIG. 16A, one tetracoordinate O atom existing in each of the upper half and the lower half with respect to an In atom is denoted by circled 1. FIG. 16A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—Zn—O-based material in FIG. 16A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridnate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

Specifically, when the large group illustrated in FIG. 16B is repeated, an In—Sn—Zn—O-based crystal ($In_2SnZn_3O_8$) can be obtained. Note that a layered structure of the obtained In—Sn—Zn—O-based crystal can be expressed by a composition formula, $In_2SnZn_2O_7(ZnO)_m$ (m is 0 or a natural number).

The above-described rule also applies to the following oxides: four-component metal oxides such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide, three-component metal oxides such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide, two-component metal oxides such as an In—Z-based oxide, a Sn—Zn-based oxide, an Al—Zn-based oxide, a Zn—Mg-based oxide, a Sn—Mg-based oxide, an In—Mg-based oxide, and an In—Ga-based oxide, and the like.

Figure 17A:
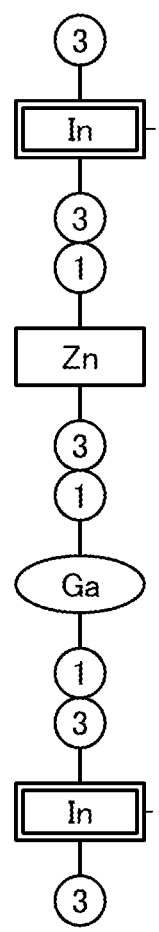
FIGS. 17A to 17C illustrate a structure of an oxide material.

As an example, FIG. 17A illustrates a model of a medium group included in a layered structure of an In—Ga—Zn—O-based material.

In the medium group included in the layered structure of the In—Ga—Zn—O-based material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 17B:
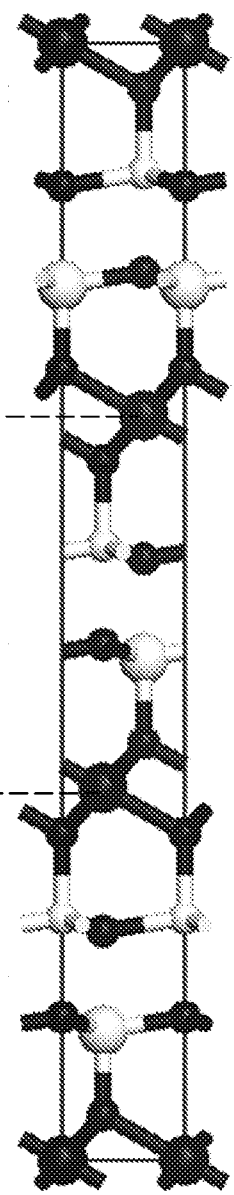
Figure 17C:
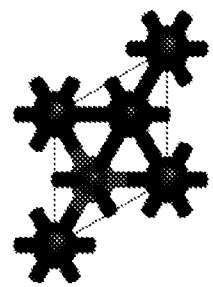

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 17A but also a medium group in which the arrangement of the In atom, the Ga atom, and the Zn atom is different from that in FIG. 17A.

Specifically, when the large group illustrated in FIG. 17B is repeated, an In—Ga—Zn—O-based crystal can be obtained. Note that a layered structure of the obtained In—Ga—Zn—O-based crystal can be expressed by a composition formula, $InGaO_3(ZnO)_n$ (n is a natural number).

Figure 32A:
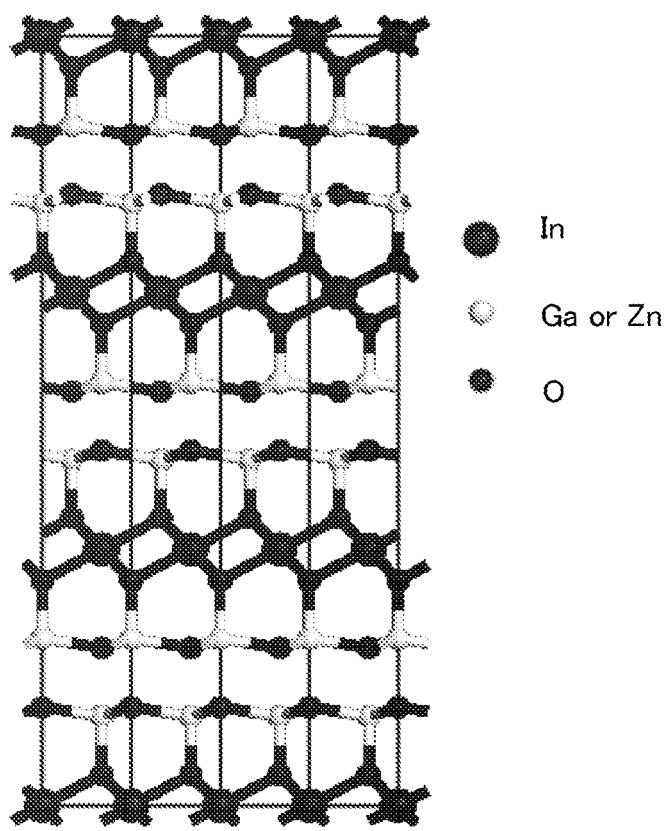
FIGS. 32A and 32B illustrate structures of oxide materials.

In the case where n is 1 ($InGaZnO_4$), a crystal structure illustrated in FIG. 32A can be obtained, for example. Note that in the crystal structure in FIG. 32A, since a Ga atom and an In atom each have five ligands as described in FIG. 15B, a structure in which Ga is replaced with In can be obtained.

Figure 32B:
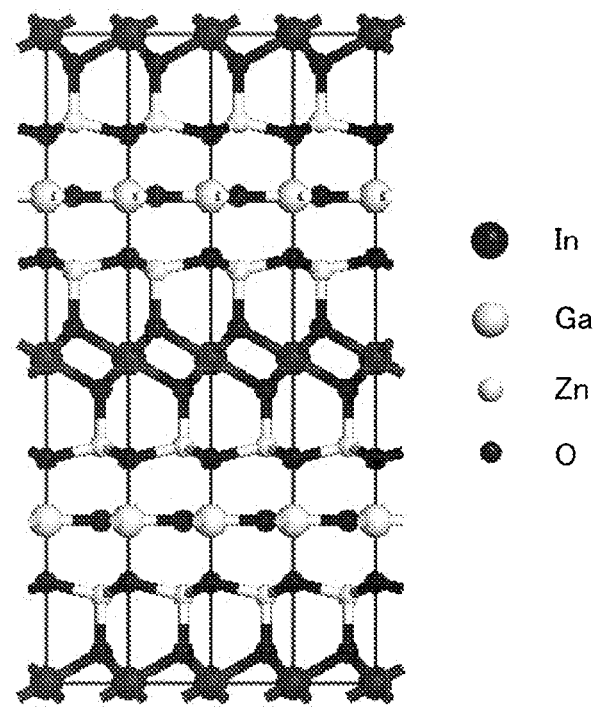

In the case where n is 2 ($InGaZn_2O_5$), a crystal structure illustrated in FIG. 32B can be obtained, for example. Note that in the crystal structure in FIG. 32B, since a Ga atom and an In atom each have five ligands as described in FIG. 15B, a structure in which Ga is replaced with In can be obtained.

In addition, it is known that examples of the In—Ga—Zn—O that is a four-component metal oxide include $InGaZnO_4$ having a $YbFe_2O_4$-type structure and $In_2Ga_2ZnO_7$ having a $Yb_2Fe_3O_7$-type structure, and the In—Ga—Zn—O can have any of deformed structures of the foregoing structures (M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315). Note that a layer containing Yb is denoted by an A layer and a layer containing Fe is denoted by a B layer, below. The $YbFe_2O_4$-type structure has a repeated structure of ABB|ABB|ABB. As an example of a deformed structure of the $YbFe_2O_4$-type structure, a repeated structure of ABBB|ABBB can be given. Further, the $Yb_2Fe_3O_7$-type structure has a repeated structure of ABB|AB|ABB|AB. As an example of a deformed structure of the $Yb_2Fe_3O_7$-type structure, a repeated structure of ABBB|ABB|ABBB|ABB|ABBB|ABB|can be given.

In CAAC, metal atoms and oxygen atoms are bonded in an orderly manner in comparison with an amorphous oxide semiconductor. That is to say, in the case where an oxide semiconductor is amorphous, the coordination numbers of oxygen atoms around a metal atom might vary between various metal atoms, but the coordination numbers of oxygen atoms around a metal atom are almost the same in CAAC. Therefore, microscopic defects of oxygen can be reduced and instability and movement of electric charge that are due to attachment and detachment of hydrogen atoms (including hydrogen ions) or alkali metal atoms can be reduced.

Accordingly, a transistor is formed using an oxide semiconductor film including CAAC, whereby the amount of shift of the threshold voltage of the transistor, which occurs after light irradiation or a bias-temperature (BT) stress test is performed on the transistor, can be reduced. Thus, a transistor having stable electric characteristics can be formed.

The conductive films 719 and 720 function as source and drain electrodes.

For the conductive film for forming the conductive films 719 and 720, any of the following can be used: an element selected from aluminum, chromium, copper, tantalum, titanium, molybdenum, and tungsten; an alloy containing any of these elements; an alloy film containing the above elements in combination; and the like. Alternatively, a structure may be employed in which a film of a refractory metal such as chromium, tantalum, titanium, molybdenum, or tungsten is provided over or below a metal film of aluminum, copper, or the like. Aluminum or copper is preferably combined with a refractory metal material so as to prevent problems with heat resistance and corrosion. As the refractory metal material, molybdenum, titanium, chromium, tantalum, tungsten, neodymium, scandium, yttrium, or the like can be used.

Further, the conductive film for forming the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. A Cu—Mg—Al alloy, a Mo—Ti alloy, Ti, and Mo have high adhesion to an oxide film. Therefore, when a layered structure is employed for the conductive films 719 and 720, in which a conductive film containing a Cu—Mg—Al alloy, a Mo—Ti alloy, Ti, or Mo is used for the lower layer and a conductive film containing Cu is used for the upper layer, the adhesion between an insulating film which is an oxide film and the conductive films 719 and 720 can be increased.

The conductive film for forming the conductive films 719 and 720 may be formed using a conductive metal oxide. As the conductive metal oxide, indium oxide, tin oxide, zinc oxide, a mixture of indium oxide and tin oxide, a mixture of indium oxide and zinc oxide, or the metal oxide material containing silicon or silicon oxide can be used.

In the case where heat treatment is performed after formation of the conductive film, the conductive film preferably has heat resistance high enough to withstand the heat treatment.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

When the oxide conductive film functioning as a source region and a drain region is provided, resistance between the oxide semiconductor layer 716 and the conductive films 719 and 720 can be reduced, so that the transistor can operate at high speed. In addition, provision of the oxide conductive film functioning as a source region and a drain region leads to an increase in the breakdown voltage of the transistor.

The gate insulating film 721 can be formed using a material and a layered structure which are similar to those of the gate insulating film 703. Note that the gate insulating film 721 preferably contains as few impurities such as moisture and hydrogen as possible, and may be formed using a single-layer insulating film or a plurality of insulating films stacked. When hydrogen is contained in the gate insulating film 721, entry of the hydrogen into the oxide semiconductor layer 716 or extraction of oxygen from the oxide semiconductor layer 716 by the hydrogen occurs, whereby the oxide semiconductor layer 716 has low resistance (n-type conductivity); thus, a parasitic channel might be formed. Therefore, it is important that a film formation method in which hydrogen is not used is employed in order to form the gate insulating film 721 containing as little hydrogen as possible. A material having a high barrier property is preferably used for the gate insulating film 721. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having low proportion of nitrogen, such as a silicon oxide film or a silicon oxynitride film, is formed so that the oxide semiconductor layer 716 is closer to the insulating film having low proportion of nitrogen than to the insulating film having a high barrier property. Then, the insulating film having a high barrier property is formed so as to overlap with the conductive films 719 and 720 and the oxide semiconductor layer 716 with the insulating film having a low proportion of nitrogen sandwiched therebetween. By using the insulating film having a high barrier property, the impurities such as moisture and hydrogen can be prevented from entering the oxide semiconductor layer 716, the gate insulating film 721, or the interface between the oxide semiconductor layer 716 and another insulating film and the vicinity thereof. In addition, the insulating film having a low proportion of nitrogen, such as a silicon oxide film or a silicon oxynitride film, which is formed in contact with the oxide semiconductor layer 716 can prevent the insulating film formed using a material having a high barrier property from being in direct contact with the oxide semiconductor layer 716.

In this embodiment, the gate insulating film 721 having a structure in which a silicon nitride film having a thickness of 100 nm formed by a sputtering method is stacked over a silicon oxide film having a thickness of 200 nm formed by a sputtering method is formed. The range of the substrate temperature in deposition may be higher than or equal to room temperature and lower than or equal to 300° C. and in this embodiment, the substrate temperature in deposition is 100° C.

The gate electrode 722 can be formed in such a manner that a conductive film is formed over the gate insulating film 721 and then is patterned. The gate electrode 722 can be formed using a material similar to those of the gate electrode 707 and the conductive films 719 and 720.

The thickness of the gate electrode 722 is 10 nm to 400 nm, preferably 100 nm to 200 nm. In this embodiment, after a conductive film for the gate electrode is formed to have a thickness of 150 nm by a sputtering method using a tungsten target, the conductive film is processed (patterned) into a desired shape by etching, whereby the gate electrode 722 is formed. Note that a resist mask may be formed by an inkjet method. Formation of the resist mask by an inkjet method needs no photomask; thus, manufacturing cost can be reduced.

Although the first transistor 101 is described as a single-gate transistor, a multi-gate transistor including a plurality of channel formation regions when a plurality of gate electrodes which is electrically connected is included can be formed if needed.

Note that an insulating film in contact with the oxide semiconductor layer 716 (corresponding to the gate insulating film 721 in this embodiment) may be formed using an insulating material containing a Group 13 element and oxygen. Many of oxide semiconductor materials contain Group 13 elements, and an insulating material containing a Group 13 element works well with oxide semiconductors. By using such an insulating material containing a Group 13 element for the insulating film in contact with the oxide semiconductor layer, an interface with the oxide semiconductor layer can be kept favorable.

An insulating material containing a Group 13 element refers to an insulating material containing one or more Group 13 elements. As the insulating material containing a Group 13 element, for example, gallium oxide, aluminum oxide, aluminum gallium oxide, gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor layer containing gallium, a material containing gallium oxide may be used for an insulating film, so that favorable characteristics can be kept at the interface between the oxide semiconductor layer and the insulating film. When the oxide semiconductor layer and the insulating film containing gallium oxide are provided in contact with each other, accumulation of hydrogen at the interface between the oxide semiconductor layer and the insulating film can be reduced, for example. Note that a similar effect can be obtained in the case where an element in the same group as a constituent element of the oxide semiconductor is used in an insulating film. For example, it is effective to form an insulating film with the use of a material containing aluminum oxide. Note that aluminum oxide is impermeable to water; therefore, it is preferable to use a material containing aluminum oxide in terms of preventing entry of water to the oxide semiconductor layer.

The insulating film in contact with the oxide semiconductor layer 716 is preferably made to contain oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating film in contact with the oxide semiconductor layer 716 is formed using gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor layer 716 is formed using gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen vacancies in the oxide semiconductor layer or at the interface between the oxide semiconductor layer and the insulating film are reduced. Thus, the oxide semiconductor layer can be made to be i-type or substantially i-type.

Note that the insulating film including a region where the proportion of oxygen is higher than that in the stoichiometric composition may be used as either the insulating film located on the upper side of the oxide semiconductor layer 716 or the insulating film located on the lower side of the oxide semiconductor layer 716 of the insulating films in contact with the oxide semiconductor layer 716; however, it is preferable to apply such an insulating film to both of the insulating films in contact with the oxide semiconductor layer 716. The above effect can be enhanced with a structure where the insulating films each including a region where the proportion of oxygen is higher than that in the stoichiometric composition are used as the insulating films which are in contact with the oxide semiconductor layer 716 and which are placed on the upper side and the lower side of the oxide semiconductor layer 716, in order that the oxide semiconductor layer 716 may be sandwiched between the insulating films.

The insulating films on the upper side and the lower side of the oxide semiconductor layer 716 may include the same constituent elements or different constituent elements. For example, the insulating films on the upper side and the lower side may be both formed using gallium oxide whose composition is $Ga_2O_x$ ($x=3+\alpha$, $0<\alpha<1$). Alternatively, one of the insulating films on the upper side and the lower side may be formed using gallium oxide whose composition is $Ga_2O_x$ ($x=3+\alpha$, $0<\alpha<1$) and the other may be formed using aluminum oxide whose composition is $Al_2O_x$ ($x=3+\alpha$, $0<\alpha<1$).

The insulating film in contact with the oxide semiconductor layer 716 may be formed by stacking insulating films each including a region where the proportion of oxygen is higher than that in the stoichiometric composition. For example, the insulating film on the upper side of the oxide semiconductor layer 716 may be formed as follows: gallium oxide whose composition is $Ga_2O_x$ ($x=3+\alpha$, $0<\alpha<1$) is formed and gallium aluminum oxide (or aluminum gallium oxide) whose composition is $Ga_xAl_{2-x}O_{3+\alpha}$ ($0<x<2$, $0<\alpha<1$) is formed thereover. Note that the insulating film on the lower side of the oxide semiconductor layer 716 may be formed by stacking insulating films each including a region where the proportion of oxygen is higher than that in the stoichiometric composition. Further, both of the insulating films on the upper side and the lower side of the oxide semiconductor layer 716 may be formed by stacking insulating films each including a region where the proportion of oxygen is higher than that in the stoichiometric composition.

The nonvolatile memory circuit 120 can be formed using the first transistor 101 described above.

Figure 5C:
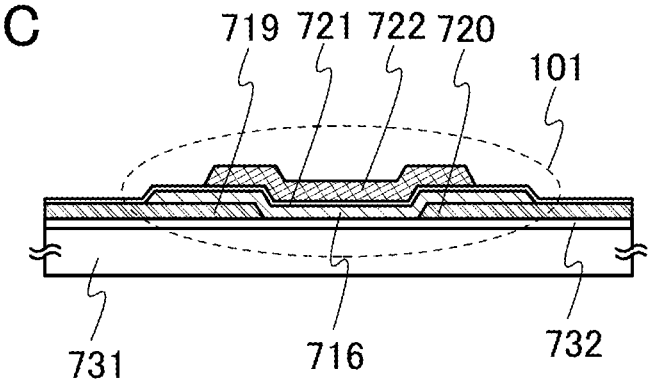

FIG. 5C illustrates a structure of the first transistor 101, which is different from that in FIG. 5B.

In the first transistor 101 in FIG. 5C, the conductive films 719 and 720 functioning as source and drain electrodes are provided between the oxide semiconductor layer 716 and the insulating films 712 and 713. The transistor 101 in FIG. 5C can be obtained in such a manner that the conductive films 719 and 720 are formed after the formation of the insulating film 713, and then, the oxide semiconductor layer 716 is formed.

According to this embodiment, it is possible to provide a storage device which does not need a complicated manufacturing process and has lower power consumption. In particular, it is possible to provide a storage device in which power consumption is reduced by stopping the application of source voltage even for a short time.

Embodiment 2

In this embodiment, an oxide semiconductor transistor which has a structure different from that in Embodiment 1 will be described.

Figure 9A:
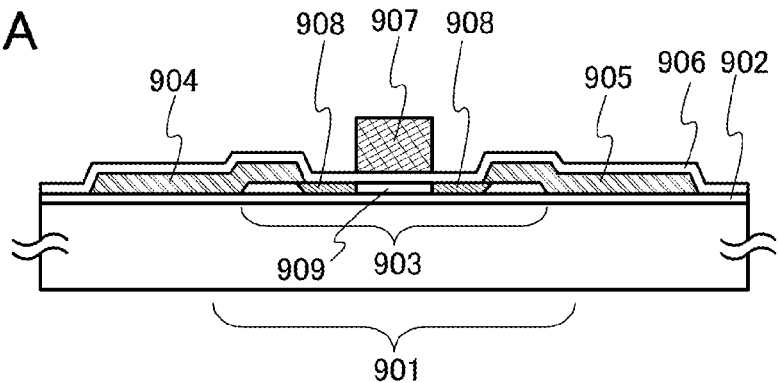
FIGS. 9A to 9D are cross-sectional views of oxide semiconductor transistors.

A transistor 901 illustrated in FIG. 9A includes, over an insulating film 902, an oxide semiconductor layer 903 which functions as an active layer; a source electrode 904 and a drain electrode 905 which are formed over the oxide semiconductor layer 903; a gate insulating film 906 over the oxide semiconductor layer 903, the source electrode 904, and the drain electrode 905; and a gate electrode 907 which is provided over the gate insulating film 906 so as to overlap with the oxide semiconductor layer 903.

The transistor 901 illustrated in FIG. 9A is a top-gate transistor in which the gate electrode 907 is formed over the oxide semiconductor layer 903 and also is a top-contact transistor in which the source electrode 904 and the drain electrode 905 are formed over the oxide semiconductor layer 903. In the transistor 901, the source electrode 904 and the drain electrode 905 do not overlap with the gate electrode 907. That is, a distance between the source electrode 904 and the gate electrode 907 and a distance between the drain electrode 905 and the gate electrode 907 are each larger than the thickness of the gate insulating film 906. Accordingly, parasitic capacitance between the source electrode 904 and the gate electrode 907 and parasitic capacitance between the drain electrode 905 and the gate electrode 907 can be small, and thus high-speed operation can be achieved in the transistor 901.

The oxide semiconductor layer 903 includes a pair of high concentration regions 908 which is obtained by addition of a dopant imparting n-type conductivity to the oxide semiconductor layer 903 after the gate electrode 907 is formed. Further, in the oxide semiconductor layer 903, a region which overlaps with the gate electrode 907 with the gate insulating film 906 provided therebetween is a channel formation region 909. In the oxide semiconductor layer 903, the channel formation region 909 is provided between the pair of high concentration regions 908. The dopant for forming the high concentration regions 908 can be added by an ion implantation method. A rare gas such as helium, argon, or xenon; an atom belonging to Group 15, such as nitrogen, phosphorus, arsenic, or antimony; or the like can be used as the dopant.

For example, when nitrogen is used as the dopant, it is preferable that the high concentration regions 908 have a nitrogen atom concentration in the range of higher than or equal to $5\times10^{19}/cm^3$ and lower than or equal to $1\times10^{22}/cm^3$.

The high concentration regions 908 to which the dopant imparting n-type conductivity is added has higher conductivity than other regions in the oxide semiconductor layer 903. Thus, the high concentration regions 908 are provided in the oxide semiconductor layer 903, whereby the resistance between the source electrode 904 and the drain electrode 905 can be reduced.

When an In—Ga—Zn-based oxide semiconductor is used for the oxide semiconductor layer 903, heat treatment is performed for approximately an hour at a temperature in the range of higher than or equal to 300° C. and lower than or equal to 600° C. after the addition of nitrogen, so that an oxide semiconductor in the high concentration regions 908 has a wurtzite crystal structure. When the oxide semiconductor in the high concentration regions 908 has a wurtzite crystal structure, the conductivity of the high concentration regions 908 can be further increased and the resistance between the source electrode 904 and the drain electrode 905 can be further reduced. Note that in order to effectively reduce the resistance between the source electrode 904 and the drain electrode 905 by forming the oxide semiconductor having a wurtzite crystal structure, when nitrogen is used as the dopant, the range of the nitrogen atom concentration in the high concentration regions 908 is preferably higher than or equal to $1\times10^{20}/cm^3$ and lower than or equal to 7 atoms %. However, even when the nitrogen atom concentration is lower than that in the above range, the oxide semiconductor having a wurtzite crystal structure can be obtained in some cases.

Further, the oxide semiconductor layer 903 may include CAAC. When the oxide semiconductor layer 903 includes CAAC, the conductivity of the oxide semiconductor layer 903 can be higher than that of an amorphous semiconductor film; therefore, the resistance between the source electrode 904 and the drain electrode 905 can be reduced.

The reduction in the resistance between the source electrode 904 and the drain electrode 905 ensures a high on-state current and high-speed operation even when the transistor 901 is miniaturized. Further, the miniaturization of the transistor 901 makes it possible to reduce an area occupied by a storage element including the transistor and increase memory capacity per unit area of the storage element.

Figure 9B:
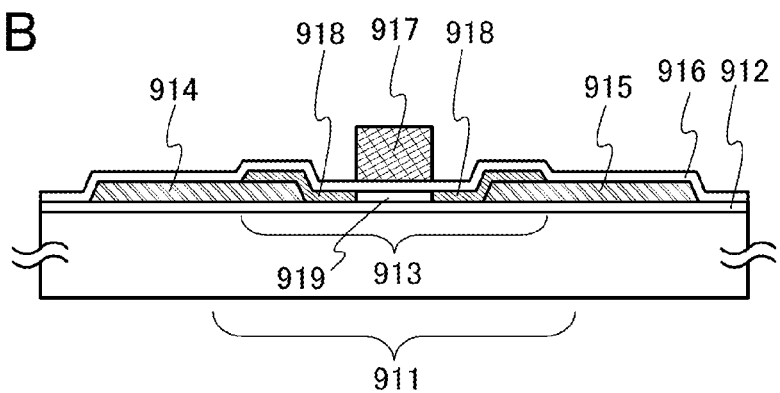

A transistor 911 illustrated in FIG. 9B includes a source electrode 914 and a drain electrode 915 which are formed over an insulating film 912; an oxide semiconductor layer 913 which is formed over the source electrode 914 and the drain electrode 915 and functions as an active layer; a gate insulating film 916 over the oxide semiconductor layer 913, the source electrode 914, and the drain electrode 915; and a gate electrode 917 which is provided over the gate insulating film 916 so as to overlap with the oxide semiconductor layer 913.

The transistor 911 illustrated in FIG. 9B is a top-gate transistor in which the gate electrode 917 is formed over the oxide semiconductor layer 913, and also is a bottom-contact transistor in which the source electrode 914 and the drain electrode 915 are formed below the oxide semiconductor layer 913. As in the transistor 901, the source electrode 914 and the drain electrode 915 do not overlap with the gate electrode 917 in the transistor 911. Thus, parasitic capacitance between the source electrode 914 and the gate electrode 917 and parasitic capacitance between the drain electrode 915 and the gate electrode 917 can be reduced and high-speed operation can be achieved.

In addition, the oxide semiconductor layer 913 includes a pair of high concentration regions 918 which is obtained by addition of a dopant imparting n-type conductivity to the oxide semiconductor layer 913 after the gate electrode 917 is formed. Further, in the oxide semiconductor layer 913, a region which overlaps with the gate electrode 917 with the gate insulating film 916 provided therebetween is a channel formation region 919. The channel formation region 919 is provided between the pair of high concentration regions 918 in the oxide semiconductor layer 913.

The high concentration regions 918 can be formed by an ion implantation method in a manner similar to that in the case of the high concentration regions 908 included in the transistor 901. The case of the high concentration regions 908 can be referred to for a kind of the dopant for forming the high concentration regions 918.

For example, when nitrogen is used as the dopant, it is preferable that the high concentration regions 918 have a nitrogen atom concentration in the range of higher than or equal to $5\times10^{19}/\text{cm}^3$ and lower than or equal to $1\times10^{22}/\text{cm}^3$.

The high concentration regions 918 to which the dopant imparting n-type conductivity is added has higher conductivity than other regions in the oxide semiconductor layer 913. Thus, the high concentration regions 918 are provided in the oxide semiconductor layer 913, whereby the resistance between the source electrode 914 and the drain electrode 915 can be reduced.

When an In—Ga—Zn-based oxide semiconductor is used for the oxide semiconductor layer 913, heat treatment is performed for approximately an hour at a temperature in the range of higher than or equal to 300° C. and lower than or equal to 600° C. after addition of nitrogen, so that an oxide semiconductor in the high concentration regions 918 has a wurtzite crystal structure. When the oxide semiconductor in the high concentration regions 918 has a wurtzite crystal structure, the conductivity of the high concentration regions 918 can be further increased and the resistance between the source electrode 914 and the drain electrode 915 can be further reduced. Note that in order to effectively reduce the resistance between the source electrode 914 and the drain electrode 915 by forming the oxide semiconductor having a wurtzite crystal structure, when nitrogen is used as the dopant, the range of the nitrogen atom concentration in the high concentration regions 918 is preferably higher than or equal to $1\times10^{20}/\text{cm}^3$ and lower than or equal to 7 atoms %. However, even when the nitrogen atom concentration is lower than that in the above range, the oxide semiconductor having a wurtzite crystal structure can be obtained in some cases.

Further, the oxide semiconductor layer 913 may include CAAC. When the oxide semiconductor layer 913 includes CAAC, the conductivity of the oxide semiconductor layer 913 can be higher than that of an amorphous semiconductor film; therefore, the resistance between the source electrode 914 and the drain electrode 915 can be reduced.

The reduction in the resistance between the source electrode 914 and the drain electrode 915 ensures a high on-state current and high-speed operation even when the transistor 911 is miniaturized. Further, the miniaturization of the transistor 911 makes it possible to reduce an area occupied by a storage element including the transistor and increase memory capacity per unit area of the storage element.

Figure 9C:
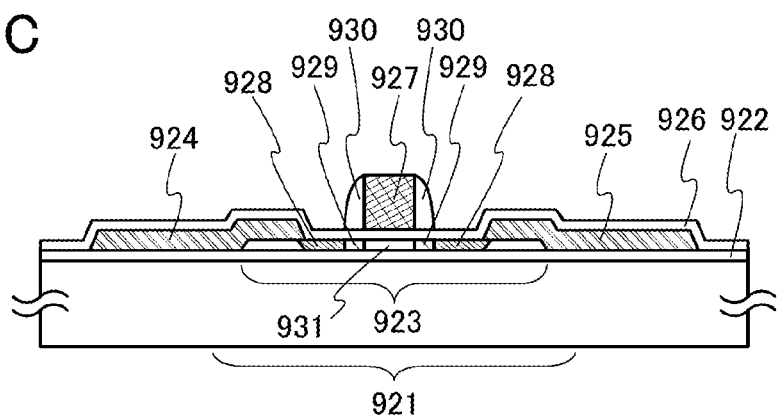

A transistor 921 illustrated in FIG. 9C includes an oxide semiconductor layer 923 which is formed over an insulating film 922 and functions as an active layer; a source electrode 924 and a drain electrode 925 which are formed over the oxide semiconductor layer 923; a gate insulating film 926 over the oxide semiconductor layer 923, the source electrode 924, and the drain electrode 925; and a gate electrode 927 which is provided over the gate insulating film 926 so as to overlap with the oxide semiconductor layer 923. The transistor 921 further includes sidewalls 930 provided on the sides of the gate electrode 927 and formed using an insulating film.

The transistor 921 illustrated in FIG. 9C is a top-gate transistor in which the gate electrode 927 is formed over the oxide semiconductor layer 923, and also is a top-contact transistor in which the source electrode 924 and the drain electrode 925 are formed over the oxide semiconductor layer 923. In the transistor 921, the source electrode 924 and the drain electrode 925 do not overlap with the gate electrode 927 as in the transistor 901; thus, parasitic capacitances between the source electrode 924 and the gate electrode 927 and between the drain electrode 925 and the gate electrode 927 can be reduced, leading to high-speed operation.

Further, the oxide semiconductor layer 923 includes a pair of high concentration regions 928 and a pair of low concentration regions 929 which can be obtained by addition of a dopant imparting n-type conductivity to the oxide semiconductor layer 923 after the gate electrode 927 is formed. Furthermore, in the oxide semiconductor layer 923, a region which overlaps with the gate electrode 927 with the gate insulating film 926 provided therebetween is a channel formation region 931. In the oxide semiconductor layer 923, the pair of low concentration regions 929 is provided between the pair of high concentration regions 928, and the channel formation region 931 is provided between the pair of low concentration regions 929. The pair of low concentration regions 929 is provided in regions which are included in the oxide semiconductor layer 923 and overlap with the sidewalls 930 with the gate insulating film 926 provided therebetween.

The high concentration regions 928 and the low concentration regions 929 can be formed by an ion implantation method as in the case of the high concentration regions 908 included in the transistor 901. The case of the high concentration regions 908 can be referred to for a kind of the dopant for forming the high concentration regions 928.

For example, when nitrogen is used as the dopant, it is preferable that the high concentration regions 928 have a nitrogen atom concentration in the range of higher than or equal to $5\times10^{19}/\text{cm}^3$ and lower than or equal to $1\times10^{22}/\text{cm}^3$. Further, when nitrogen is used as the dopant, for example, it is preferable that the low concentration regions 929 have a nitrogen atom concentration in the range of higher than or equal to $5\times10^{18}/\text{cm}^3$ and lower than $5\times10^{19}\ \text{cm}^3$.

The high concentration regions 928 to which the dopant imparting n-type conductivity is added have higher conductivity than other regions in the oxide semiconductor layer 923. Thus, the high concentration regions 928 are provided in the oxide semiconductor layer 923, whereby resistance between the source electrode 924 and the drain electrode 925 can be reduced. Further, the low concentration regions 929 are provided between the channel formation region 931 and the high concentration regions 928, which results in a reduction in negative shift of a threshold voltage due to a short-channel effect.

When an In—Ga—Zn-based oxide semiconductor is used for the oxide semiconductor layer 923, heat treatment is performed for an hour at a temperature in the range of 300° C. to 600° C. after addition of nitrogen, so that an oxide semiconductor in the high concentration regions 928 has a wurtzite crystal structure. Further, the low concentration regions 929 may have a wurtzite crystal structure due to the heat treatment, depending on the concentration of the nitrogen. When the oxide semiconductor in the high concentration regions 928 has a wurtzite crystal structure, the conductivity of the high concentration regions 928 can be further increased and the resistance between the source electrode 924 and the drain electrode 925 can be further reduced. Note that in order to effectively reduce the resistance between the source electrode 924 and the drain electrode 925 by forming the oxide semiconductor having a wurtzite crystal structure, when nitrogen is used as a dopant, the range of the nitrogen atom concentration in the high concentration regions 928 is preferably higher than or equal to $1\times10^{20}/\text{cm}^3$ and lower than or equal to 7 atoms %. However, even when the nitrogen atom concentration is lower than the above range, the oxide semiconductor having a wurtzite crystal structure can be obtained in some cases.

Further, the oxide semiconductor layer 923 may include CAAC. When the oxide semiconductor layer 923 includes CAAC, the conductivity of the oxide semiconductor layer 923 can be higher than that of an amorphous semiconductor film; therefore, the resistance between the source electrode 924 and the drain electrode 925 can be reduced.

The reduction in the resistance between the source electrode 924 and the drain electrode 925 ensures a high on-state current and high-speed operation even when the transistor 921 is miniaturized. Further, the miniaturization of the transistor 921 makes it possible to reduce an area occupied by a memory cell including the transistor and increase memory capacity per unit area of a cell array.

Figure 9D:
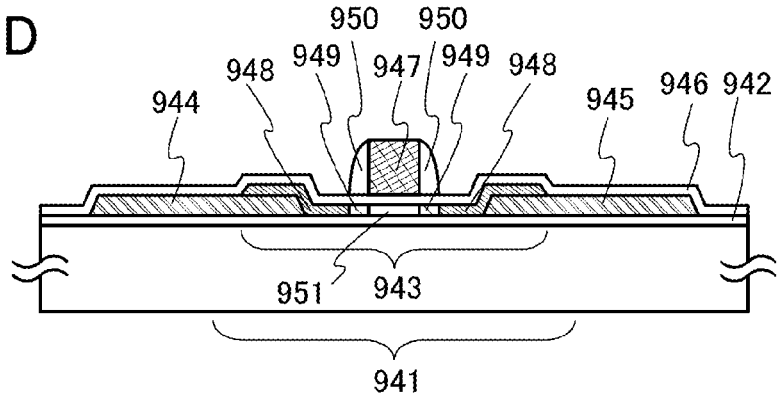

A transistor 941 illustrated in FIG. 9D includes a source electrode 944 and a drain electrode 945 which are formed over an insulating film 942; an oxide semiconductor layer 943 which is formed over the source electrode 944 and the drain electrode 945 and functions as an active layer; a gate insulating film 946 over the oxide semiconductor layer 943, the source electrode 944, and the drain electrode 945; and a gate electrode 947 over the gate insulating film 946 so as to overlap with the oxide semiconductor layer 943. The transistor 941 further includes sidewalls 950 provided on the sides of the gate electrode 947 and formed using an insulating film.

The transistor 941 illustrated in FIG. 9D is a top-gate transistor in which the gate electrode 947 is formed over the oxide semiconductor layer 943, and is also a bottom-contact transistor in which the source electrode 944 and the drain electrode 945 are formed below the oxide semiconductor layer 943. In the transistor 941, the source electrode 944 and the drain electrode 945 do not overlap with the gate electrode 947 as in the transistor 901; thus, parasitic capacitances between the source electrode 944 and the gate electrode 947 and between the drain electrode 945 and the gate electrode 947 can be reduced, leading to high-speed operation.

Further, the oxide semiconductor layer 943 includes a pair of high concentration regions 948 and a pair of low concentration regions 949 which can be obtained by addition of a dopant imparting n-type conductivity to the oxide semiconductor layer 943 after the gate electrode 947 is formed. Furthermore, in the oxide semiconductor layer 943, a region which overlaps with the gate electrode 947 with the gate insulating film 946 provided therebetween is a channel formation region 951. In the oxide semiconductor layer 943, the pair of low concentration regions 949 is provided between the pair of high concentration regions 948, and the channel formation region 951 is provided between the pair of low concentration regions 949. The pair of low concentration regions 949 is provided in a region which is included in the oxide semiconductor layer 943 and overlaps with the sidewalls 950 with the gate insulating film 946 provided therebetween.

The high concentration regions 948 and the low concentration regions 949 can be formed by an ion implantation method as in the case of the high concentration regions 908 included in the transistor 901. The case of the high concentration regions 908 can be referred to for a kind of the dopant for forming the high concentration regions 948.

For example, when nitrogen is used as the dopant, it is preferable that the high concentration regions 948 have a nitrogen atom concentration in the range of higher than or equal to $5\times10^{19}/cm^3$ and lower than or equal to $1\times10^{22}/cm^3$. Further, when nitrogen is used as the dopant, for example, it is preferable that the low concentration regions 949 have a nitrogen atom concentration in the range of higher than or equal to $5\times10^{18}/cm^3$ and lower than $5\times10^{19} cm^3$.

The high concentration regions 948 to which the dopant imparting n-type conductivity is added has higher conductivity than other regions in the oxide semiconductor layer 943. Thus, the high concentration regions 948 are included in the oxide semiconductor layer 943, whereby resistance between the source electrode 944 and the drain electrode 945 can be reduced. Further, the low concentration regions 949 are provided between the channel formation region 951 and the high concentration regions 948, which result in a reduction in negative shift of a threshold voltage due to a short-channel effect.

When an In—Ga—Zn-based oxide semiconductor is used for the oxide semiconductor layer 943, heat treatment for an hour at a temperature in the range of 300° C. to 600° C. after addition of nitrogen enables an oxide semiconductor in the high concentration regions 948 to have a wurtzite crystal structure. Further, the low concentration regions 949 may have a wurtzite crystal structure due to the heat treatment, depending on the concentration of the nitrogen. When the oxide semiconductor in the high concentration regions 948 has a wurtzite crystal structure, the conductivity of the high concentration regions 948 can be further increased and the resistance between the source electrode 944 and the drain electrode 945 can be further reduced. Note that in order to effectively reduce the resistance between the source electrode 944 and the drain electrode 945 by forming the oxide semiconductor having a wurtzite crystal structure, when nitrogen is used as a dopant, the range of the nitrogen atom concentration in the high concentration regions 948 is preferably higher than or equal to $1\times10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor layer 943 may include CAAC. When the oxide semiconductor layer 943 includes CAAC, the conductivity of the oxide semiconductor layer 943 can be higher than that of an amorphous semiconductor film; therefore, the resistance between the source electrode 944 and the drain electrode 945 can be reduced.

The reduction in the resistance between the source electrode 944 and the drain electrode 945 ensures a high on-state current and high-speed operation even when the transistor 941 is miniaturized. Further, the miniaturization of the transistor 941 makes it possible to reduce an area occupied by a memory cell including the transistor and increase memory capacity per unit area of a cell array.

Note that, as one of methods for manufacturing high concentration regions functioning as a source region and a drain region in a transistor including an oxide semiconductor through a self-aligned process, a method is disclosed in which a surface of an oxide semiconductor layer is exposed and argon plasma treatment is performed to reduce the resistance of the region in the oxide semiconductor layer which is exposed to plasma (S. Jeon et al. "180 nm Gate Length Amorphous InGaZnO Thin Film Transistor for High Density Image Sensor Applications", IEDM Tech. Dig., pp. 504-507, 2010).

However, in the manufacturing method, a gate insulating film needs to be partly removed after formation of the gate insulating film so that portions which are to serve as the source region and the drain region are exposed. At the time of partly removing the gate insulating film, part of an oxide semiconductor layer below the gate insulating film is over-etched, so that the thicknesses of the portions which are to serve as the source region and the drain region are reduced. As a result, the resistance of the source region and the drain region is increased, and a characteristic defect of the transistor due to the over-etching is likely to occur.

To miniaturize a transistor, it is necessary to employ a dry etching method with high process precision. However, the above over-etching is more likely to occur when a dry etching method is employed in which the etching rate of the oxide semiconductor layer is not sufficiently different from the etching rate of the gate insulating film.

For example, no problem is caused when the oxide semiconductor layer has a sufficient thickness, but in the case where the channel length is 200 nm or less, it is necessary that the thickness of a portion of the oxide semiconductor layer, which is to serve as a channel formation region, be 20 nm or less, preferably 10 nm or less, in order that a short-channel effect may be prevented. When such a thin oxide semiconductor layer is used, the over-etching of the oxide semiconductor layer is not preferable because the resistance of the source region and the drain region is increased and a characteristic defect of the transistor is caused due to the over-etching as described above.

However, when a dopant is added to the oxide semiconductor layer in the state where the oxide semiconductor layer is not exposed and the gate insulating film remains, as described in one embodiment of the disclosed invention, the over-etching of the oxide semiconductor layer can be prevented and excessive damage to the oxide semiconductor layer can be reduced. In addition, an interface between the oxide semiconductor layer and the gate insulating film is kept clean. Consequently, characteristics and reliability of the transistor can be improved.

This embodiment can be implemented in appropriate combination with any of the other embodiments.

Embodiment 3

One mode of a structure of a storage device will be described in this embodiment.

Figure 10:
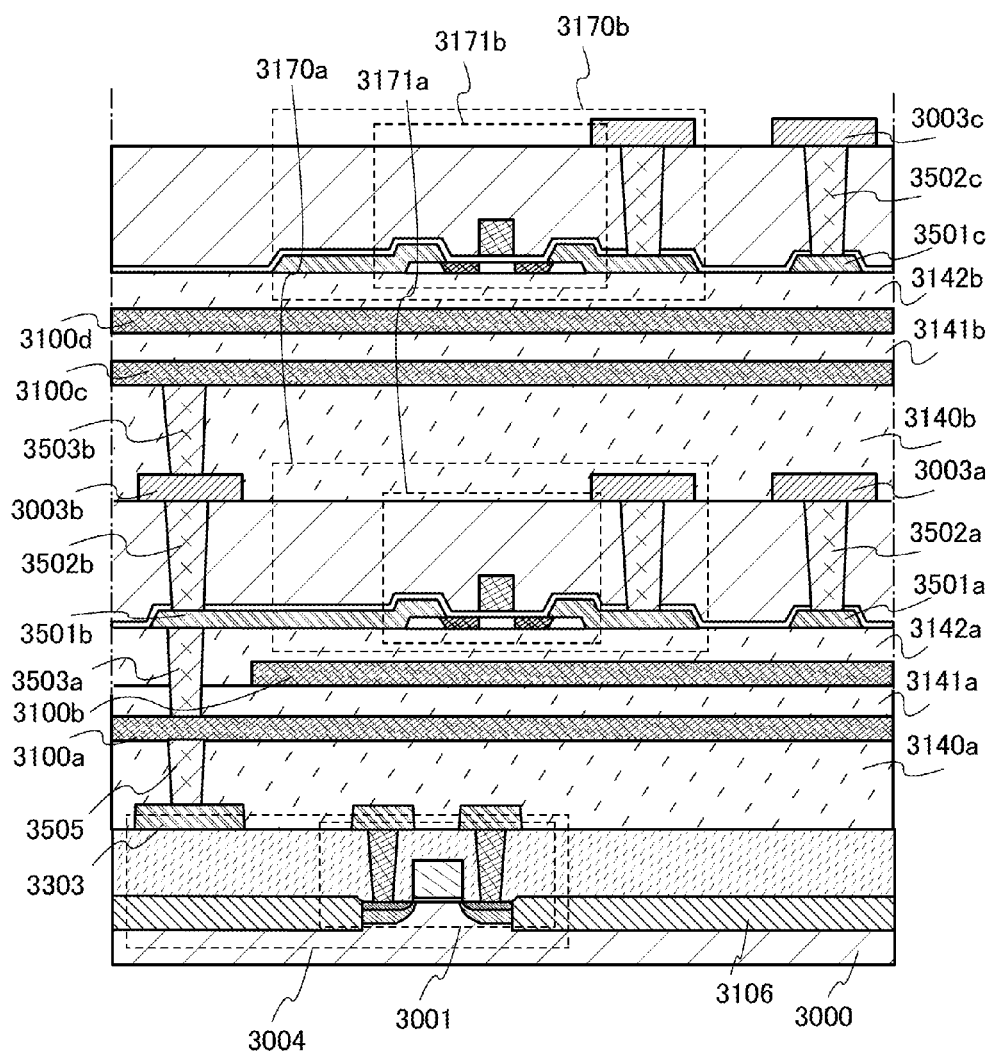
FIG. 10 is a cross-sectional view illustrating a structure of a storage device.
Figure 11:
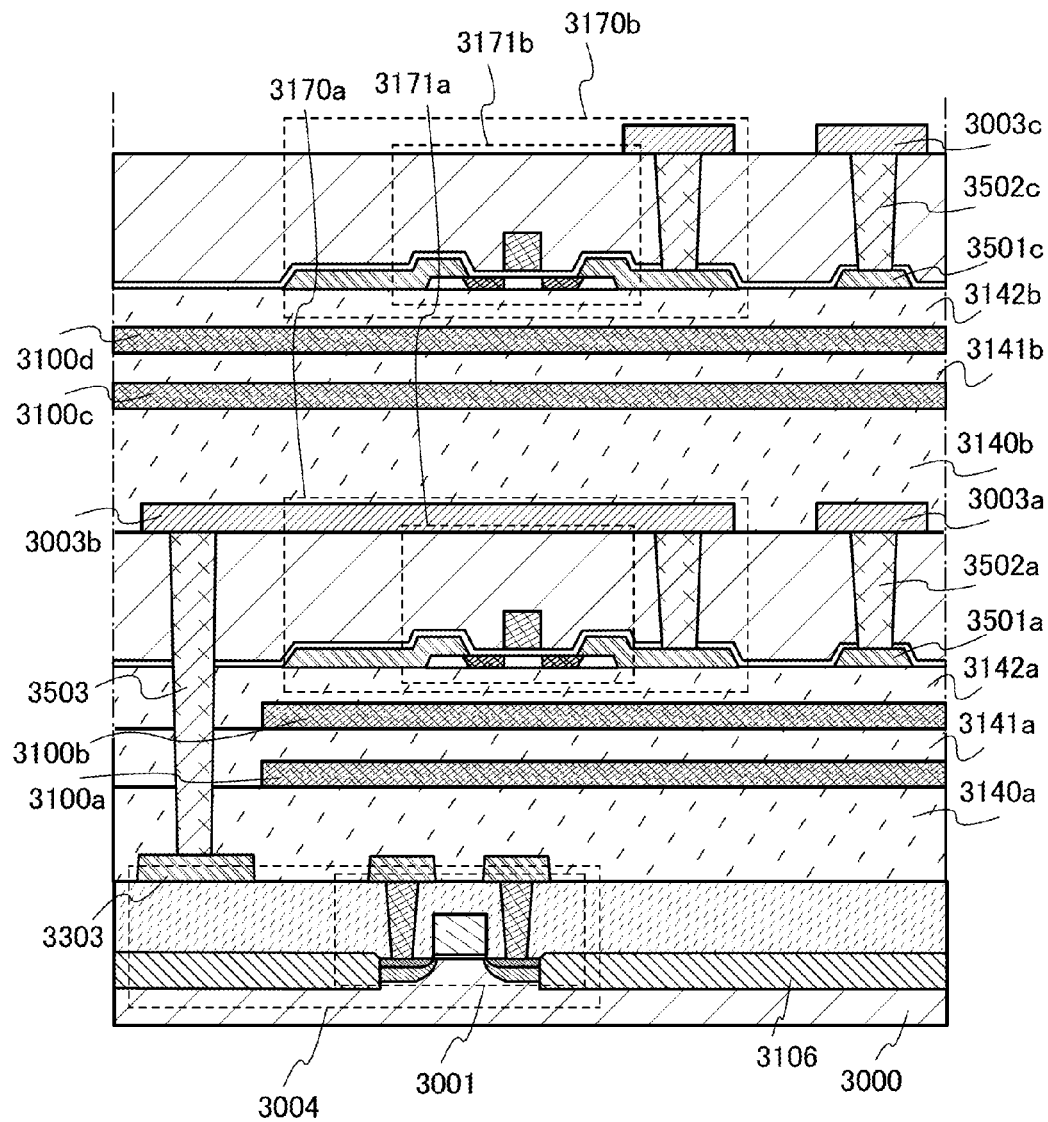
FIG. 11 is a cross-sectional view illustrating a structure of a storage device.

FIG. 10 and FIG. 11 are cross-sectional views of storage devices. Each of the storage devices illustrated in FIG. 10 and FIG. 11 includes a plurality of storage elements formed in multiple layers in an upper portion and a logic circuit 3004 in a lower portion. As examples of the plurality of storage elements, a storage element 3170a and a storage element 3170b are illustrated. For the storage element 3170a and the storage element 3170b, a configuration similar to that of the memory circuit 120 described in the above embodiment may be employed, for example.

Note that a transistor 3171a in the storage element 3170a is illustrated as a representative. A transistor 3171b in the storage element 3170b is illustrated as a representative. In each of the transistor 3171a and the transistor 3171b, a channel formation region is formed in an oxide semiconductor layer. One of or both the transistor 3171a and the transistor 3171b are used as the first transistor 101 described above.

Note that the transistor 3171a and the transistor 3171b in FIG. 10 and FIG. 11 each have a structure similar to that of the transistor 901 in FIG. 9A; however, one embodiment of the disclosed invention is not limited thereto. The structures of the transistor 3171a and the transistor 3171b in FIG. 10 and FIG. 11 may each be similar to any of the structures of the first transistor 101 in FIG. 5B, the first transistor 101 in FIG. 5C, the transistor 911 in FIG. 9B, the transistor 921 in FIG. 9C, and the transistor 941 in FIG. 9D. The structure of the transistor in which a channel formation region is formed in an oxide semiconductor layer is similar to the structure described in any of the above embodiments; thus, description thereof will be omitted.

An electrode 3501a which is formed in the same layer as source and drain electrodes of the transistor 3171a is electrically connected to an electrode 3003a through an electrode 3502a. An electrode 3501c which is formed in the same layer as source and drain electrodes of the transistor 3171b is electrically connected to an electrode 3003c through an electrode 3502c.

The logic circuit 3004 includes a transistor 3001 in which a semiconductor material other than an oxide semiconductor is used for a channel formation region. The transistor 3001 can be a transistor obtained in such a manner that an element separation insulating film 3106 is provided over a substrate 3000 including a semiconductor material (e.g., silicon) and a region serving as the channel formation region is formed in a region surrounded by the element separation insulating film 3106. Note that the transistor 3001 may be a transistor obtained in such a manner that the channel formation region is formed in a semiconductor film such as a silicon film formed on an insulating surface or in a silicon film of an SOI substrate. Description of the transistor 3001 is omitted because a known structure can be used.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed. An insulating film 3141a is provided between the wiring 3100a and the wiring 3100b. An insulating film 3142a is provided between the wiring 3100b and the layers in which the transistor 3171a is formed.

Similarly, a wiring 3100c and a wiring 3100d are formed between layers in which the transistor 3171b is formed and the layers in which the transistor 3171a is formed. An insulating film 3140b is provided between the wiring 3100c and the layers in which the transistor 3171a is formed. An insulating film 3141b is provided between the wiring 3100c and the wiring 3100d. An insulating film 3142b is provided between the wiring 3100d and the layers in which the transistor 3171b is formed.

The insulating films 3140a, 3141a, 3142a, 3140b, 3141b, and 3142b each function as an interlayer insulating film whose surface can be planarized.

Through the wiring 3100a, the wiring 3100b, the wiring 3100c, and the wiring 3100d, electrical connection between the storage elements, electrical connection between the logic circuit 3004 and the storage element, and the like can be established.

An electrode 3303 included in the logic circuit 3004 can be electrically connected to a circuit provided in the upper portion.

For example, as illustrated in FIG. 10, the electrode 3303 can be electrically connected to the wiring 3100a through an electrode 3505. The wiring 3100a can be electrically connected to an electrode 3501b through an electrode 3503a. In this manner, the wiring 3100a and the electrode 3303 can be electrically connected to the source or the drain of the transistor 3171a. In addition, the electrode 3501b can be electrically connected to an electrode 3003b through an electrode 3502b. The electrode 3003b can be electrically connected to the wiring 3100c through an electrode 3503b.

FIG. 10 illustrates an example in which the electrode 3303 and the transistor 3171a are electrically connected to each other through the wiring 3100a; however, one embodiment of the disclosed invention is not limited thereto. The electrode 3303 may be electrically connected to the transistor 3171a through either the wiring 3100b or the wiring 3100a and the wiring 3100b. Further, as illustrated in FIG. 11, the electrode 3303 and the transistor 3171a may be electrically connected to each other through neither the wiring 3100a nor the wiring 3100b. In FIG. 11, the electrode 3303 is electrically connected to the electrode 3003b through an electrode 3503. The electrode 3003b is electrically connected to the source or the drain of the transistor 3171a. In this manner, the electrode 3303 can be electrically connected to the transistor 3171a.

Note that FIG. 10 and FIG. 11 each illustrate an example in which the two storage elements (the storage element 3170a and the storage element 3170b) are stacked; however, the number of stacked storage elements is not limited to two.

FIG. 10 and FIG. 11 each illustrate an example where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer or three or more wiring layers may be provided between the layers in which the transistor 3171a is formed and the layers in which the transistor 3001 is formed.

FIG. 10 and FIG. 11 each illustrate an example where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the number of wiring layers provided therebetween is not limited to two. One wiring layer or three or more wiring layers may be provided between the layers in which the transistor 3171b is formed and the layers in which the transistor 3171a is formed.

This embodiment can be implemented in appropriate combination with any of the other embodiments.

Embodiment 4

In this embodiment, a structure of a storage device including a plurality of the storage devices 130 or the storage devices 100 which is described in Embodiment 1 will be described.

Figure 12A:
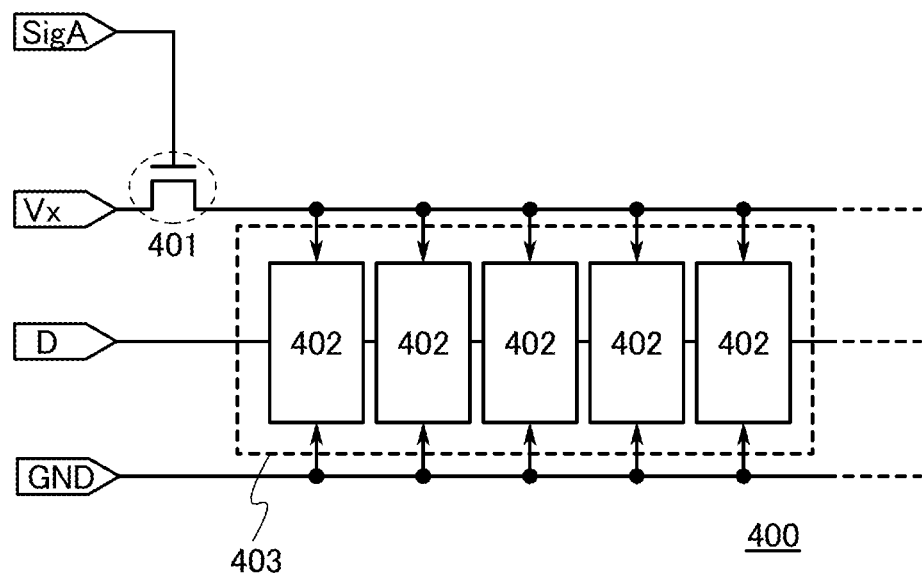
FIGS. 12A and 12B are diagrams illustrating structures of storage devices.

FIG. 12A illustrates an example of a structure of a storage device according to this embodiment. A storage device 400 illustrated in FIG. 12A includes a switching element 401 and a storage element group 403 including a plurality of storage elements 402. Specifically, as each of the storage elements 402, the storage device 100 or 130 whose structure is described in Embodiment 1 can be used. The source voltage Vx which is a high power supply potential is applied to each of the storage elements 402 included in the storage element group 403 through the switching element 401. Further, the potential of the data signal D and a low power supply potential (e.g., the ground potential GND) are supplied to each of the storage elements 402 included in the storage element group 403.

In FIG. 12A, a transistor is used for the switching element 401, and the switching of the transistor is controlled with a control signal Sig A input to a gate electrode thereof.

Note that FIG. 12A illustrates a structure in which the switching element 401 includes only one transistor; however, the disclosed invention is not limited to this structure. In one embodiment of the disclosed invention, the switching element 401 may include a plurality of transistors. In the case where the switching element 401 includes a plurality of transistors which serve as switching elements, the plurality of transistors may be electrically connected to each other in parallel, in series, or in combination of parallel connection and serial connection.

Figure 12B:
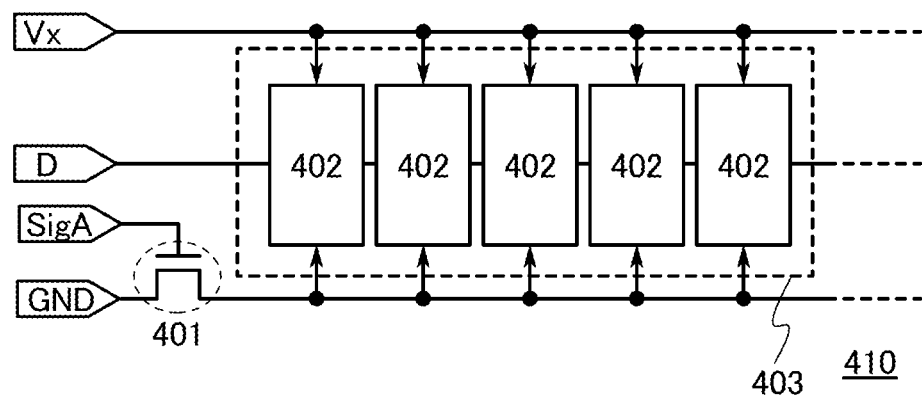

Although the switching element 401 controls the application of the source voltage Vx which is a high power supply potential to each of the storage elements 402 included in the storage element group 403 in FIG. 12A, the switching element 401 may control the supply of a low power supply potential (e.g., the ground potential GND). FIG. 12B illustrates a storage device 410 in which a low power supply potential (e.g., the ground potential GND) is supplied to each of the storage elements 402 included in the storage element group 403 through the switching element 401. In the storage device 410 in FIG. 12B, the switching element 401 can control the supply of a low power supply potential (e.g., the ground potential GND) to each of the storage elements 402 included in the storage element group 403.

This embodiment can be implemented in appropriate combination with any of the other embodiments.

Embodiment 5

In this embodiment, a structure of a signal processing circuit including the storage device described in the above embodiment will be described.

Figure 13:
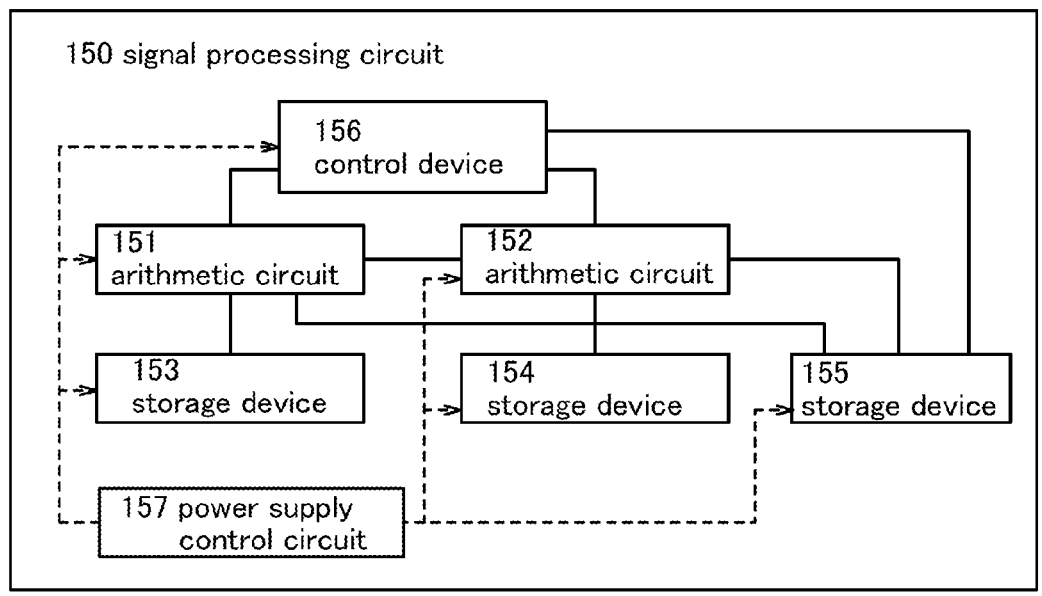
FIG. 13 is a block diagram of a signal processing circuit.

FIG. 13 illustrates an example of a signal processing circuit according to this embodiment. The signal processing circuit includes, at least, one or a plurality of arithmetic circuits and one or a plurality of storage devices. Specifically, a signal processing circuit 150 illustrated in FIG. 13 includes an arithmetic circuit 151, an arithmetic circuit 152, a storage device 153, a storage device 154, a storage device 155, a control device 156, and a power supply control circuit 157.

The arithmetic circuits 151 and 152 each include, as well as a logic circuit which carries out simple logic arithmetic processing, an adder, a multiplier, various arithmetic circuits, and the like. The storage device 153 functions as a register for temporarily holding data when the arithmetic processing is carried out in the arithmetic circuit 151. The storage device 154 functions as a register for temporarily holding data when the arithmetic processing is carried out in the arithmetic circuit 152.

In addition, the storage device 155 can be used as a main memory and can store a program executed by the control device 156 as data or can store data from the arithmetic circuit 151 and the arithmetic circuit 152.

The control device 156 is a circuit which performs centralized control of operations of the arithmetic circuit 151, the arithmetic circuit 152, the storage device 153, the storage device 154, and the storage device 155 which are included in the signal processing circuit 150. Note that although FIG. 13 illustrates a configuration in which the control device 156 is provided in the signal processing circuit 150 as a part thereof, the control device 156 may be provided outside the signal processing circuit 150.

When the storage device 130 or 100 described in Embodiment 1 or the storage device 400 or 410 described in Embodiment 4 is used for the storage device 153, the storage device 154, and the storage device 155, data can be held even when the application of source voltage to the storage device 153, the storage device 154, and the storage device 155 is stopped. In the above manner, the application of the source voltage to the entire signal processing circuit 150 can be stopped, whereby power consumption can be suppressed. Alternatively, the application of the source voltage to one or more of the storage device 153, the storage device 154, and the storage device 155 can be stopped, whereby power consumed by the signal processing circuit 150 can be reduced. In addition, after the application of the source voltage is resumed, the signal processing circuit 150 can return to the state which is the same as that before the supply of the source voltage is stopped, in a short time.

In addition, as well as the application of the source voltage to the storage device, the application of the source voltage to the control circuit or the arithmetic circuit which transmits/receives data to/from the storage device may be stopped. For example, when the arithmetic circuit 151 and the storage device 153 are not operated, the application of the source voltage to the arithmetic circuit 151 and the storage device 153 may be stopped.

In addition, the power supply control circuit 157 controls the level of the source voltage which is supplied to the arithmetic circuit 151, the arithmetic circuit 152, the storage device 153, the storage device 154, the storage device 155, and the control device 156 included in the signal processing circuit 150. Further, in the case where the application of the source voltage is stopped, a switching element for stopping the application of the source voltage may be provided for the power supply control circuit 157, or for each of the arithmetic circuit 151, the arithmetic circuit 152, the storage device 153, the storage device 154, the storage device 155, and the control device 156. In the latter case, the power supply control circuit 157 is not necessarily provided in the signal processing circuit according to this embodiment.

Note that a storage device which functions as a cache memory may be provided between the storage device 155 that is a main memory and each of the arithmetic circuit 151, the arithmetic circuit 152, and the control device 156. Provision of the cache memory allows reduction of low-speed accesses to the main memory, so that the speed of the signal processing such as arithmetic processing can be increased. The use of the above storage element also for the storage device functioning as a cache memory leads to reduction in power consumption of the signal processing circuit 150. In addition, after the application of the source voltage is resumed, the signal processing circuit 150 can return to the state which is the same as that before the source voltage is stopped, in a short time.

This embodiment can be implemented in appropriate combination with any of the other embodiments.

Embodiment 6

In this embodiment, description will be given of a configuration of a central processing unit (CPU) which is one of signal processing circuits according to one embodiment of the disclosed invention.

Figure 14:
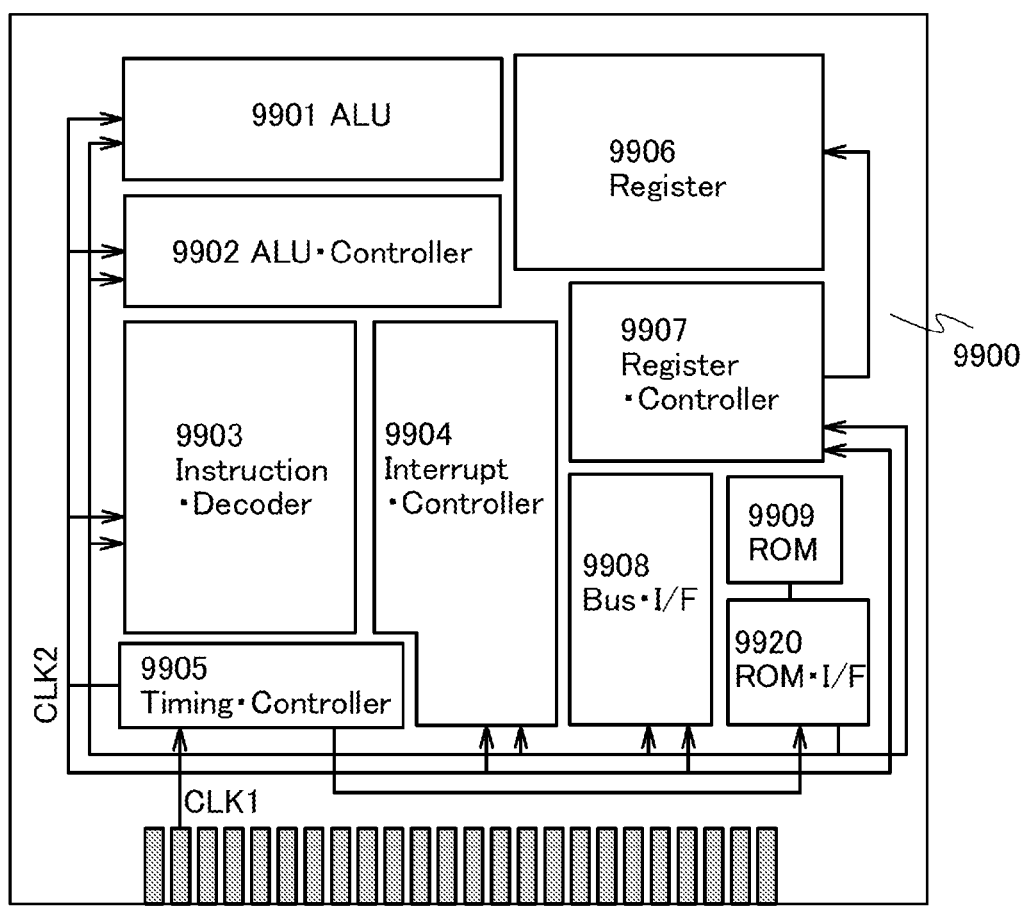
FIG. 14 is a block diagram of a CPU including a storage device.

FIG. 14 illustrates the configuration of the CPU according to this embodiment. The CPU illustrated in FIG. 14 mainly includes, over a substrate 9900, an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920. The ROM 9909 and the ROM I/F 9920 may be provided over another chip. It is needless to say that the CPU in FIG. 14 is only an example in which the configuration is simplified, and actual CPUs have various configurations depending on the application.

An instruction input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit depending on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, a storage device having the structure described in any of the above embodiments is provided in the register 9906. The register controller 9907 determines, in response to an instruction from the ALU 9901, which of the storage circuit 120 and the storage circuit 121 holds data in the storage device in the register 9906. When data retention by a feedback loop of a phase inversion element is selected, source voltage is supplied to the storage device in the register 9906. When data retention in a storage capacitor is selected, the application of source voltage to the storage device in the register 9906 can be stopped. When a switching element is provided between a storage element group and a node to which a high power supply potential or a low power supply potential is supplied, as illustrated in FIG. 12A or FIG. 12B, it is possible to stop the supply of power.

In such a manner, even in the case where the operation of the CPU is temporarily stopped and the application of the source voltage is stopped, data can be held and power consumption can be reduced. Specifically, for example, while a user of a personal computer does not input data to an input device such as a keyboard, the operation of a CPU can be stopped, so that the power consumption can be reduced.

Although the CPU is described as an example in this embodiment, the signal processing circuit according to one embodiment of the disclosed invention is not limited to the CPU and can be applied to an LSI such as a microprocessor, an image processing circuit, a digital signal processor (DSP), or a field programmable gate array (FPGA).

This embodiment can be implemented in appropriate combination with any of the other embodiments.

Embodiment 7

With the use of a signal processing circuit according to one embodiment of the disclosed invention, an electronic device with low power consumption can be provided. Particularly in the case of a portable electronic device which has difficulty in continuously receiving power, addition of a signal processing circuit with low power consumption according to one embodiment of the disclosed invention as a component of the device makes it possible to obtain an advantage of increasing the continuous operation time. Further, with the use of a transistor with a low off-state current, redundant circuit design which is needed to compensate for a high off-state current is unnecessary; therefore, the integration degree of the signal processing circuit can be increased, and the signal processing circuit can have higher functionality.

A signal processing circuit according to one embodiment of the disclosed invention can be used for a display device, a personal computer, or an image reproducing device provided with recording media (typically, a device which reproduces the content of recording media such as a digital versatile disc (DVD) and has a display for displaying the reproduced image). Other examples of electronic devices each of which can be provided with a signal processing circuit, according to one embodiment of the disclosed invention, include a mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like.

The cases will be described in which a signal processing circuit according to one embodiment of the disclosed invention is applied to portable electronic devices such as a mobile phone, a smartphone, and an e-book reader.

Figure 6:
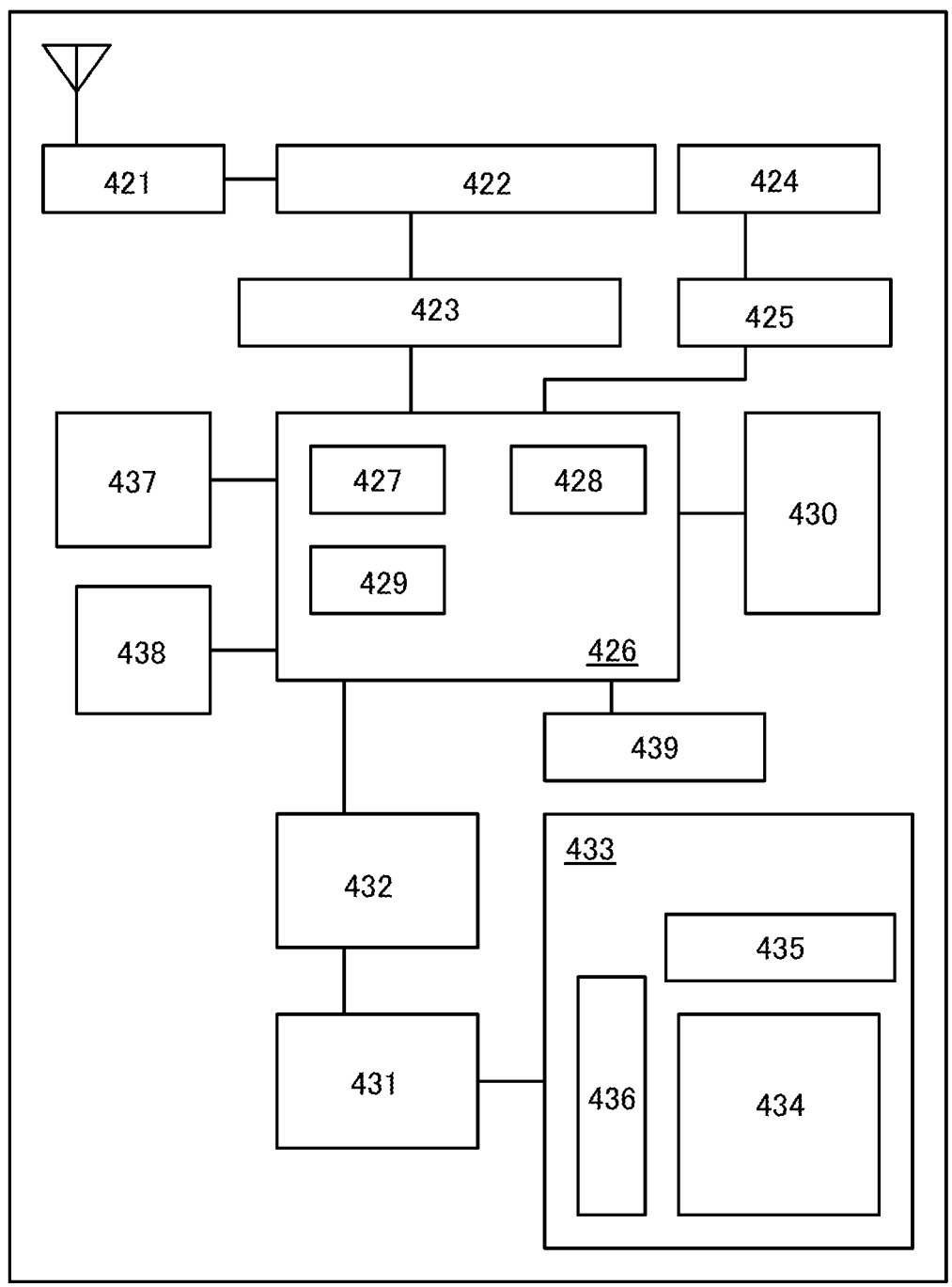
FIG. 6 is a block diagram of a portable electronic device.

FIG. 6 is a block diagram of a portable electronic device. The portable electronic device illustrated in FIG. 6 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. The use of the signal processing circuit described in the above embodiment for the CPU 427 allows reduction in power consumption. Although the memory circuit 432 generally includes an SRAM or a DRAM, when the storage device described in the above embodiment is used for the memory circuit 432, power consumption can be reduced.

Figure 7:
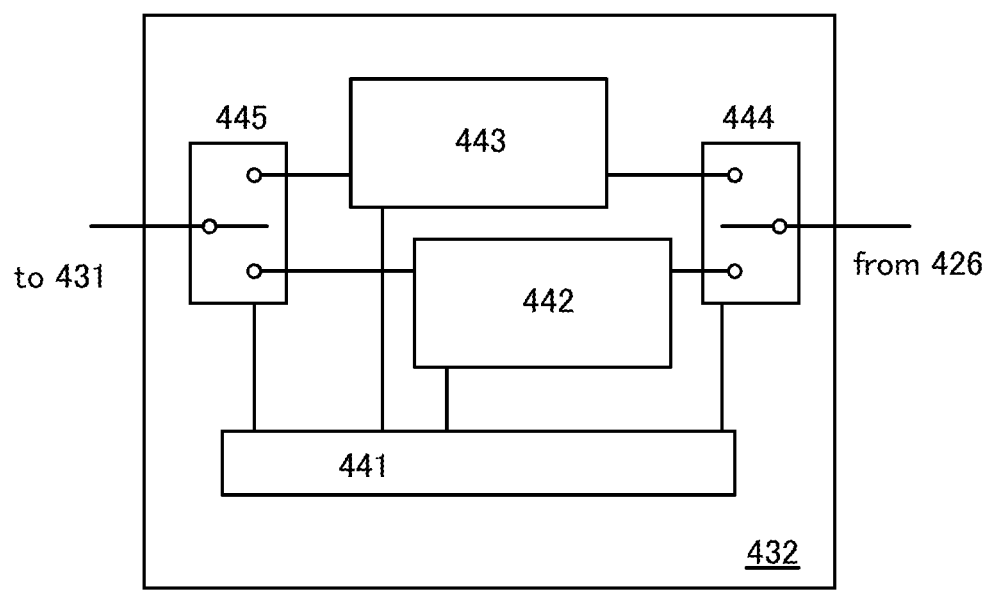
FIG. 7 is a block diagram of a memory circuit.

FIG. 7 is a block diagram illustrating a configuration of the memory circuit 432. The memory circuit 432 includes a storage device 442, a storage device 443, a switch 444, a switch 445, and a memory controller 441.

First, image data is received by the portable electronic device or is formed by the application processor 426. The image data is stored in the storage device 442 via the switch 444. The image data output via the switch 444 is sent to the display 433 via the display controller 431. The display 433 displays an image using the image data.

When a display image does not change as in the case of a still image, the image data read out from the storage device 442 continues to be sent to the display controller 431 via the switch 445, generally at a cycle of 30 Hz to 60 Hz. When a user performs switching of an image displayed on the display, the application processor 426 forms new image data and the image data is stored in the storage device 443 via the switch 444. Even when the new image data is stored in the storage device 443, image data is periodically read out from the storage device 442 via the switch 445.

When the storage of the new image data in the storage device 443 is completed, the new image data stored in the storage device 443 is read out and sent to the display 433 via the switch 445 and the display controller 431. The display 433 displays an image using the sent new image data.

The reading of the image data is continuously performed until next new image data is stored in the storage device 442. In this manner, the storage device 442 and the storage device 443 alternately perform writing and reading of image data, and the display 433 displays an image.

The storage device 442 and the storage device 443 are not necessarily different storage devices, and a memory region included in one storage device may be divided to be used. The use of the storage device described in the above embodiment is used for these storage devices makes it possible to reduce power consumption.

Figure 8:
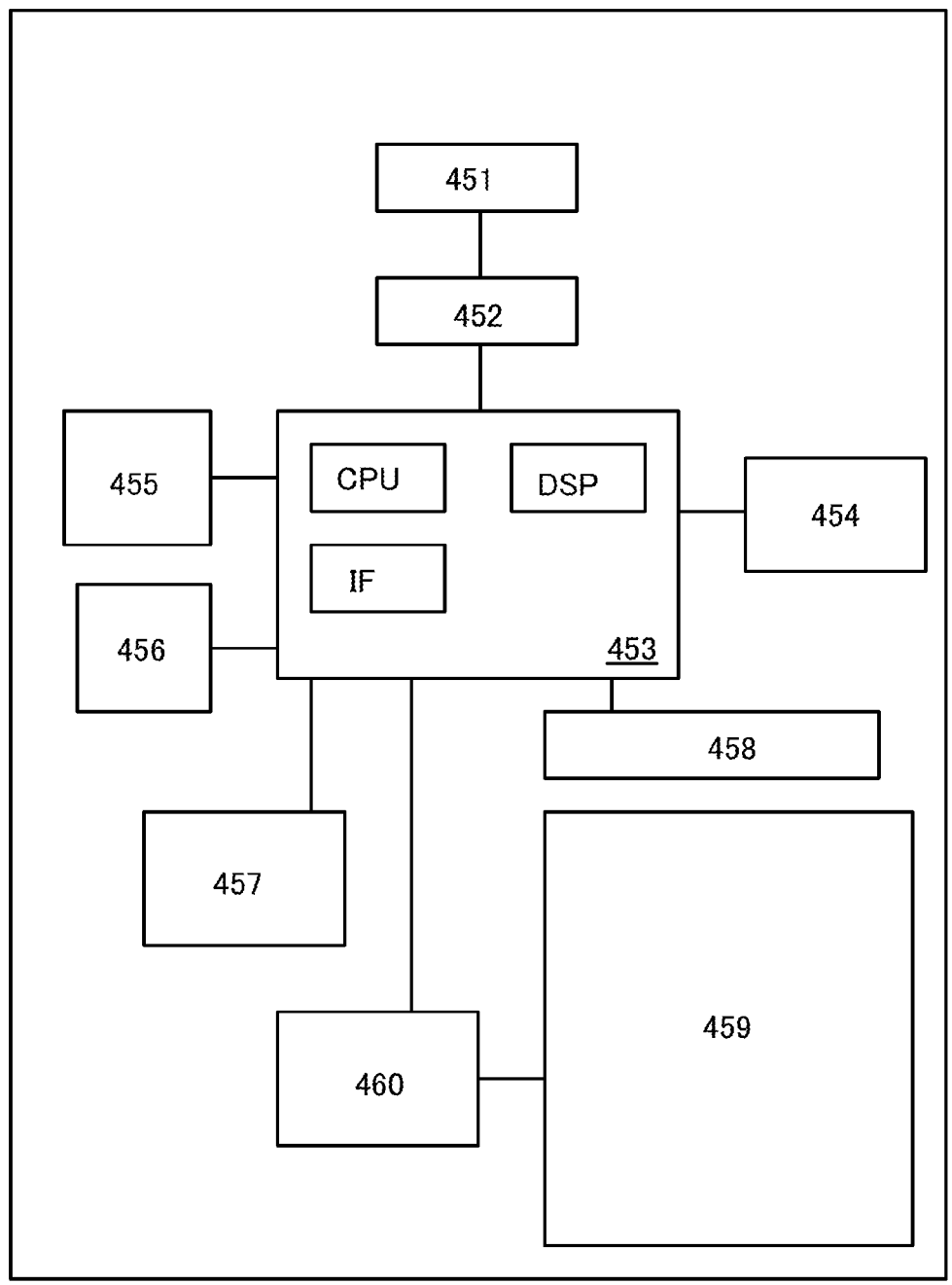
FIG. 8 is a block diagram of an e-book reader.

FIG. 8 is a block diagram of an e-book reader. The electronic book reader includes a battery 451, a power supply circuit 452, a microprocessor 453, a flash memory 454, an audio circuit 455, a keyboard 456, a memory circuit 457, a touch panel 458, a display 459, and a display controller 460. The use of the signal processing circuit described in the above embodiment for the microprocessor 453 allows reduction in power consumption. Further, the use of the storage device described in the above embodiment for the memory circuit 457 allows reduction in power consumption.

For example, when a user utilizes a function of highlighting for clarification of a difference between a specific portion and other portions in book data, for example, by changing the color of the specific portion, underlining, displaying letters with increased line widths, and changing the style of letters in the specific portion, the data of the portion specified by the user in the book data needs to be stored. The memory circuit 457 has a function of temporarily storing the data. Note that when the data is held for a long time, the data may be copied into the flash memory 454.

This embodiment can be implemented in appropriate combination with any of the other embodiments.

Embodiment 8

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically. In this embodiment, the field-effect mobility of an ideal oxide semiconductor without a defect inside the semiconductor is calculated theoretically, and calculation results of characteristics of minute transistors each of which is manufactured using such an oxide semiconductor are shown.

Assuming that the original mobility and the measured field-effect mobility of a semiconductor are $\mu_0$ and $\mu$, respectively, and a potential barrier (such as a grain boundary) exists in the semiconductor, the field-effect mobility $\mu$ can be expressed by the following equation.

$$\mu = \mu_0 \exp\left(-\frac{E}{kT}\right) \quad \text{[EQUATION 2]}$$

Here, E represents the height of the potential barrier, k represents the Boltzmann constant, and T represents the absolute temperature. When the potential barrier is assumed to be attributed to a defect, the height of the potential barrier can be expressed by the following equation according to the Levinson model.

$$E = \frac{e^2 N^2}{8\varepsilon n} = \frac{e^3 N^2 t}{8\varepsilon C_{ox} V_g} \qquad \text{[EQUATION 3]}$$

Here, e represents the elementary charge, N represents the average defect density per unit area in a channel, c represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed by the following equation.

$$I_d = \frac{W\mu V_g V_d C_{ox}}{L} \exp\left(-\frac{E}{kT}\right) \qquad \text{[EQUATION 4]}$$

Here, L represents the channel length and W represents the channel width, and L and W are each 10 μm here. In addition, $V_d$ represents the drain voltage (the voltage between a source and a drain). When dividing both sides of the above equation by $V_g$ and then taking logarithms of both sides, the following equation can be obtained.

$$\ln\left(\frac{I_d}{V_g}\right) = \qquad \text{[EQUATION 5]}$$
$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Equation 5 is a function of $V_g$. From Equation 5, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$—$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm²/Vs from Equation 2 and Equation 3. The measured mobility of an In—Sn—Zn-based oxide including a defect is approximately 40 cm²/Vs. However, assuming that no defect exists inside the semiconductor and at the interface between the semiconductor and an insulating layer, the mobility $\mu_0$ of the oxide semiconductor is expected to be 120 cm²/Vs.

Note that even when no defect exists inside a semiconductor, scattering at the interface between a channel and a gate insulating film affects the transport property of the transistor. In other words, the mobility $\mu_1$ at a position that is distance x away from the interface between the channel and the gate insulating film can be expressed by the following equation.

$$\frac{1}{\mu_1} = \frac{1}{\mu_0} + \frac{D}{B}\exp\left(-\frac{x}{G}\right) \qquad \text{[EQUATION 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage $V_g$ is increased), the second term of Equation 6 is increased and accordingly the mobility $\mu_1$ is decreased.

Figure 18:
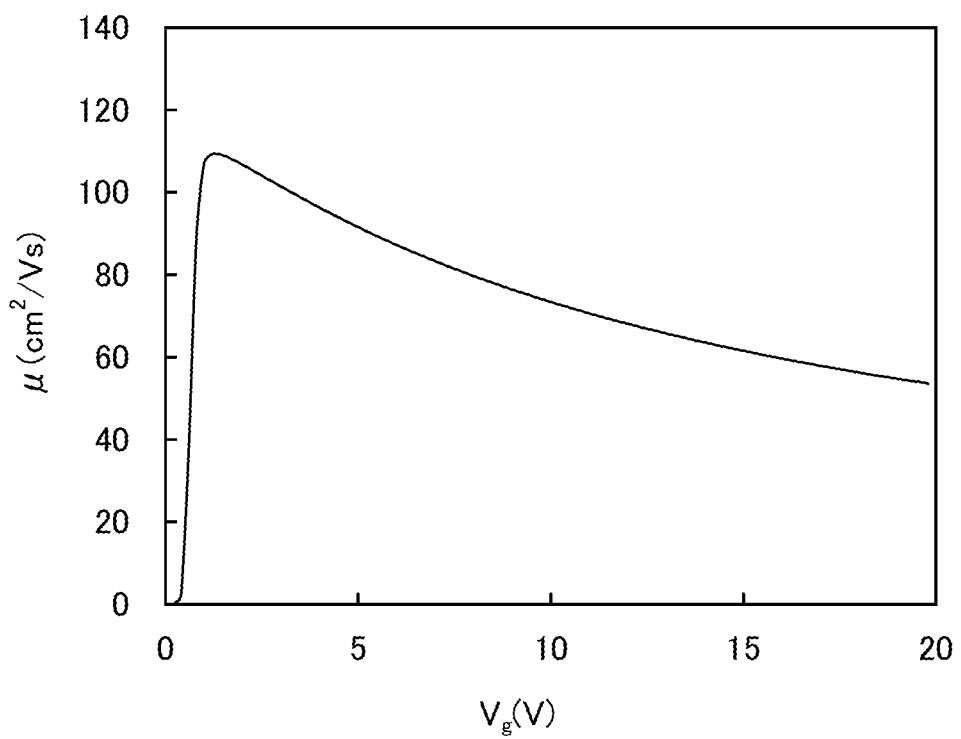
FIG. 18 is a graph showing gate voltage dependence of mobility, which is obtained by calculation.

Calculation results of the mobility $\mu_2$ of a transistor in which a channel includes an ideal oxide semiconductor without a defect inside the semiconductor are shown in FIG. 18. For the calculation, software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of more than 100 cm²/Vs at a gate voltage $V_g$ that is a little over 1 V and is decreased as the gate voltage $V_g$ becomes higher because the influence of interface scattering is increased. Note that in order to reduce interface scattering, it is preferable that a surface of the semiconductor layer be flat at the atomic level (atomic layer flatness).

Calculation results of characteristics of minute transistors which are manufactured using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation. The transistors illustrated in FIGS. 22A and 22B each include a semiconductor region 8103*a* and a semiconductor region 8103*c* which have n⁺-type conductivity in an oxide semiconductor layer. The resistivities of the semiconductor region 8103*a* and the semiconductor region 8103*c* are $2\times10^{-3}$ Ωcm.

The transistor illustrated in FIG. 22A is formed over a base insulating film 8101 and an embedded insulator 8102 which is embedded in the base insulating film 8101 and formed of aluminum oxide. The transistor includes the semiconductor region 8103*a*, the semiconductor region 8103*c*, an intrinsic semiconductor region 8103*b* serving as a channel formation region therebetween, and a gate electrode 8105. The width of the gate electrode 8105 is 33 nm.

A gate insulating film 8104 is formed between the gate electrode 8105 and the semiconductor region 8103*b*. In addition, a sidewall insulator 8106*a* and a sidewall insulator 8106*b* are formed on both side surfaces of the gate electrode 8105, and an insulator 8107 is formed over the gate electrode 8105 so as to prevent a short circuit between the gate electrode 8105 and another wiring. The sidewall insulator has a width of 5 nm A source electrode 8108*a* and a drain electrode 8108*b* are provided in contact with the semiconductor region 8103*a* and the semiconductor region 8103*c*, respectively. Note that the channel width of this transistor is 40 nm The transistor of FIG. 22B is the same as the transistor of FIG. 22A in that it is formed over the base insulating film 8101 and the embedded insulator 8102 formed of aluminum oxide and that it includes the semiconductor region 8103*a*, the semiconductor region 8103*c*, the intrinsic semiconductor region 8103*b* provided therebetween, the gate electrode 8105 having a width of 33 nm, the gate insulating film 8104, the sidewall insulator

8106*a*, the sidewall insulator 8106*b*, the insulator 8107, the source electrode 8108*a*, and the drain electrode 8108*b*.

The transistor illustrated in FIG. 22A is different from the transistor illustrated in FIG. 22B in the conductivity type of semiconductor regions under the sidewall insulator 8106*a* and the sidewall insulator 8106*b*. In the transistor illustrated in FIG. 22A, the semiconductor regions under the sidewall insulator 8106*a* and the sidewall insulator 8106*b* are part of the semiconductor region 8103*a* having n'-type conductivity and part of the semiconductor region 8103*c* having n'-type conductivity, whereas in the transistor illustrated in FIG. 22B, the semiconductor regions under the sidewall insulator 8106*a* and the sidewall insulator 8106*b* are parts of the intrinsic semiconductor region 8103*b*. In other words, in the semiconductor layer of FIG. 22B, a region having a width of $L_{off}$ which overlaps with neither the semiconductor region 8103*a* (the semiconductor region 8103*c*) nor the gate electrode 8105 is provided. This region is called an offset region, and the width $L_{off}$ is called an offset length. As is seen from FIGS. 22A and 22B, the offset length is equal to the width of the sidewall insulator 8106*a* (the sidewall insulator 8106*b*).

Figure 19A:
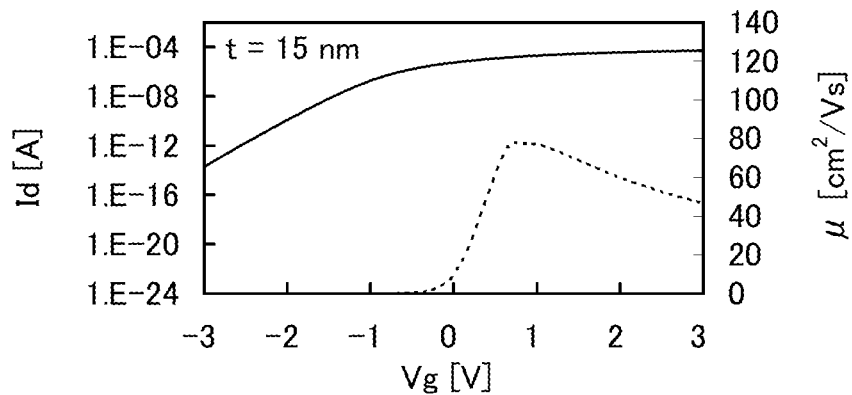
FIGS. 19A to 19C are graphs each showing gate voltage dependence of drain current and mobility, which is obtained by calculation.
Figure 19B:
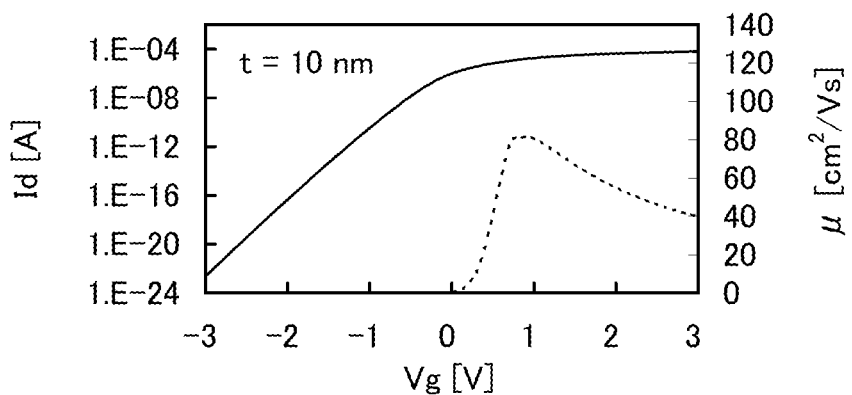
Figure 19C:
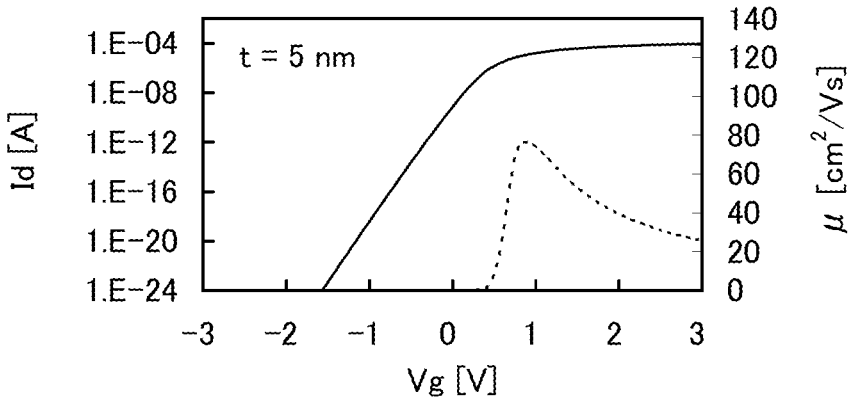

The other parameters used in calculation are as described above. For the calculation, software Sentaurus Device manufactured by Synopsys, Inc. was used. FIGS. 19A to 19C show the gate voltage ($V_g$: a potential difference between the gate and the source) dependence of the drain current ($I_d$, solid line) and the mobility GE, dotted line) of the transistor having the structure illustrated in FIG. 22A. The drain current $I_d$ is obtained by calculation under the assumption that the drain voltage (a potential difference between the drain and the source) is +1 V and the mobility t is obtained by calculation under the assumption that the drain voltage is +0.1 V.

FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm As the thickness of the gate insulating film is smaller, the drain current $I_d$ (off-state current) particularly in an off state is significantly decreased. In contrast, there is no noticeable change in the peak value of the mobility t and the drain current $I_d$ in an on state (on-state current).

Figure 20A:
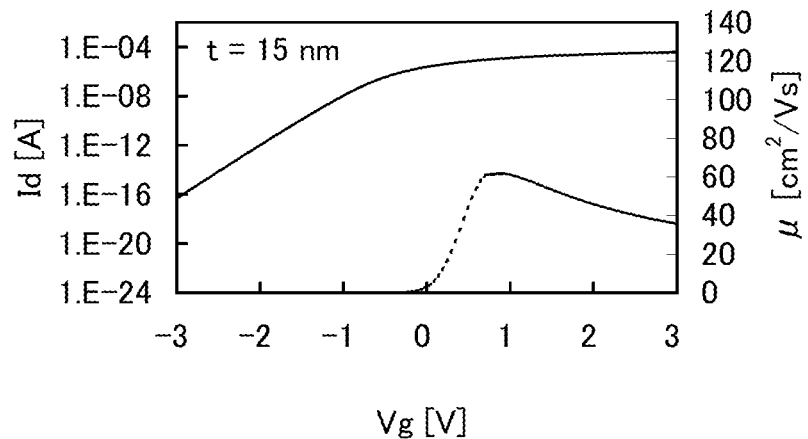
FIGS. 20A to 20C are graphs each showing gate voltage dependence of drain current and mobility, which is obtained by calculation.
Figure 20B:
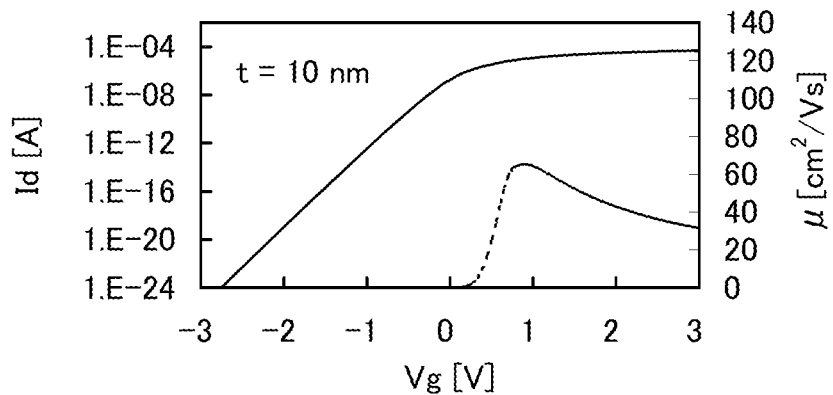
Figure 20C:
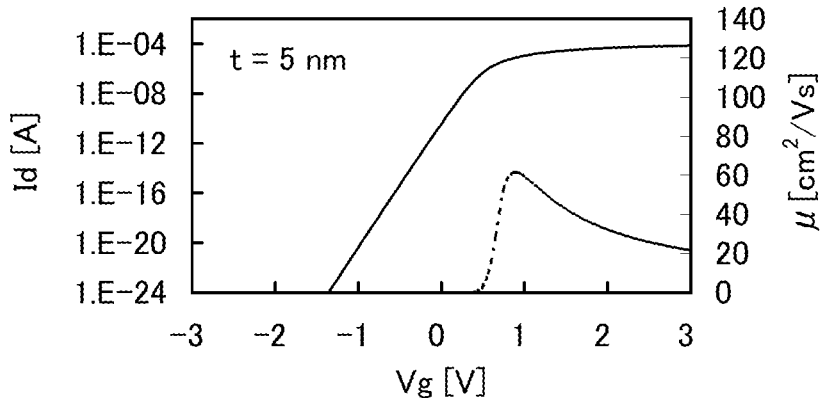

FIGS. 20A to 20C show the gate voltage $V_g$ dependence of the drain current $I_d$ (solid line) and the mobility t (dotted line) of the transistor having the structure illustrated in FIG. 22B where the offset length $L_{off}$ is 5 nm. The drain current $I_d$ is obtained by calculation under the assumption that the drain voltage is +1 V and the mobility t is obtained by calculation under the assumption that the drain voltage is +0.1 V. FIG. 20A shows the gate voltage dependence of the transistor in the case where the thickness of the gate insulating film is 15 nm, FIG. 20B shows that of the transistor in the case where the thickness of the gate insulating film is 10 nm, and FIG. 20C shows that of the transistor in the case where the thickness of the gate insulating film is 5 nm.

Figure 21A:
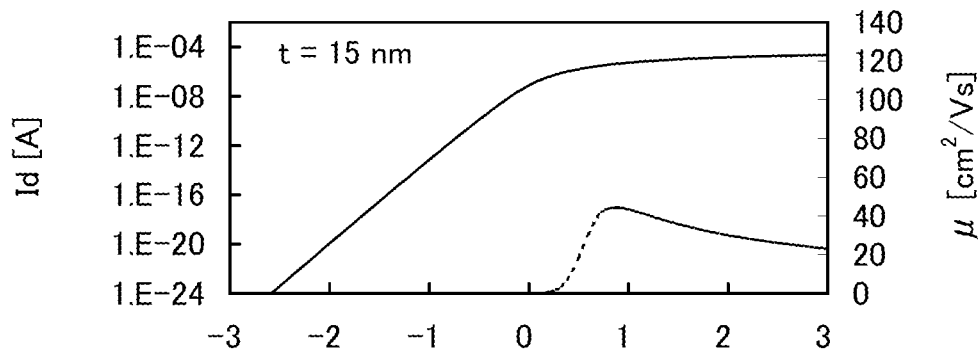
FIGS. 21A to 21C are graphs each showing gate voltage dependence of drain current and mobility, which is obtained by calculation.
Figure 21B:
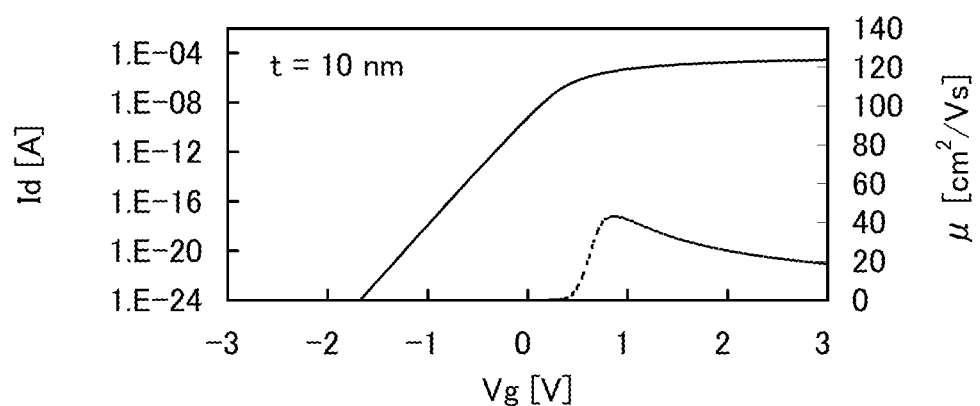
Figure 21C:
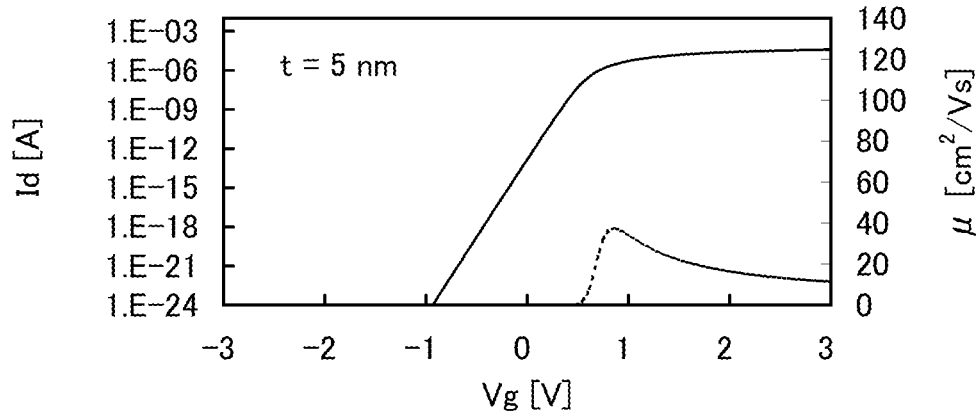
Figure 22A:
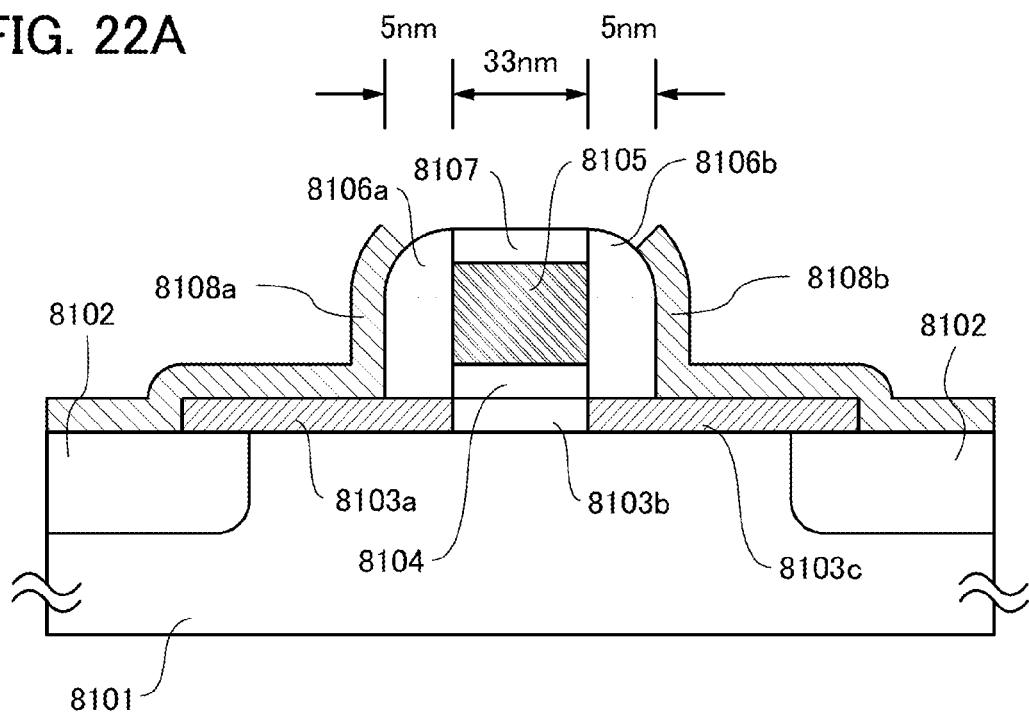
FIGS. 22A and 22B are diagrams illustrating cross-sectional structures of transistors used for calculation.
Figure 22B:
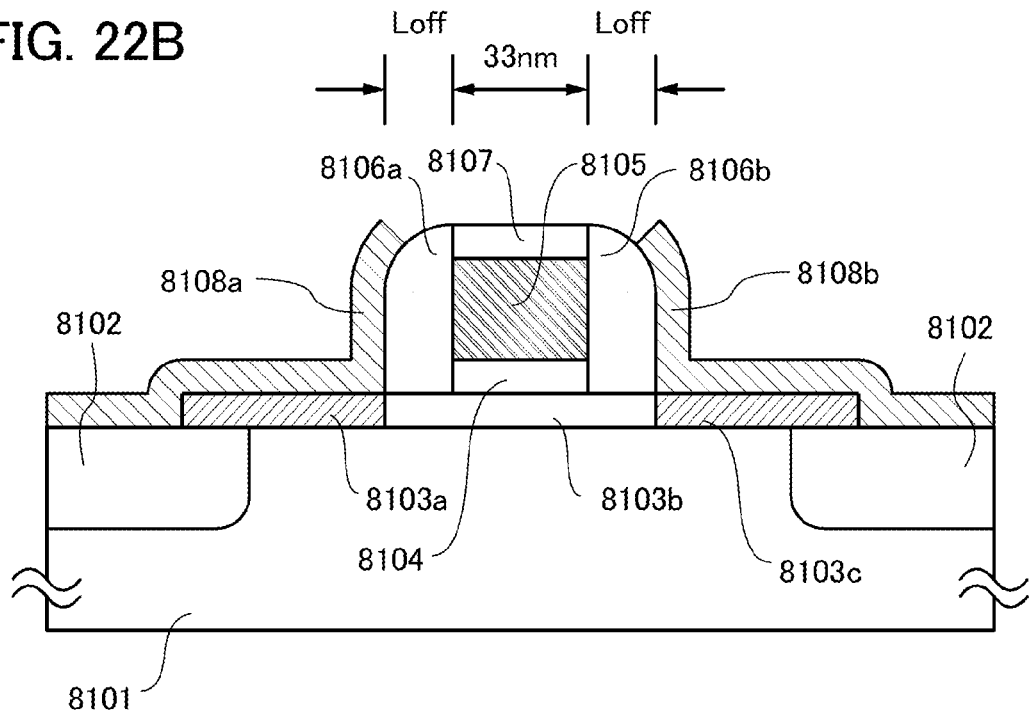

Further, FIGS. 21A to 21C show the gate voltage $V_g$ dependence of the drain current $I_d$ (solid line) and the mobility t (dotted line) of the transistor having the structure illustrated in FIG. 22B where the offset length $L_{off}$ is 15 nm. The drain current $I_d$ is obtained by calculation under the assumption that the drain voltage $V_d$ is +1 V and the mobility t is obtained by calculation under the assumption that the drain voltage $V_d$ is +0.1 V. FIG. 21A shows the gate voltage dependence of the transistor in the case where the thickness of the gate insulating film is 15 nm, FIG. 21B shows that of the transistor in the case where the thickness of the gate insulating film is 10 nm, and FIG. 21C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 19A to 19C, approximately 60 cm²/Vs in FIGS. 20A to 20C, and approximately 40 cm²/Vs in FIGS. 21A to 21C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

This embodiment can be implemented in appropriate combination with any of the other embodiments.

Embodiment 9

In this embodiment, a transistor in which an oxide semiconductor film containing In, Sn, and Zn as main components (an example of an In—Sn—Zn-based oxide semiconductor film) is used for a channel formation region will be described.

A transistor in which an oxide semiconductor film containing In, Sn, and Zn as main components is used for a channel formation region can have favorable characteristics by forming the oxide semiconductor film while heating a substrate or by performing heat treatment after the oxide semiconductor film is formed. Note that a main component refers to an element contained in a composition at 5 atomic % or more. Thus, in this embodiment, the case where the field-effect mobility of the transistor is improved by intentionally heating the substrate after formation of the oxide semiconductor film will be described with reference to FIGS. 23A to 23C, FIGS. 24A and 24B, FIGS. 25A and 25B, FIG. 26, FIG. 27, FIG. 28, and FIGS. 29A and 29B.

When the oxide semiconductor film containing In, Sn, and Zn as main components is formed while the substrate is intentionally heated, the field-effect mobility of the transistor can be improved. Further, the threshold voltage of the transistor can be positively shifted to make the transistor normally off.

Figure 23A:
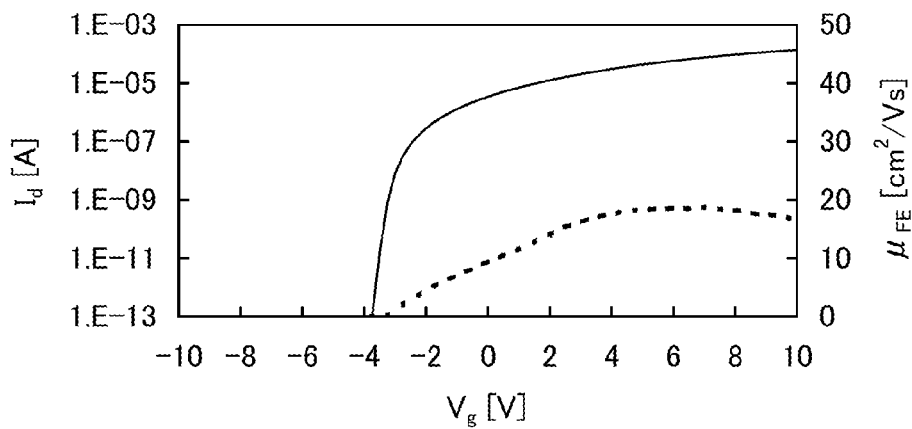
FIGS. 23A to 23C are graphs each showing gate voltage dependence of drain current and mobility of a transistor.
Figure 23B:
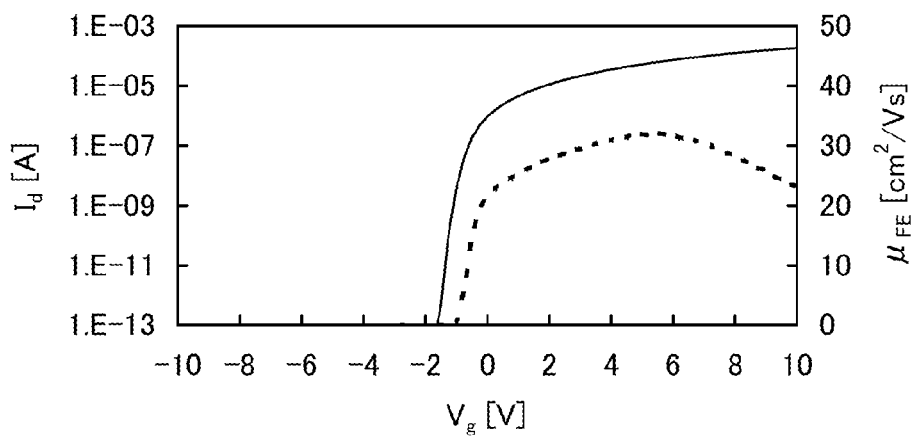
Figure 23C:
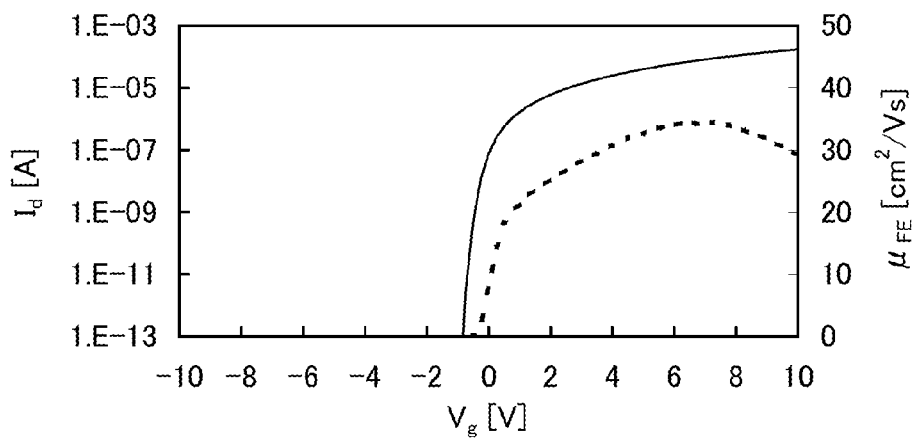

As an example, FIGS. 23A to 23C are graphs each showing electric characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

More specifically, FIGS. 23A to 23C each show the gate voltage $V_g$ dependence of the drain current $I_d$ (solid line) and the mobility μ (dotted line) of the transistor.

FIG. 23A is a graph showing electric characteristics of a transistor whose oxide semiconductor film containing In, Sn, and Zn as main components was formed by a sputtering method without heating a substrate intentionally. The field-effect mobility of the transistor is 18.8 cm²/Vs. On the other hand, when the oxide semiconductor film containing In, Sn, and Zn as main components is formed while heating the substrate intentionally, the field-effect mobility can be improved. FIG. 23B shows electric characteristics of a transistor whose oxide semiconductor film containing In, Sn, and Zn as main components was formed while heating a substrate at 200° C. The mobility of the transistor is 32.2 cm²/Vs.

The field-effect mobility can be further improved by performing heat treatment after formation of the oxide semiconductor film containing In, Sn, and Zn as main components.

FIG. 23C shows electric characteristics of a transistor whose oxide semiconductor film containing In, Sn, and Zn as main components was formed by a sputtering method at 200° C. and then subjected to heat treatment at 650° C. The field-effect mobility of the transistor is 34.5 cm$^2$/Vs.

The intentional heating of the substrate can reduce moisture taken into the oxide semiconductor film during the formation by a sputtering method. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor film can be crystallized by being highly purified by removal of impurities from the oxide semiconductor film. In the case of using such a highly purified non-single-crystal oxide semiconductor film, ideally, a field-effect mobility exceeding 100 cm$^2$/Vs is expected to be realized.

The oxide semiconductor film containing In, Sn, and Zn as main components may be crystallized in the following manner: oxygen ions are implanted into the oxide semiconductor film, hydrogen, a hydroxyl group, or moisture contained in the oxide semiconductor film is released by heat treatment, and the oxide semiconductor film is crystallized through the heat treatment or by another heat treatment performed later. By such crystallization treatment or recrystallization treatment, a non-single-crystal oxide semiconductor film having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a transistor can be normally off. In addition, an oxide semiconductor film having high crystallinity can be obtained when the composition ratio of a target is set as follows: In:Sn:Zn=2:1:3.

Further, in the case where an In—Sn—Zn-based oxide is formed, an oxide target which has a composition ration of In:Sn:Zn=1:2:2, 2:1:3, 1:1:1, 4:9:7, or the like in an atomic ratio is used.

The temperature of the intentional heating of the substrate or the temperature of the heat treatment is 150° C. or higher, preferably 200° C. or higher, more preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating films was 2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a positive BT test.

In a similar manner, first, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating films was −2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a negative BT test.

Figure 24A:
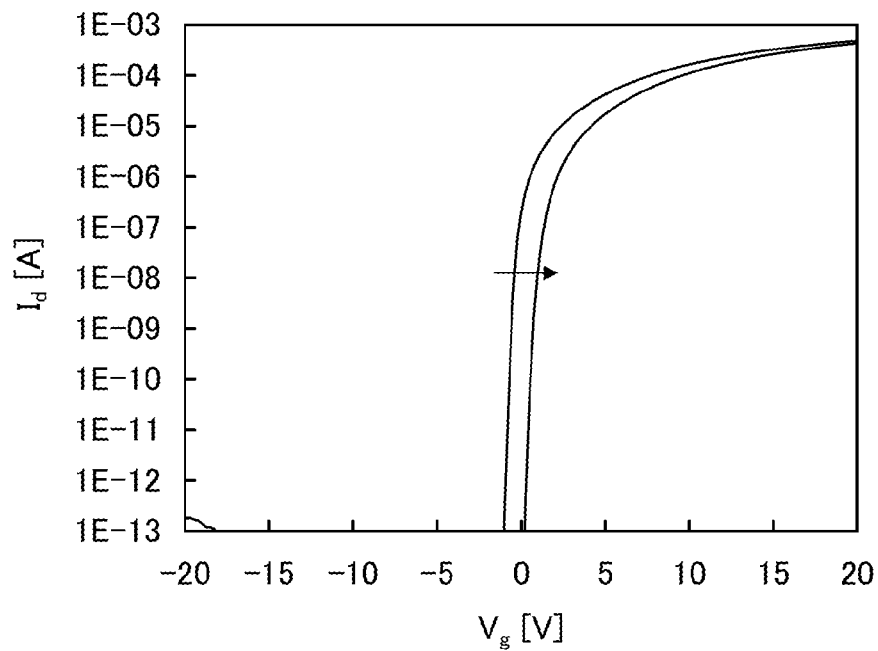
FIGS. 24A and 24B are graphs each showing $V_g$–$I_d$ characteristics after BT tests of a transistor of Sample 1.
Figure 24B:
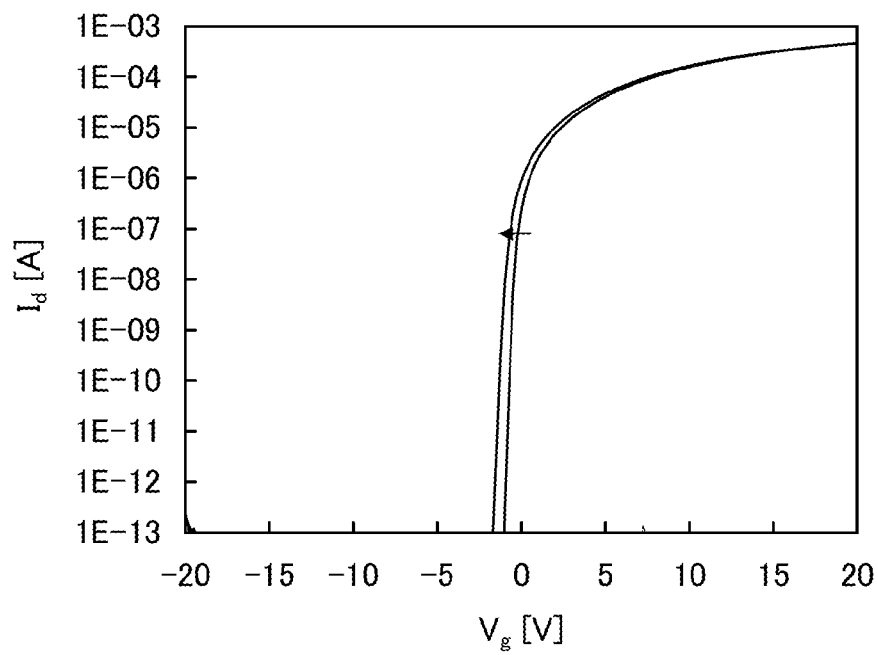
Figure 25A:
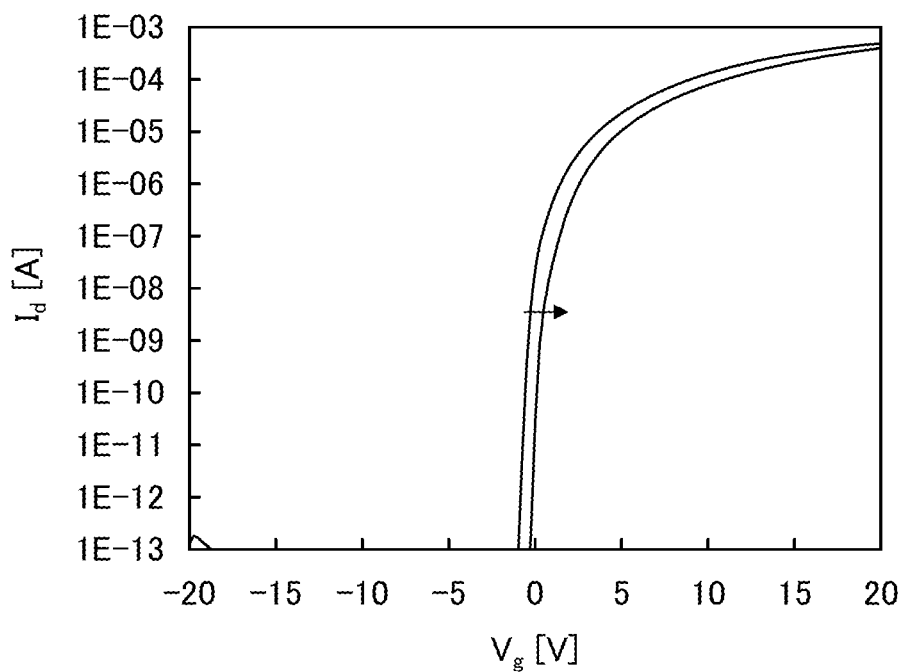
FIGS. 25A and 25B are graphs each showing $V_g$–$I_d$ characteristics after a BT test of a transistor of Sample 2.
Figure 25B:
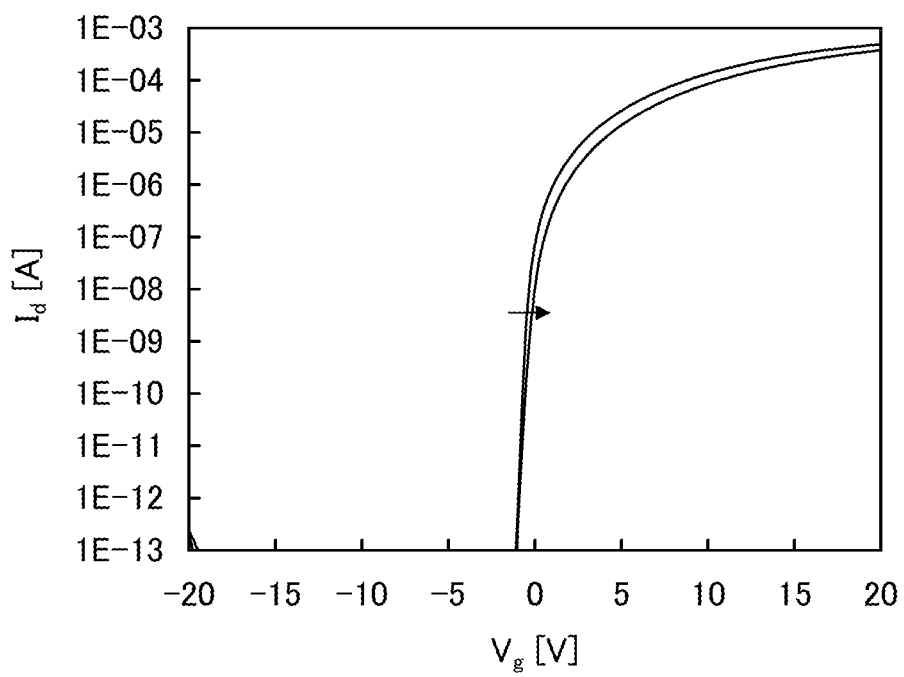

FIGS. 24A and 24B show a result of the positive BT test of Sample 1 and a result of the negative BT test of Sample 1, respectively. FIGS. 25A and 25B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively.

It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancies is easily caused in the oxide semiconductor or at the interface between the oxide semiconductor and a film in contact with the oxide semiconductor; however, when excess oxygen is contained in the oxide semiconductor by the heat treatment, oxygen vacancies caused constantly can be filled with excess oxygen. The excess oxygen is oxygen existing mainly between lattices. When the concentration of excess oxygen is set to higher than or equal to $1\times10^{16}$/cm$^3$ and lower than or equal to $2\times10^{20}$/cm$^3$, excess oxygen can be contained in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by a sputtering method using a target having a composition ratio of In:Sn:Zn=1:1:1 without heating a substrate intentionally is analyzed by X-ray diffraction (XRD), a halo pattern is observed.

The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. Methods for forming Sample A and Sample B will be described below.

An In—Sn—Zn-based oxide film with a thickness of 100 nm was formed over a quartz substrate subjected to dehydrogenation treatment.

The In—Sn—Zn-based oxide film was formed with a sputtering apparatus with a power of 100 W (DC) in an oxygen atmosphere. An In—Sn—Zn—O-based target with an atomic ratio of In:Sn:Zn=1:1:1 was used as a target. Note that the substrate heating temperature in film formation was set to 200° C. A sample formed in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 26:
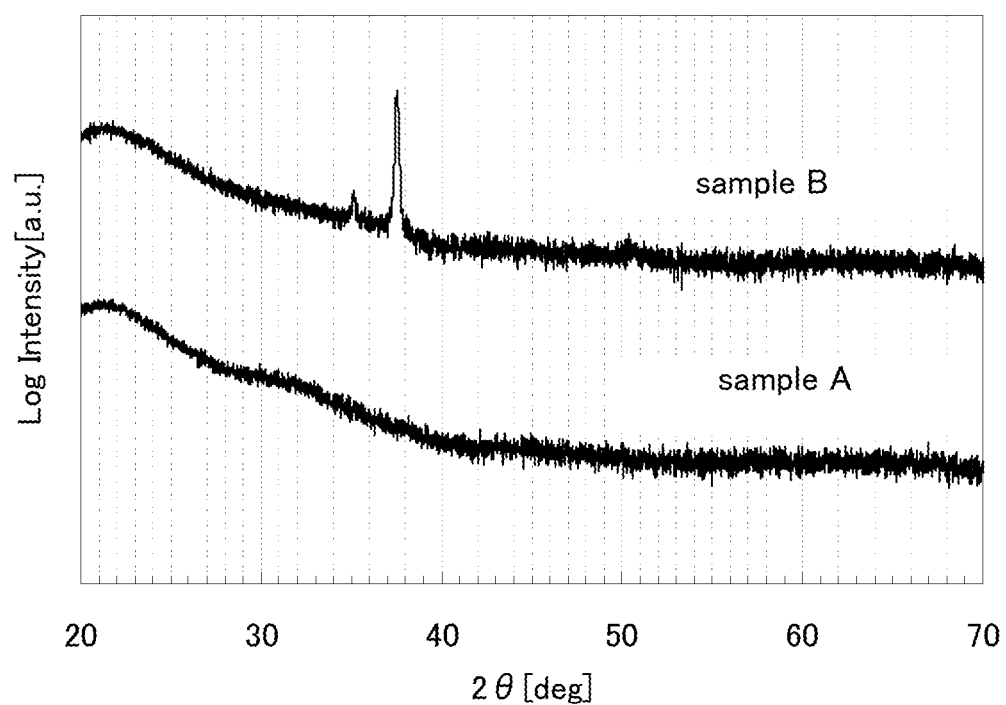
FIG. 26 is a graph showing XRD spectra of Sample A and Sample B.

FIG. 26 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by reducing hydrogen serving as a donor impurity from the oxide semiconductor, whereby a transistor can be normally off. The high purification of an oxide semiconductor enables the off-state current of the transistor to be 1 aA/μm or lower. Here, the unit of the off-state current is used to indicate current per micrometer in channel width.

Figure 27:
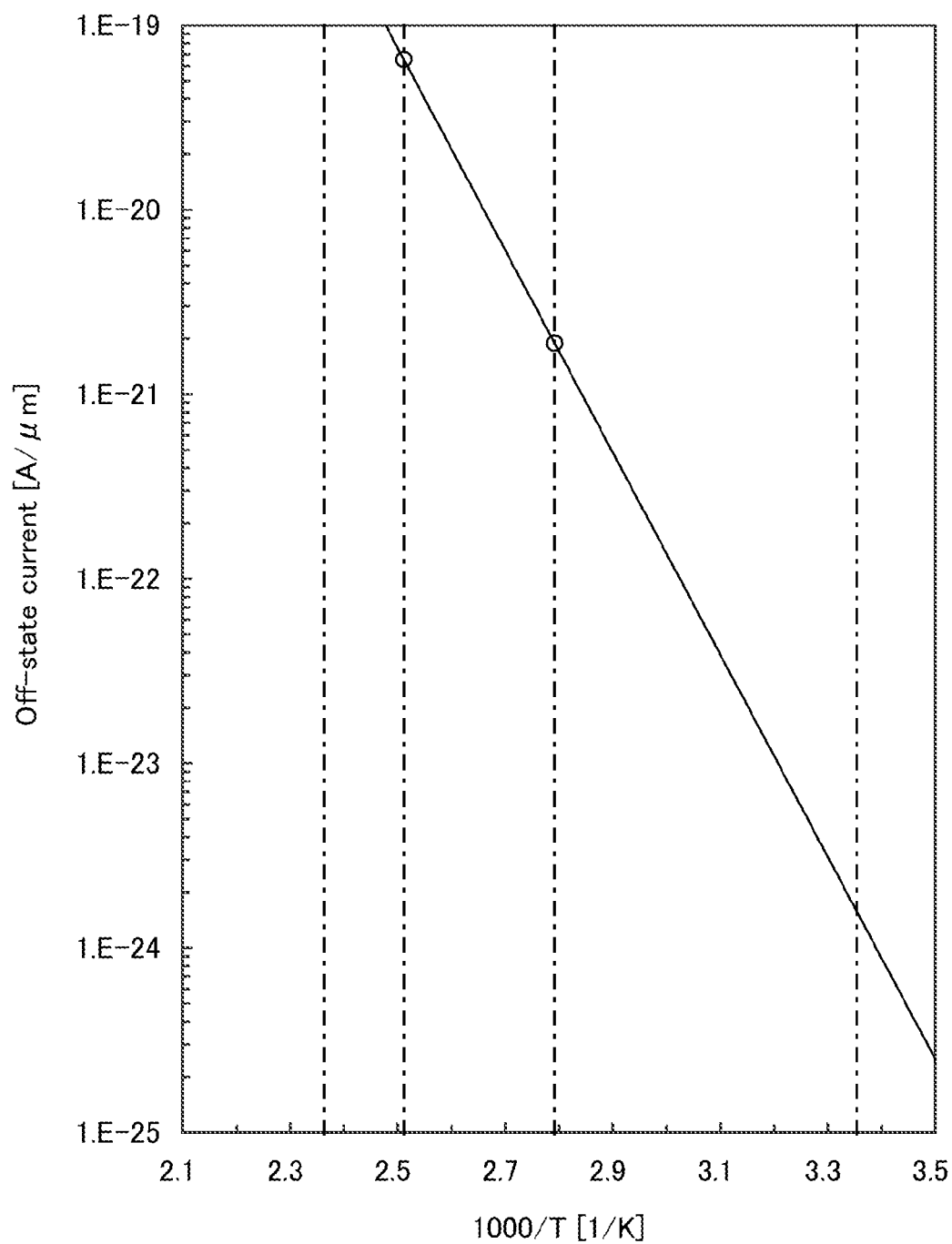
FIG. 27 is a graph showing the relation between the off-state current of a transistor and the substrate temperature in measurement.

FIG. 27 shows the relation between the off-state current of a transistor and the inverse of substrate temperature (absolute temperature) at measurement of the off-state current. In FIG. 27, the horizontal axis represents a value (1000/T) obtained by multiplying an inverse of substrate temperature at measurement by 1000, for the sake of simplicity.

As shown in FIG. 27, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

In order to prevent hydrogen and moisture from being contained in the oxide semiconductor film during formation thereof, it is naturally preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being contained in the film. In addition, it is preferable to use a target which is highly purified so as not to contain impurities such as hydrogen and moisture. Although it is possible to remove moisture from a film of an oxide semiconductor containing In, Sn, and Zn as main components by heat treatment, a film which does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. In the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 28:
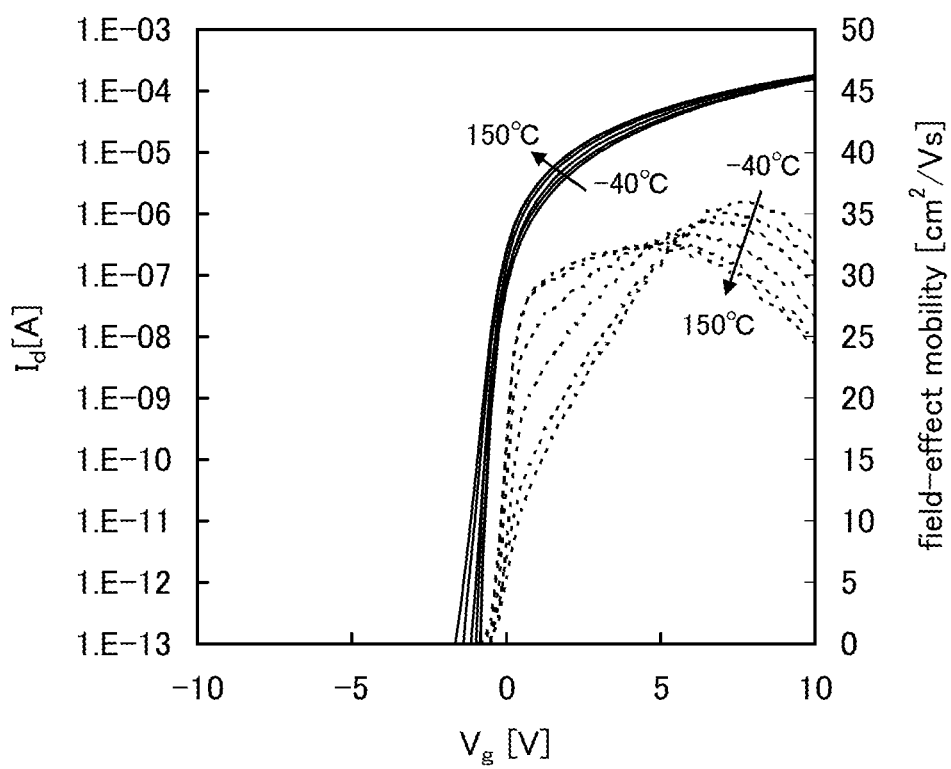
FIG. 28 is a graph showing $V_g$ dependence of $I_d$ and field-effect mobility.
Figure 29A:
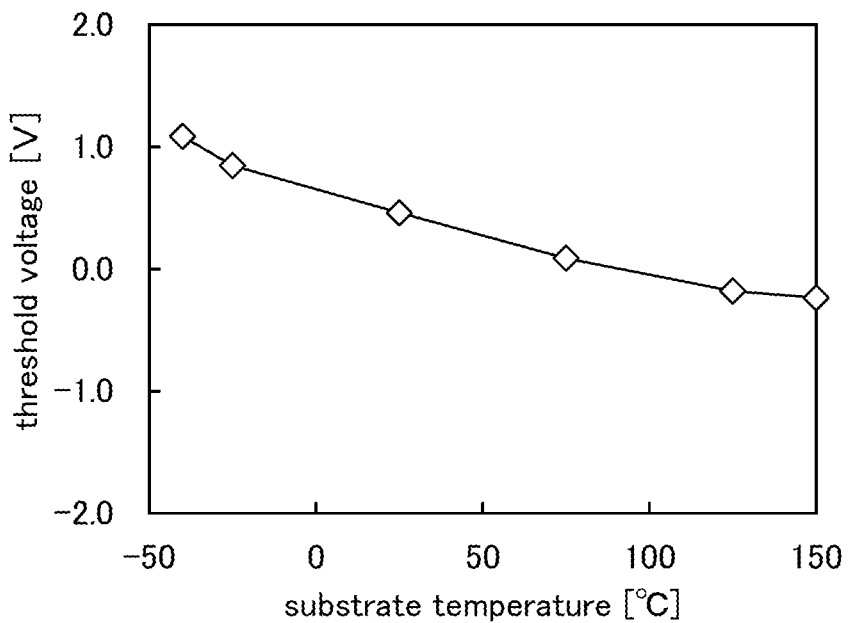
FIG. 29A is a graph showing the relation between substrate temperature and threshold voltage.

FIG. 28 shows the $V_g$ dependence of $I_d$ (solid line) and field-effect mobility (dotted line). FIG. 29A shows the relation between the substrate temperature and the threshold voltage, and FIG. 29B shows the relation between the substrate temperature and the field-effect mobility.

From FIG. 29A, it is found that the threshold voltage gets lower as the substrate temperature increases. Note that the threshold voltage is decreased from 1.09 V to −0.23 V in the range from −40° C. to 150° C.

Figure 29B:
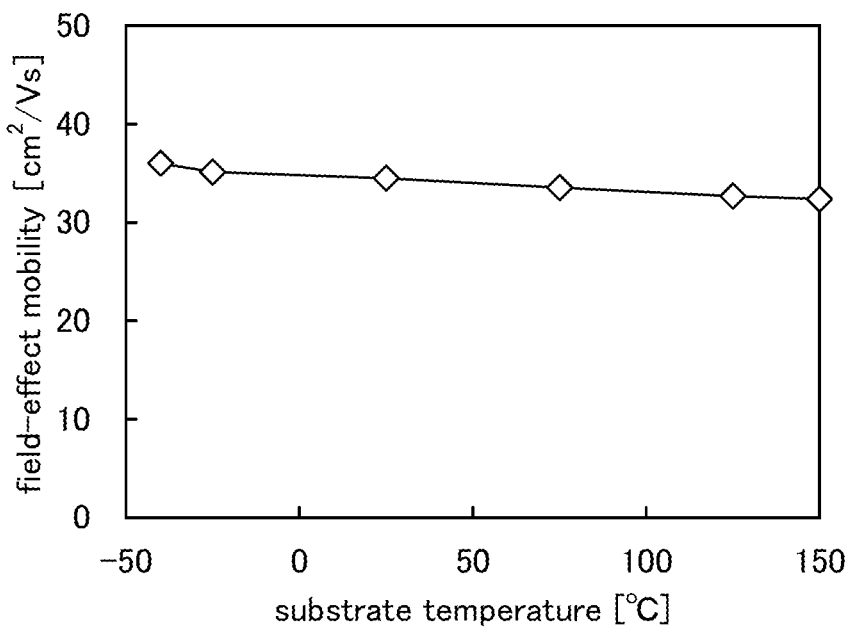
FIG. 29B is a graph showing the relation between substrate temperature and field-effect mobility.

From FIG. 29B, it is found that the field-effect mobility gets lower as the substrate temperature increases. Note that the mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor containing In, Sn, and Zn as main components is used for a channel formation region, a field-effect mobility of 30 cm$^2$/Vs or higher, preferably 40 cm$^2$/Vs or higher, more preferably 60 cm$^2$/Vs or higher can be obtained with the off-state current maintained at 1 aA/μm or lower, which makes it possible to achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be implemented in appropriate combination with any of the other embodiments.

Embodiment 10

In this embodiment, a transistor which includes an oxide semiconductor film and has a structure different from those in the above embodiments will be described. As an oxide semiconductor included in the oxide semiconductor film, either an oxide semiconductor containing In, Sn, and Zn (In—Sn—Zn-based oxide semiconductor) or any of the other oxide semiconductors described in the other embodiments may be used.

In this embodiment, an example of a transistor in which an In—Sn—Zn—O film is used as an oxide semiconductor film will be described with reference to FIGS. 30A and 30B and the like.

Figure 30A:
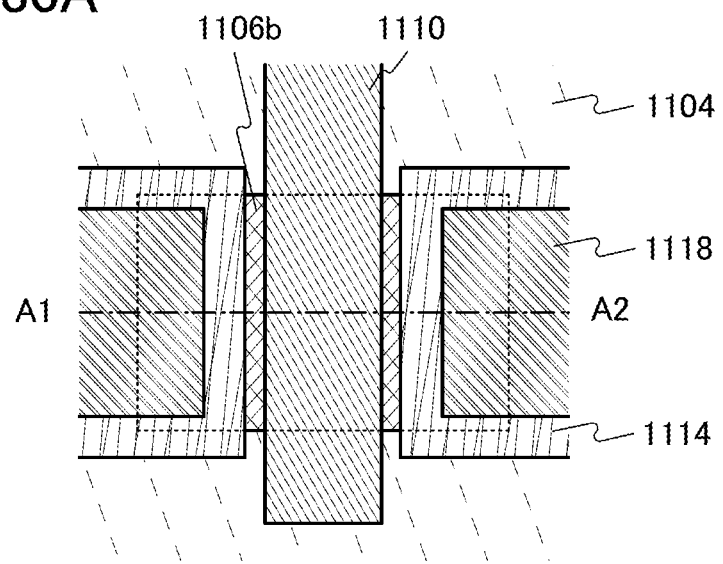
FIGS. 30A and 30B are diagrams illustrating a structure of a transistor according to one embodiment of the present invention.
Figure 30B:
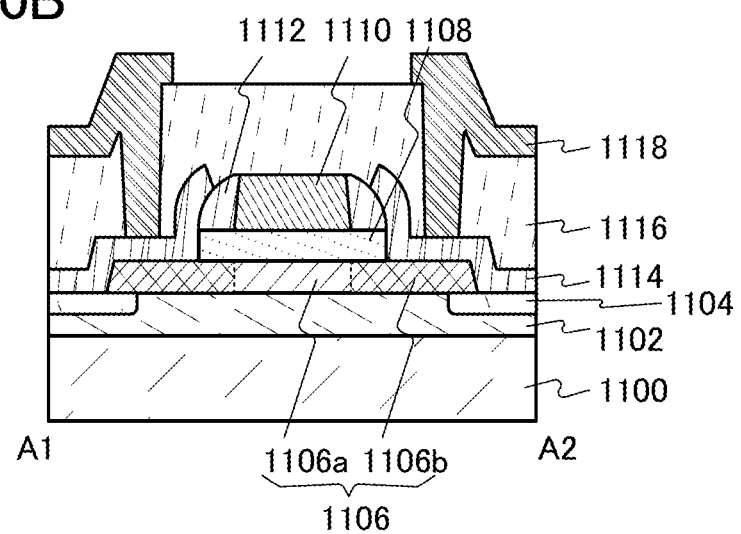

FIGS. 30A and 30B are a top view and a cross-sectional view of a coplanar transistor having a top-gate top-contact structure. FIG. 30A is the top view of the transistor. FIG. 30B is a cross section A1-A2 along dashed-dotted line A1-A2 in FIG. 30A.

The transistor illustrated in FIG. 30B includes a substrate 1101; a base insulating layer 1102 provided over the substrate 1101; a protective insulating film 1104 provided in the periphery of the base insulating layer 1102; an oxide semiconductor film 1106 provided over the base insulating layer 1102 and the protective insulating film 1104 and including a high-resistance region 1106a and low-resistance regions 1106b; a gate insulating film 1108 provided over the oxide semiconductor film 1106; a gate electrode 1110 provided to overlap with the oxide semiconductor film 1106 with the gate insulating film 1108 positioned therebetween; a sidewall insulating film 1112 provided in contact with a side surface of the gate electrode 1110; a pair of electrodes 1114 provided in contact with at least the low-resistance regions 1106b; an interlayer insulating film 1116 provided to cover at least the oxide semiconductor film 1106, the gate electrode 1110, and the pair of electrodes 1114; and a wiring 1118 provided to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated due to surface conduction of the interlayer insulating film 1116 can be reduced and thus the off-state current of the transistor can be reduced.

This embodiment can be implemented in appropriate combination with any of the other embodiments.

Embodiment 11

In this embodiment, an example of a transistor in which an In—Sn—Zn—O film is used as an oxide semiconductor film and which is different from that in Embodiment 10 will be described. Note that although in this embodiment, an oxide semiconductor containing In, Sn, and Zn (In—Sn—Zn-based oxide semiconductor) is used as an oxide semiconductor included in the oxide semiconductor film, any of the other oxide semiconductors described in the other embodiments may be used.

Figure 31A:
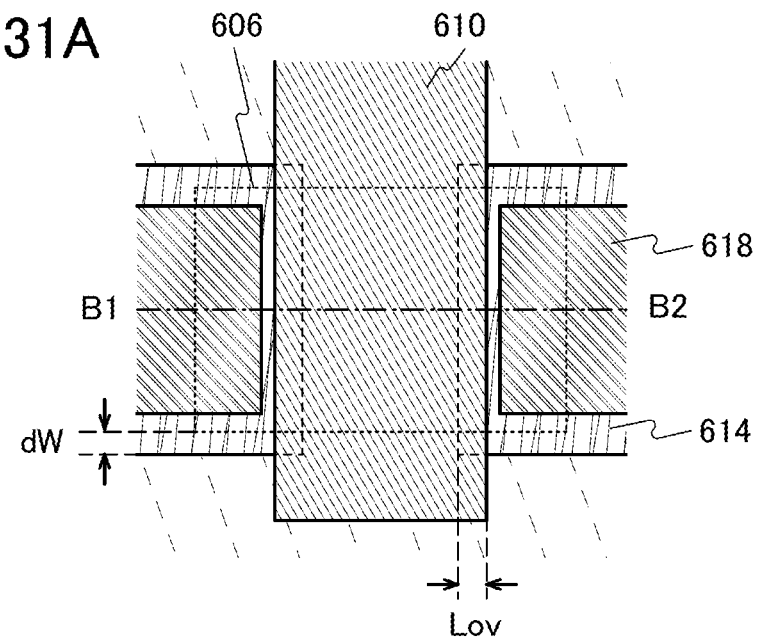
FIGS. 31A and 31B are diagrams illustrating a structure of a transistor according to one embodiment of the present invention.
Figure 31B:
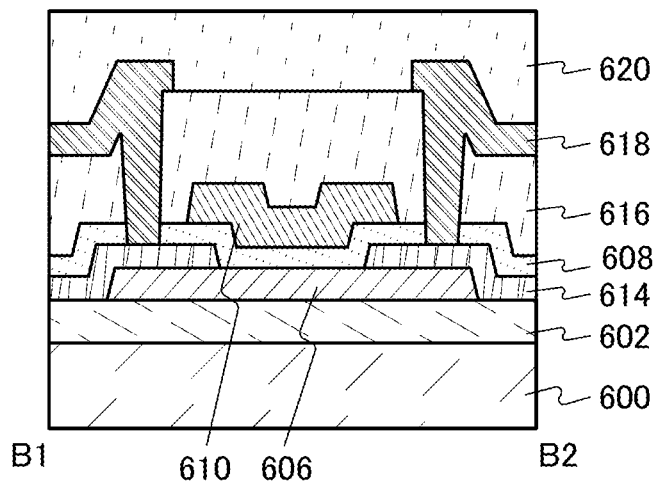

FIGS. 31A and 31B are a top view and a cross-sectional view, which illustrate a structure of a transistor manufactured in this embodiment. FIG. 31A is the top view of the transistor. FIG. 31B is a cross-sectional view along dashed-dotted line B1-B2 in FIG. 31A.

The transistor illustrated in FIG. 31B includes a substrate 600; a base insulating layer 602 provided over the substrate 600; an oxide semiconductor film 606 provided over the base insulating layer 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating layer 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a layered structure of a tantalum nitride film and a tungsten film. The interlayer insulating film 616 can have a layered structure of a silicon oxynitride film and a polyimide film. The wirings 618 can each have a layered structure in which a titanium film, an aluminum film, and a titanium film are formed in this order. As the protective film 620, a polyimide film can be used.

Note that in the transistor having the structure illustrated in FIG. 31A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This embodiment can be implemented in appropriate combination with any of the above embodiments.

This application is based on Japanese Patent Application serial no. 2011-075664 filed with the Japan Patent Office on Mar. 30, 2011 and Japanese Patent Application serial no. 2011-108888 filed with the Japan Patent Office on May 14, 2011, the entire contents of which are hereby incorporated by reference.

What is claimed is:

1. A semiconductor device comprising:
a first memory circuit;
a second memory circuit comprising a storage capacitor and a first transistor, the first transistor comprising an oxide semiconductor film including a channel formation region;
a selection circuit comprising a first input terminal, a second input terminal, and an output terminal;
a first switch; and
a second switch,
wherein the first input terminal of the selection circuit is electrically connected to the first switch and a first terminal of the first transistor,
wherein the second input terminal of the selection circuit is electrically connected to the storage capacitor and a second terminal of the first transistor, and
wherein the output terminal of the selection circuit is electrically connected to the second switch through the first memory circuit.

2. The semiconductor device according to claim 1,
wherein the first memory circuit comprises a first inverter and a second inverter,
wherein an output terminal of the first inverter is electrically connected to an input terminal of the second inverter, and
wherein an output terminal of the second inverter is electrically connected to an input terminal of the first inverter.

3. The semiconductor device according to claim 1,
wherein at least one of the selection circuit and the first memory circuit comprises a second transistor, and
wherein the second transistor has higher field effect mobility than the first transistor.

4. The semiconductor device according to claim 1,
wherein in a first case where the first switch is turned ON, the second switch is turned OFF, and
wherein in a second case where the first switch is turned OFF, the second switch is turned ON.

5. The semiconductor device according to claim 1,
wherein the first memory circuit is configured to hold a data signal only in a period when a power supply voltage is supplied.

6. The semiconductor device according to claim 1,
wherein the selection circuit is configured to perform switching from input of a signal to the first input terminal or the second input terminal to output of the signal input to the first input terminal or the second input terminal to the first memory circuit, in response to a selection signal input to the selection circuit.

7. The semiconductor device according to claim 1, further comprising:
a first node located between the first switch and the first terminal of the first transistor; and
a second node located between the storage capacitor and the second terminal of the first transistor,
wherein the first input terminal of the selection circuit is directly connected to the first node, and
wherein the second input terminal of the selection circuit is directly connected to the second node.

8. The semiconductor device according to claim 1, wherein the second memory circuit is a nonvolatile memory circuit.

9. The semiconductor device according to claim 8, wherein the first memory circuit is a volatile memory circuit.

10. A driving method of a semiconductor device comprising a storage device, the storage device comprising: a first memory circuit; a second memory circuit comprising a storage capacitor and a first transistor, the first transistor comprising an oxide semiconductor film including a channel formation region; a selection circuit comprising a first input terminal, a second input terminal, and an output terminal; a first switch; and a second switch, wherein the first input terminal of the selection circuit is electrically connected to the first switch and a first terminal of the first transistor, wherein the second input terminal of the selection circuit is electrically connected to the storage capacitor and a second terminal of the first transistor, and wherein the output terminal of the selection circuit is electrically connected to the second switch through the first memory circuit,
the driving method, in a high frequency operation mode, comprising the steps of:
turning the first switch ON, turning the first transistor OFF, and inputting a first data signal to the first memory circuit;
turning the first switch OFF, turning the first transistor ON, and inputting the first data signal stored in the volatile memory circuit to the storage capacitor;
stopping application of a first power supply voltage to the storage device after inputting the first data signal to the storage capacitor;
resuming application of the first power supply voltage to the storage device; and
switching the selection circuit and inputting the first data signal stored in the storage capacitor to the first memory circuit, and
the driving method, in a low frequency operation mode, comprising the steps of:
turning the first switch ON, turning the first transistor ON, and inputting a second data signal to the first memory circuit and the storage capacitor;
turning the first transistor OFF and stopping application of a second power supply voltage to the storage device after inputting the second data signal to the storage capacitor;
resuming application of the second power supply voltage to the storage device; and
switching the selection circuit and inputting the second data signal stored in the storage capacitor to the first memory circuit.

11. The driving method according to claim 8,
wherein the first memory circuit comprises a first inverter and a second inverter,
wherein an output terminal of the first inverter is electrically connected to an input terminal of the second inverter, and
wherein an output terminal of the second inverter is electrically connected to an input terminal of the first inverter.

12. The driving method according to claim 10,
wherein at least one of the selection circuit and the first memory circuit comprises a second transistor, and
wherein the second transistor has higher field effect mobility than the first transistor.

13. The driving method according to claim 10,
wherein in a first case where the first switch is turned ON, the second switch is turned OFF, and
wherein in a second case where the first switch is turned OFF, the second switch is turned ON.

14. The driving method according to claim 10,
wherein the first memory circuit is configured to hold a data signal only in a period when a power supply voltage is supplied.

15. The driving method according to claim 10,
wherein the storage device further comprises:
a first node located between the first switch and the first terminal of the first transistor; and
a second node located between the storage capacitor and the second terminal of the first transistor,
wherein the first input terminal of the selection circuit is electrically connected to the first node, and
wherein the second input terminal of the selection circuit is electrically connected to the second node.

16. The driving method according to claim 10, wherein the second memory circuit is a nonvolatile memory circuit.

17. The driving method according to claim 16, wherein the first memory circuit is a volatile memory circuit.

18. A driving method of a semiconductor device comprising a storage device, the storage device comprising: a first memory circuit; a second memory circuit comprising a storage capacitor and a first transistor, the first transistor comprising an oxide semiconductor film including a channel formation region; a selection circuit comprising a first input terminal, a second input terminal, and an output terminal; a first switch; and a second switch, wherein the first input terminal of the selection circuit is electrically connected to the first switch and a first terminal of the first transistor, wherein the second input terminal of the selection circuit is electrically connected to the storage capacitor and a second terminal of the first transistor, and wherein the output terminal of the selection circuit is electrically connected to the second switch through the first memory circuit,
the driving method, in a high frequency operation mode, comprising the steps of:
turning the first switch ON, turning the first transistor OFF, turning the second switch OFF, and inputting a first data signal to the first memory circuit;

turning the first switch OFF, turning the first transistor ON, turning the second switch ON, and inputting the first data signal stored in the first memory circuit to the storage capacitor;

stopping application of a first power supply voltage to the storage device after inputting the first data signal to the storage capacitor;

resuming application of the first power supply voltage to the storage device; and switching the selection circuit and inputting the first data signal stored in the storage capacitor to the first memory circuit and turning the second switch ON, and the driving method, in a low frequency operation mode, comprising the steps of:

turning the first switch ON, turning the first transistor ON, turning the second switch OFF, and inputting a second data signal to the first memory circuit and the storage capacitor;

turning the first transistor OFF and stopping application of a second power supply voltage to the storage device after inputting the second data signal to the storage capacitor;

resuming application of the second power supply voltage to the storage device; and switching the selection circuit and inputting the second data signal stored in the storage capacitor to the first memory circuit and turning the second switch ON.

19. The driving method according to claim 18,
wherein the first memory circuit comprises a first inverter and a second inverter,
wherein an output terminal of the first inverter is electrically connected to an input terminal of the second inverter, and
wherein an output terminal of the second inverter is electrically connected to an input terminal of the first inverter.

20. The driving method according to claim 18,
wherein at least one of the selection circuit and the first memory circuit comprises a second transistor, and
wherein the second transistor has higher field effect mobility than the first transistor.

21. The driving method according to claim 18,
wherein in a first case where the first switch is turned ON, the second switch is turned OFF, and
wherein in a second case where the first switch is turned OFF, the second switch is turned ON.

22. The driving method according to claim 18,
wherein the first memory circuit is configured to hold a data signal only in a period when a power supply voltage is supplied.

23. The driving method according to claim 18,
wherein the storage device further comprises:
a first node located between the first switch and the first terminal of the first transistor; and
a second node located between the storage capacitor and the second terminal of the first transistor,
wherein the first input terminal of the selection circuit is electrically connected to the first node, and
wherein the second input terminal of the selection circuit is electrically connected to the second node.

24. The driving method according to claim 18, wherein the second memory circuit is a nonvolatile memory circuit.

25. The driving method according to claim 24, wherein the first memory circuit is a volatile memory circuit.

* * * * *

UNITED STATES PATENT AND TRADEMARK OFFICE
CERTIFICATE OF CORRECTION

PATENT NO. : 8,787,084 B2  
APPLICATION NO. : 13/429668  
DATED : July 22, 2014  
INVENTOR(S) : Takuro Ohmaru Page 1 of 1

It is certified that error appears in the above-identified patent and that said Letters Patent is hereby corrected as shown below:

In the Specification

Column 22, Line 67 – replace "In-Z-" with --In-Zn- --;

Column 23, Line 13 – replace "1 nMO$_3$(ZnO)$_n$" with --InMO$_3$(ZnO)$_m$--;

Column 27, Line 59 – replace "In-Z-based" with --In-Zn-based--;

Column 47, Line 7 – before "represents" replace "c" with --ε--;

Column 49, Line 27 – replace "GE," with --(μ,--;

Column 49, Line 31 – after "the mobility" replace "t" with --μ--;

Column 49, Line 42 – after "the mobility" replace "t" with --μ--;

Column 49, Line 45 – after "the mobility" replace "t" with --μ--;

Column 49, Line 58 – after "the mobility" replace "t" with --μ--;

Column 49, Line 62 – after "the mobility" replace "t" with --μ--; and

In the Claims

Column 57, Line 54, in claim 10 – before "memory circuit" replace "volatile" with --first--.

Signed and Sealed this  
Twelfth Day of May, 2015

Michelle K. Lee  
*Director of the United States Patent and Trademark Office*